US012604123B2

(12) United States Patent
Kim et al.

(10) Patent No.: US 12,604,123 B2
(45) Date of Patent: Apr. 14, 2026

(54) APPARATUS AND VEHICULAR APPARATUS INCLUDING THE SAME

(71) Applicant: LG Display Co., Ltd., Seoul (KR)

(72) Inventors: Kwangho Kim, Seoul (KR); KwanHo Park, Seoul (KR); YeongRak Choi, Seoul (KR); Daeho Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 234 days.

(21) Appl. No.: 18/205,362

(22) Filed: Jun. 2, 2023

(65) Prior Publication Data

US 2023/0412953 A1 Dec. 21, 2023

(30) Foreign Application Priority Data

Jun. 20, 2022 (KR) ......................... 10-2022-0074801

(51) Int. Cl.
*H04R 1/02* (2006.01)
*B60J 1/20* (2006.01)
(Continued)

(52) U.S. Cl.
CPC ................ *H04R 1/028* (2013.01); *B60J 1/20* (2013.01); *B60R 11/00* (2013.01); *H04R 1/06* (2013.01);
(Continued)

(58) Field of Classification Search
CPC ............ H04R 2440/05; H04R 2499/13; H04R 31/003; H04R 7/045; H04R 1/24;
(Continued)

(56) References Cited

U.S. PATENT DOCUMENTS 5,255,246 A * 10/1993 van Halteren ......... H04R 19/01
                                                                         381/174
6,324,294 B1 * 11/2001 Azima ..................... H04R 1/24
                                                                         381/381
(Continued)

FOREIGN PATENT DOCUMENTS

JP     H04-150297 A     5/1992
JP     2004-198282 A     7/2004
(Continued)

OTHER PUBLICATIONS

Office Action issued in corresponding Japanese Patent Application No. 2023-100654, dated Jul. 26, 2024. (Note: JP 2006-157227 A was previously cited).
(Continued)

*Primary Examiner* — Norman Yu
(74) *Attorney, Agent, or Firm* — Morgan, Lewis & Bockius LLP

(57) ABSTRACT

An apparatus includes a vibration member, a vibrator at the vibration member, and a connector between the vibration member and the vibrator and accommodating the vibrator. A vehicular apparatus includes an exterior material; an interior material covering the exterior material; and one or more vibration generating devices at one or more of the exterior material, the interior material, and a region between the exterior material and the interior material, wherein the one or more vibration generating devices comprise the apparatus, and wherein one or more of the exterior material and the interior material output a sound based on vibrations of the one or more vibration generating devices.

29 Claims, 20 Drawing Sheets

(51) Int. Cl.

| | | |
|---|---|---|
| *B60R 11/00* | (2006.01) | |
| *H04R 1/06* | (2006.01) | |
| *H04R 17/00* | (2006.01) | |
| *H10N 30/20* | (2023.01) | |
| *H10N 30/87* | (2023.01) | |

(52) U.S. Cl.

CPC ........... *H04R 17/00* (2013.01); *H10N 30/206* (2023.02); *H10N 30/871* (2023.02); *B60R 2011/0003* (2013.01); *B60R 2011/0043* (2013.01); *H04R 2499/13* (2013.01)

(58) Field of Classification Search

CPC .... H04R 17/00; H04R 1/025; H04R 2499/15; H04R 9/045; H04R 2201/021; H04R 1/028; H04R 1/06; H10N 30/871; H10N 30/206; B60J 1/20; B60R 11/00; B60R 2011/0003; B60R 2011/0043
USPC .......... 381/86, 388, 191, 152, 173, 333, 389
See application file for complete search history.

(56) References Cited

U.S. PATENT DOCUMENTS

| | | | |
|---|---|---|---|
| 2003/0053642 A1* | 3/2003 | Bank ...................... | H04R 1/028 |
| | | | 381/86 |
| 2007/0228893 A1 | 10/2007 | Yamauchi et al. | |
| 2010/0290639 A1* | 11/2010 | Snider ...................... | H04R 5/02 |
| | | | 381/86 |
| 2013/0064401 A1* | 3/2013 | Wang ...................... | G06F 3/016 |
| | | | 381/191 |
| 2016/0005951 A1 | 1/2016 | Yoshida et al. | |

| | | | |
|---|---|---|---|
| 2016/0014525 A1* | 1/2016 | Park ...................... | H10N 30/50 |
| | | | 381/190 |
| 2016/0094902 A1* | 3/2016 | Chang ...................... | H04R 7/04 |
| | | | 381/333 |
| 2018/0374465 A1 | 12/2018 | Wang et al. | |
| 2020/0154214 A1* | 5/2020 | Jang ...................... | H04R 1/028 |
| 2020/0209973 A1* | 7/2020 | Kim ................... | G02F 1/13338 |
| 2020/0314553 A1* | 10/2020 | Kim ...................... | H04R 17/00 |
| 2020/0379508 A1* | 12/2020 | Lee ...................... | H04R 9/066 |
| 2021/0006231 A1* | 1/2021 | Kakita ................. | H10N 30/072 |
| 2022/0070563 A1 | 3/2022 | Kim et al. | |

FOREIGN PATENT DOCUMENTS

| | | | | |
|---|---|---|---|---|
| JP | 2006-157227 A | 6/2006 | | |
| JP | 2008-011294 A | 1/2008 | | |
| JP | 2022-042006 A | 3/2022 | | |
| KR | 20170069530 A * | 6/2017 | ............ | H04N 5/655 |
| WO | 2007/097077 A1 | 8/2007 | | |
| WO | 2014/119695 A1 | 8/2014 | | |
| WO | 2015/046288 A1 | 4/2015 | | |

OTHER PUBLICATIONS

Office Action issued in corresponding Japanese Patent Application No. 2023-100654, dated Jan. 10, 2025. (Note: JP 2006-157227 A, WO 2014/119695 A1, JP H04-150297 A, WO 2007/097077 A1, JP 2008-011294 A, JP 2022-042006 A, WO 2015/046288 A1 were previously cited).

Office Action issued Oct. 30, 2023 for counterpart U.K. Patent Application No. GB2308454.4.

Combined Search and Examination Report issued in corresponding GB Patent Application No. 2410117.2, dated Aug. 8, 2024.

\* cited by examiner

1 : 100, 120, 200 or 1 : 100, 120, 200, 300

22: 22A ~ 22C
25-3: 25M ~ 25P

23: 23A ~ 23L
25-5: 25R ~ 25T

24: 24C
23B: 23B1 ~ 23B3

25-1: 25A ~ 25G
23D: 23D1 ~ 23D4

25-2: 25H ~ 25L
○: WS

23: 23A ~ 23L
23B: 23B1 ~ 23B3

24: 24A ~ 24D
23D: 23D1 ~ 23D4

25-1: 25A ~ 25G
23E: 23E1 ~ 23E3

25-2: 25H ~ 25L
24B: 24B1 ~ 24B4

25-3: 25M ~ 25P

◯ : WS

23L: 23L1, 23L2    24: 24A, 24B1, 24B2    ◎: WS 25-4: 25Q

APPARATUS AND VEHICULAR APPARATUS INCLUDING THE SAME

CROSS-REFERENCE TO RELATED APPLICATIONS

This application claims the benefit of and priority to Korean Patent Application No. 10-2022-0074801 filed on Jun. 20, 2022, the entirety of which is hereby incorporated by reference for all purposes as if fully set forth herein.

TECHNICAL FIELD

The present disclosure relates to an apparatus and particularly to, for example, without limitation, an apparatus and a vehicular apparatus including the same.

DISCUSSION OF THE RELATED ART

An apparatus includes a separate speaker or sound apparatus for providing a sound. When a speaker is in an apparatus, the speaker occupies space of the apparatus. Thus, the design and spatial disposition of the apparatus are limited.

A speaker applied to the apparatus may be, for example, an actuator including a magnet and a coil. However, when an actuator is applied to the apparatus, a thickness thereof becomes bulky. Therefore, piezoelectric elements for realizing a thin thickness are attracting much attention.

Because piezoelectric elements have a fragile characteristic, the piezoelectric elements are easily damaged due to an external impact, and thus the reliability of sound reproduction is low. And, when a speaker such as a piezoelectric element or the like is applied to an apparatus or a flexible apparatus, there may be a limitation in that damage occurs due to the fragile characteristic of the piezoelectric elements.

SUMMARY

Therefore, the inventors of the present disclosure have recognized the problems described above and have performed extensive research and experiments which may prevent or reduce a piezoelectric device from being damaged due to an impact when attaching a vibration device on an apparatus or the like and may enhance sound quality and/or a sound characteristic. Through the extensive research and experiments, the inventors have invented a vehicular apparatus and an apparatus including a new vibration apparatus, which may prevent or reduce a piezoelectric device from being damaged due to an impact when attaching a vibration device on an apparatus or the like and may enhance sound quality and/or a sound characteristic.

Accordingly, embodiments of the present disclosure are directed to an apparatus and a vehicular apparatus including the same that substantially obviate one or more of the problems due to limitations and disadvantages of the related art.

An aspect of the present disclosure is to provide an apparatus and a vehicular apparatus including the same that may minimize or reduce the damage of a vibration device caused by an impact when attaching a vibration device on the apparatus or the like and may enhance sound quality and/or a sound characteristic.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an apparatus may comprise a vibration member, a vibrator at the vibration member, and a connector between the vibration member and the vibrator and accommodating the vibrator.

In another aspect, a vehicular apparatus may comprise an exterior material, an interior material covering the exterior material, and one or more vibration generating devices at one or more of the exterior material, the interior material, and a region between the exterior material and the interior material, one or more of the exterior material and the interior material output sound based on vibrations of the one or more vibration generating devices. The one or more vibration generating devices comprise a vibration member, a vibrator at the vibration member, and a connector between the vibration member and the vibrator and accommodating the vibrator.

An apparatus according to one or more embodiments of the present disclosure may include a connector connected to a vibrator, and thus, may simplify a process of attaching a vibration member on a vibrator and may easily modify a design of the connector, based on the change of a component of an exterior material and/or an interior material, thereby providing an apparatus or a vibration apparatus having enhanced productivity and reliability.

An apparatus according to one or more embodiments of the present disclosure may include a vibrator connected to a connector, and thus, may easily attach the vibrator on a vibration member including a curved portion, thereby providing an apparatus or a vibration apparatus having enhanced productivity and reliability.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

Figure 1:
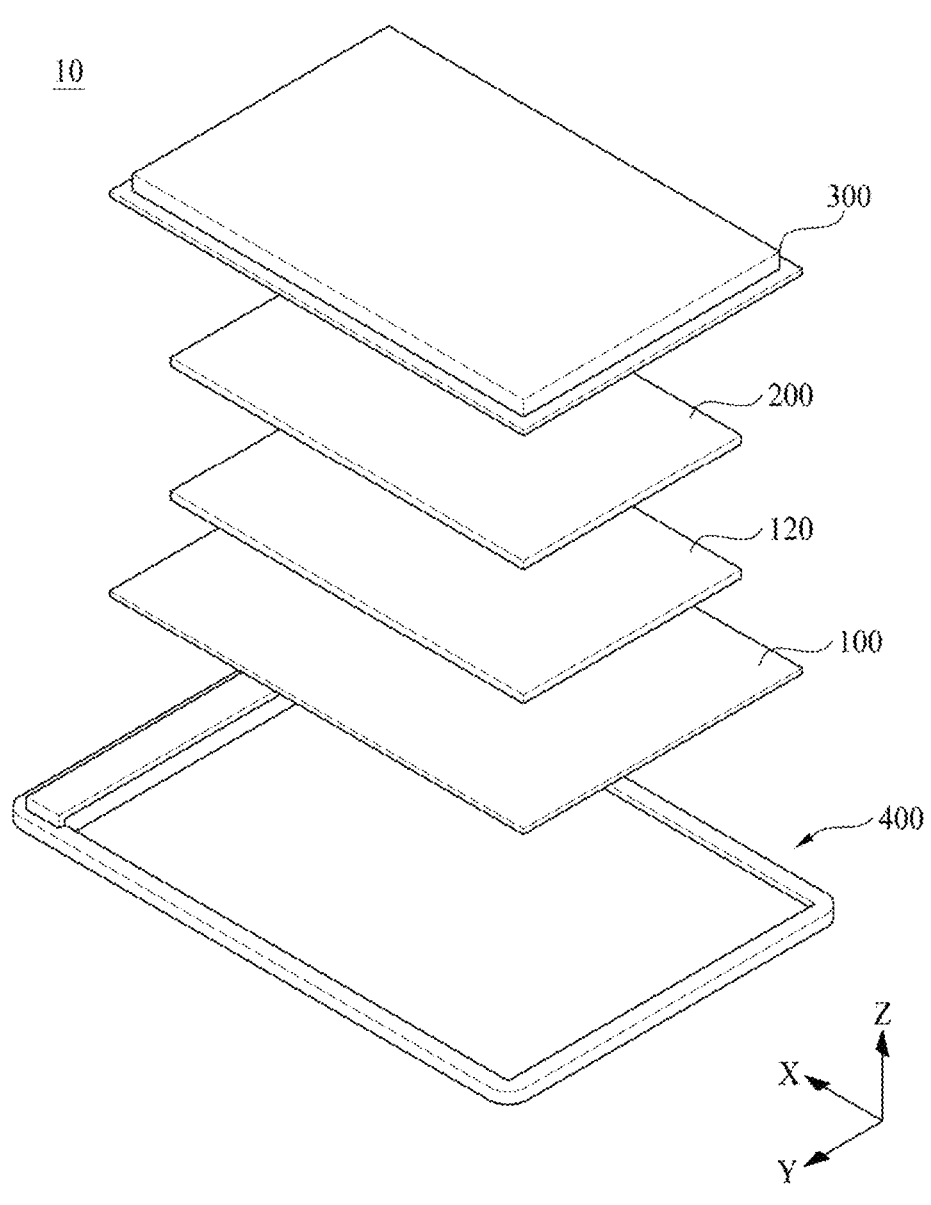
FIG. 1 is a perspective view illustrating an apparatus according to an embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction of thereof may be exaggerated for clarity, illustration, and convenience.

DETAILED DESCRIPTION

Reference will now made in detail to embodiments of the present disclosure, examples of which may be illustrated in the accompanying drawings. In the following description, when a detailed description of well-known functions or configurations may unnecessarily obscure aspects of the present disclosure, the detailed description thereof may be omitted for brevity. The progression of processing steps and/or operations described is an example; however, the sequence of steps and/or operations is not limited to that set forth herein and may be changed, with the exception of steps and/or operations necessarily occurring in a particular order.

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are examples and are provided so that this disclosure may be thorough and complete to assist those skilled in the art to understand the inventive concepts without limiting the protected scope of the present disclosure.

The shapes, sizes, areas, ratios, angles, numbers, and the like disclosed in the drawings for describing embodiments of the present disclosure are merely an example, and thus, the present disclosure is not limited to the illustrated details. Like reference numerals refer to like elements throughout.

When the term "comprise," "have," "include," "contain," "constitute," "make up of," "formed of," or the like is used, one or more other elements may be added unless a term such as "only" or the like is used. The terms used in the present disclosure are merely used in order to describe particular embodiments, and are not intended to limit the scope of the present disclosure. The terms used herein are merely used in order to describe example embodiments, and are not intended to limit the scope of the present disclosure. The terms of a singular form may include plural forms unless the context clearly indicates otherwise. The word "exemplary" is used to mean serving as an example or illustration. Embodiments are example embodiments. Aspects are example aspects. Any implementation described herein as an "example" is not necessarily to be construed as preferred or advantageous over other implementations.

In one or more aspects, an element, feature, or corresponding information (e.g., a level, range, dimension, size, or the like) is construed as including an error or tolerance range even where no explicit description of such an error or tolerance range is provided. An error or tolerance range may be caused by various factors (e.g., process factors, internal or external impact, noise, or the like). Further, the term "may" encompasses all the meanings of the term "can."

In describing a positional relationship, where the positional relationship between two parts is described, for example, using "on," "over," "under," "above," "below," "beneath," "near," "close to," or "adjacent to," "beside," "next to," or the like, one or more other parts may be located between the two parts unless a more limiting term, such as "immediate(ly)," "direct(ly)," or "close(ly)," is used. For example, when a structure is described as being positioned "on," "over," "under," "above," "below," "beneath," "near," "close to," or "adjacent to," "beside," or "next to" another structure, this description should be construed as including a case in which the structures contact each other as well as a case in which one or more additional structures are disposed or interposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

In describing a temporal relationship, when the temporal order is described as, for example, "after," "subsequent," "next," "before," "preceding," "prior to," or the like, a case that is not consecutive or not sequential may be included unless a more limiting term, such as "just," "immediate(ly)," or "direct(ly)," is used.

It will be understood that, although the term "first," "second," or the like may be used herein to describe various elements, these elements should not be limited by these terms. These terms are only used to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure. The terms "first," "second," and the like may be used to distinguish components from each other, but the functions or structures of the components are not limited by ordinal numbers or component names in front of the components.

In describing elements of the present disclosure, the terms "first," "second," "A" "B," "(a)," "(b)," or the like may be used. These terms are intended to identify the corresponding element(s) from the other element(s), and these are not used to define the essence, basis, order, or number of the elements.

For the expression that an element or layer is "connected," "coupled," "attached," or "adhered" to another element or layer, the element or layer can not only be directly connected, coupled, attached, or adhered to another element or layer, but also be indirectly connected, coupled, attached, or adhered to another element or layer with one or more intervening elements or layers disposed or interposed between the elements or layers, unless otherwise specified.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

The terms such as a "line" or "direction" should not be interpreted only based on a geometrical relationship in which the respective lines or directions are parallel or perpendicular to each other, and may be meant as lines or directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as only one of the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C.

Furthermore, an expression "element A/element B" may be understood as element A and/or element B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two.

In one or more aspects, the phrases "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise.

In the present disclosure, an apparatus may include a display apparatus such as a liquid crystal display (LCD), an organic light emitting display (OLED), or the like including a display panel and a driver for driving the display panel. Also, in the present disclosure, the apparatus may include a set device (or a set apparatus) or a set electronic device such as a notebook computer, a TV, a computer monitor, an equipment apparatus including an automotive apparatus or another type apparatus for vehicles, or a mobile electronic device such as a smartphone or an electronic pad, which is a complete product (or a final product) including an LCD, an OLED, or the like.

Therefore, in the present disclosure, examples of the apparatus may include a display apparatus itself, such as an LCD, an OLED, or the like, and a set device which is a final consumer device or an application product including the LCD, the OLED, or the like.

In one or more embodiments, an LCD or an OLED including a display panel and a driver, or the like may be referred to as a display apparatus, and an electronic device which is a final product including an LCD or an OLED may be referred to as a set device (or a set apparatus). For example, the display apparatus may include a display panel, such as a liquid crystal display panel or an organic light emitting display panel, and a source printed circuit board (PCB) which is a controller for driving the display panel. The set device may further include a set PCB which is a set controller electrically connected to the source PCB to overall control the set device.

A display panel applied to one or more embodiments of the present disclosure may use any types of display panels such as a liquid crystal display panel, an organic light emitting display panel, and an electroluminescent display panel, or the like, but embodiments of the present disclosure are not limited. For example, the display panel may be a display panel capable of generating a sound by being vibrated by a vibration apparatus according to an embodiment of the present disclosure. A display panel applied to an apparatus or a display apparatus according to one or more embodiments of the present disclosure is not limited a shape or a size of the display panel.

According to one or more embodiments of the present disclosure, when the display panel is the liquid crystal display panel, the display panel may include a plurality of gate lines, a plurality of data lines, and a plurality of pixels respectively provided in the intersection area of the gate lines and the data lines. Also, the display panel may include an array substrate including a thin film transistor (TFT) which is a switching element for adjusting a light transmittance of each of the plurality of pixels, an upper substrate including a color filter and/or a black matrix or the like, and a liquid crystal layer provided between the array substrate and the upper substrate.

According to another embodiment of the present disclosure, when the display panel is the organic light emitting display panel, the display panel may include a plurality of gate lines, a plurality of data lines, and a plurality of pixels respectively provided in the intersection area of the gate lines and the data lines. Also, the display panel may include an array substrate including a TFT which is an element for selectively applying a voltage to each of the plurality of pixels, an organic light emitting device layer on the array substrate, and an encapsulation substrate disposed at the array substrate to cover the organic light emitting device layer, or the like. The encapsulation substrate may protect the TFT and the organic light emitting device layer or the like from an external impact and may prevent water or oxygen from penetrating into the organic light emitting device layer. Also, a layer provided on the array substrate may include an inorganic light emitting layer, for example, a nano-sized material layer, a quantum dot light emitting layer, or the like. As another embodiment of the present disclosure, the layer provided on the array substrate may include a micro light emitting diode.

The display panel may further include a backing such as a metal plate attached at the display panel. The display panel may further include another structure, for example, another structure made of different materials.

Features of various embodiments of the present disclosure may be partially or wholly coupled to or combined with each other, and may be variously inter-operated, linked or driven together. The embodiments of the present disclosure may be carried out independently from each other or may be carried out together in a co-dependent or related relationship. In one or more aspects, the components of each apparatus according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

In the following description, various example embodiments of the present disclosure are described in detail with reference to the accompanying drawings. With respect to reference numerals to elements of each of the drawings, the same elements may be illustrated in other drawings, and like reference numerals may refer to like elements unless stated otherwise. In addition, for convenience of description, a scale, dimension, size, and thickness of each of the elements illustrated in the accompanying drawings may be different from an actual scale, dimension, size, and thickness, and thus, embodiments of the present disclosure are not limited to a scale, dimension, size, and thickness illustrated in the drawings.

Figure 2:
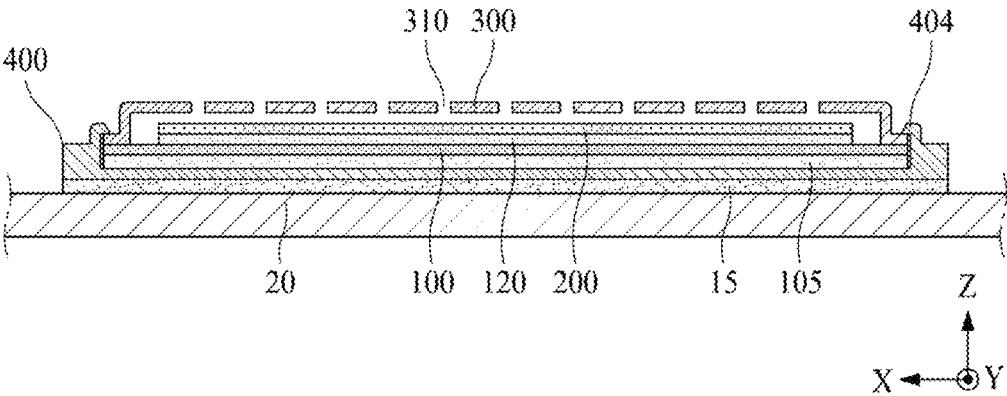
FIG. 2 illustrates an apparatus according to an embodiment of the present disclosure.

FIG. 1 is a perspective view illustrating an apparatus according to an embodiment of the present disclosure. FIG. 2 illustrates an apparatus according to an embodiment of the present disclosure.

With reference to FIG. 1, an apparatus 10 according to an embodiment of the present disclosure may include a vibration device 200.

The vibration device (or a vibration element) 200 may be configured to vibrate (or displace or drive) based on a driving signal (or an electrical signal or a voice signal) applied thereto to vibrate (or displace) a vibration member 20 or provide acoustic and/or haptic feedback to a user based on vibration of the display panel by vibrating the display panel from the rear surface of the display panel. For example, the vibration device 200 may be an active vibration member, a vibration generator, a vibration structure, a vibrator, a vibration generating device, a sound generator, a sound device, a sound generating structure, or a sound generating device, but embodiments of the present disclosure are not limited thereto.

The vibration device 200 according to an embodiment of the present disclosure may include a piezoelectric material (or an electro active material or piezoelectric ceramic) having a piezoelectric characteristic. The vibration device 200 may autonomously vibrate (or displace) based on a vibration (or displacement) of a piezoelectric material based on a driving signal applied to the piezoelectric material, or may vibrate (or displace) a vibration member. For example, the vibration device 200 may alternately repeat contraction and/or expansion based on a piezoelectric effect (or a piezoelectric characteristic) to vibrate (or displace). For example, the vibration device 200 may alternately repeat contraction and/or expansion based on an inverse piezoelectric effect of the piezoelectric structure to vibrate (or displace) in a vertical direction (or a thickness direction) Z, whereby the amount of displacement (or bending force or flexural force) or amplitude displacement of the vibration device 200 may be increased or maximized, but embodiments of the present disclosure are not limited thereto, for example, the vibration device 200 according to an embodiment of the present disclosure may vibrate (or mechanically displace) in response to an externally applied electrical signal by including a piezoelectric ceramic having a perovskite-based crystal structure.

The vibration device 200 according to an embodiment of the present disclosure may have a thickness which is thinner than that of a coil-type sound apparatus, but may be easily broken by an impact due to a fragile characteristic. To address such limitation, a vibrator 1 may be configured to be easily treated in an assembly process and prevent or reduce the damage of the vibration device 200.

The vibrator 1 according to an embodiment of the present disclosure may include a supporting member 100 and the vibration device 200. The vibration device 200 may be disposed at the supporting member 100. For example, the supporting member 100 may be disposed at or on a rear surface of the vibration device 200. For example, the supporting member 100 may support or protect the vibration device 200. Accordingly, the vibrator 1 may prevent or minimize the damage of the vibration device 200.

The vibrator 1 according to an embodiment of the present disclosure may further include a first connection member 120 between the supporting member 100 and the vibration device 200. The vibrator 1 according to an embodiment of the present disclosure may include the supporting member 100, the vibration device 200, and the first connection member 120.

The first connection member 120 may be connected or coupled to one of a first surface and a second surface, which is different from (or opposite to) the first surface of the vibration device 200. In the vibration device 200, the first surface may be a top surface, a front surface, or an upper surface. In the vibration device 200, the second surface may be a bottom surface, a rear surface, a lower surface, or a backside surface. For example, the first connection member 120 may be a connection member, a coupling member, an adhesive member, or a first adhesive member which may include at least a material including an adhesive layer having excellent adhesion or adhesiveness to the vibration device 200, but embodiments of the present disclosure are not limited thereto.

According to an embodiment of the present disclosure, the first connection member 120 may be disposed between a rear surface (or a backside surface) of the supporting member 100 and the vibration device 200 and may connect or couple the vibration device 200 to the rear surface of the supporting member 100. For example, the vibration device 200 may be connected or coupled to the rear surface of the supporting member 100 by the first connection member 120, and thus, may be supported by or disposed at the rear surface of the supporting member 100.

The first connection member 120 according to an embodiment of the present disclosure may include an adhesive layer (or a tacky layer) which is good in adhesive force or attaching force. For example, the first connection member 120 according to an embodiment of the present disclosure may include a material including an adhesive layer which is good in adhesive force or attaching force with respect to each of the rear surface of the supporting member 100 and the vibration device 200. For example, the first connection member 120 may include a foam pad, a double-sided tape, a double-sided foam pad, a double-sided foam tape, an adhesive, a double-sided adhesive tape, a double-sided adhesive foam tape, or a tacky sheet, but embodiments of the present disclosure are not limited thereto. For example, when the first connection member 120 includes a tacky sheet (or a tacky layer), the first connection member 120 may include only an adhesive layer or a tacky layer without a base member such as a plastic material or the like.

The adhesive layer (or a tacky layer) of the first connection member 120 according to an embodiment of the present disclosure may include epoxy, acrylic, a acryl-based polymer, a silicone-based polymer, silicone, a urethane-based polymer, or urethane, but embodiments of the present disclosure are not limited thereto. The adhesive layer (or a tacky layer) of the first connection member 120 according to another embodiment of the present disclosure may include a heat-curable adhesive, a photo-curable adhesive, a pressure sensitive adhesive (PSA), an optically clear adhesive (OCA), or an optically clear resin (OCR), or a heat-sealing adhesive (e.g., a heat-active type or a thermosetting type), but embodiments of the present disclosure are not limited thereto. For example, an adhesive layer of the first connection member 120 may include an acrylic material (or substance) having a characteristic where an adhesive force is relatively better and hardness is higher than a urethane-based material. Accordingly, a vibration of the vibration device 200 may be transferred to the vibration member 20 well.

The adhesive layer of the first connection member 120 may further include an additive, such as a tackifier or an adhesion enhancing agent, a wax component, an anti-oxidation agent, or the like. The additive may prevent or reduce the first connection member 120 from being detached (delamination) from the supporting member 100 by a vibration of the vibration device 200. For example, the tackifier may be rosin derivative or the like, and the wax component may be paraffin wax or the like. For example, the anti-oxidation agent may be a phenol-based anti-oxidation agent, such as thioester, but embodiments of the present disclosure are not limited thereto.

With reference to FIG. 1, the apparatus 10 according to an embodiment of the present disclosure may further include a first protection part 300. The vibrator 1 according to an embodiment of the present disclosure may include the supporting member 100, the vibration device 200, the first connection member 120, and the first protection part 300.

The first protection part 300 may protect the vibration device 200. The first protection part 300 may include one or more of a metal material and a nonmetal material (or a composite nonmetal material), but embodiments of the present disclosure are not limited thereto. For example, the first protection part 300 may include one or more materials of a metal material, plastic, fiber material, and wood, but embodiments of the present disclosure are not limited thereto. For example, the first protection part 300 may be an enclosure, a protection part, a protection member, or a cover, but embodiments of the present disclosure are not limited thereto.

With reference to FIG. 1, the vibrator 1 according to an embodiment of the present disclosure may include the supporting member 100, the vibration device 200, the first connection member 120, and/or the first protection part 300. The vibrator 1 may be a vibration generator, a vibration module, a vibration generating module, a vibration generating apparatus, or a vibration generating device, but embodiments of the present disclosure are not limited thereto. When a protection module (or apparatus) of one vibrator 1 or vibration device 200 is provided, the damage of the vibration device 200 caused by bending or an external impact may be prevented or reduced, and thus, treatment may be easily performed in an assembly process. The inventors of the present disclosure have recognized a problem where the vibrator 1 is easily attached on a vibration member configured with a flat portion but is difficult to be attached on a vibration member including a curved portion. Also, when a vibration member is an exterior material and/or an interior material of a vehicle (or a vehicular apparatus), the vibrator 1 may be attached on the exterior material and/or the interior material by a double-sided adhesive. The double-sided adhesive may be used to simplify an attachment process and to be repaired but a material and a shape thereof may be changed for each component (or vehicle structures) of a vehicle (or a vehicular apparatus), and due to this, an attaching force or an adhesive force of the double-sided adhesive may be changed, causing a problem which occurs in an attaching force or an adhesive force of the vibrator 1 attached on (or disposed or mounted) on an exterior material and/or an interior material of a vehicle (or a vehicular apparatus). Therefore, the inventors of the present disclosure have invented a new apparatus which may be attached on an exterior material and/or an interior material of a vehicle (or a vehicular apparatus) or a vibration member including a curved portion, through extensive research and experiments. This will be described below in detail.

With reference to FIG. 1, the apparatus 10 according to an embodiment of the present disclosure may further include a connector 400.

The vibrator 1 may be accommodated (or inserted) into the connector 400. For example, the connector 400 may accommodate the vibration device 200. For example, the connector 400 may accommodate the supporting member 100 and the vibration device 200. The connector 400 may be a coupler, a linker, a coupling means, a connection member, or a coupling member, but embodiments of the present disclosure are not limited thereto. The connector 400 may be an injection material, but embodiments of the present disclosure are not limited thereto. For example, the connector 400 may configure as a plastic or styrene material, but embodiments of the present disclosure are not limited thereto. For example, the styrene material may be an ABS material. The ABS material may be acrylonitrile, butadiene, and styrene.

With reference to FIG. 2, the apparatus 10 according to an embodiment of the present disclosure may further include a vibration member 20. The vibrator 1 may be at the vibration member 20.

The apparatus 10 according to an embodiment of the present disclosure may further include a second connection member 105. For example, the connector 400 may be connected or coupled to the vibrator 1 by the second connection member 105. The second connection member 105 may be a connection member, a coupling member, an adhesive member, or a second adhesive member, but embodiments of the present disclosure are not limited thereto.

The second connection member 105 may be a double-sided tape, an adhesive, a bond, a thermo-curable resin, or the like, but embodiments of the present disclosure are not limited thereto. For example, the second connection member 105 may include one or more of a thermos-curable adhesive, a photo-curable adhesive, and a thermosetting adhesive. For example, the second connection member 105 may include a thermosetting (or thermal bonding) adhesive. The thermo-setting adhesive may be a thermo-active type or a thermos-curable type. For example, the second connection member 105 including the thermosetting adhesive may attach or couple the vibrator 1 on or to the connector 400 by heat and pressure. For example, the second connection member 105 including the thermosetting adhesive may minimize or reduce the loss of a vibration of the vibrator 1 or the connector 400. In another example, the second connection member 105 may be similarly configured as the first connection member 120 as described above.

The second connection member 105 according to another embodiment of the present disclosure may further include a vibration transfer medium. For example, the vibration transfer medium may decrease the loss of a vibration of the vibrator 1 or the vibration device 200 transferred to the vibration member 20. For example, the vibration transfer medium may include a piezoelectric material which is included in or added to a pressure sensitive adhesive (PSA), an optically clear adhesive (OCA), or an optically clear resin (OCR), but embodiments of the present disclosure are not limited thereto.

According to an embodiment of the present disclosure, the vibrator 1 may be connected to or attached on the connector 400 by the second connection member 105. The connector 400 may be connected to or attached on an entire surface of the vibrator 1 by the second connection member 105. For example, this may be referred to as front attachment (or front bonding), but embodiments of the present disclosure are not limited thereto. According to another embodiment of the present disclosure, the vibrator 1 may be connected to or attached on a portion of the connector 400 by the second connection member 105. The connector 400 may be connected to or attached on a portion of the vibrator 1. In this case, this may be referred to as partial attachment (or partial bonding or a local attachment), but embodiments of the present disclosure are not limited thereto. According to another embodiment of the present disclosure the vibrator 1 may be connected to or attached on the connector 400 by the second connection member 105 in a mesh form. The connector 400 may be connected to or attached on the vibrator 1 in a mesh form. In this case, this may be referred to as mesh attachment (or mesh bonding), but embodiments of the present disclosure are not limited thereto. When the vibrator 1 is connected to or attached on the whole surface or the portion of the connector 400 or in the mesh form, or when the connector 400 is connected to or attached on a whole surface or a portion of the vibrator 1 or in the mesh form, an air bubble may occur. For example, an air bubble may occur based on an area where the vibrator 1 is attached on the connector 400. Due to an air bubble, an adhesive force or an attaching force between the vibrator 1 and the connector 400 may be lowered. To address such limitation, an air bubble may be removed by a protrusion portion 402 of the connector 400 described below, but embodiments of the present disclosure are not limited thereto.

According to an embodiment of the present disclosure, when the vibrator 1 is coupled or connected to the connector 400 through or by front attachment, partial attachment or mesh attachment, an air gap may occur between the vibrator 1 and the connector 400. The air gap may include a space where a sound wave generated based on a vibration of the vibrator 1 or the vibration device 200 is propagated or transferred to the vibration member 20. Accordingly, the vibration device 200 may vibrate based on a driving signal to output a sound (or a sound wave) to the air gap and may output a sound to the vibration member 20, based on a sound of the air gap. For example, the vibration of the vibration device 200 may be transferred to the vibration member 20 through the air gap. The air gap may be referred to as a sound pressure level generating space, a sound space, a sound pressure level space, a resounding portion, a sound box, a gap space, an accommodating space, a vibration space, or a sound resounding box, or the like, but embodiments of the present disclosure are not limited thereto.

The apparatus 10 according to an embodiment of the present disclosure may further include a third connection member 15. For example, the connector 400 according to an embodiment of the present disclosure may be connected or coupled to the vibrator 1 by the third connection member 15. The third connection member 15 may be a connection member, a coupling member, an adhesive member, or a third adhesive member.

The third connection member 15 may be a double-sided tape, an adhesive, a bond, a thermo-curable resin, or the like, but embodiments of the present disclosure are not limited thereto. For example, the third connection member 15 may include one or more of a thermos-curable adhesive, a photo-curable adhesive, and a thermosetting (or thermal bonding) adhesive. For example, the third connection member 15 may include a thermosetting adhesive. The thermo-setting adhesive may be a thermo-active type or a thermos-curable type. For example, the third connection member 15 including the thermosetting adhesive may attach or couple the connector 400 on or to the vibrator 1 by heat and pressure. For example, the third connection member 15 including the thermosetting adhesive may minimize or reduce the loss of a vibration of the vibrator 1 or the vibration device 200.

The third connection member 15 according to another embodiment of the present disclosure may further include a vibration transfer medium. For example, the vibration transfer medium may decrease the loss of a vibration of the vibrator 1 or the vibration device 200 transferred to the vibration member 20. For example, a content of the vibration transfer medium included in the second connection member 105 may be the same as or different from a content of the vibration transfer medium included in the third connection member 15, but embodiments of the present disclosure are not limited thereto.

The connector 400 according to an embodiment of the present disclosure may be attached on the vibration member 20 or an exterior material and/or an interior material of a vehicle (or a vehicular means) by the third connection member 15, and then, the vibrator 1 may be attached on the connector 400 by the second connection member 105. Therefore, a process of attaching the vibrator 1 on the vibration member 20 may be simplified, and a design of the connector 400 may be easily changed by changing a part of an exterior material and/or an interior material of a vehicle, thereby providing the apparatus 10 or a vibration apparatus having enhanced productivity and reliability. For example, the connector 400 may be configured based on a shape of a component of a vehicle, and the connector 400 may be attached on a component of a vehicle which is a vibration member by the third connection member 15, thereby configuring the connector 400 integrated with a component of a vehicle which is a vibration member. Furthermore, the vibrator 1 may be attached on a first surface 401 of the connector 400 by the second connection member 105.

The vibration member 20 according to an embodiment of the present disclosure may vibrate based on driving (or a vibration) of the vibration device 200. For example, the vibration member 20 may generate one or more of a vibration and a sound based on driving of the vibration device 200. For example, the vibration member 20 may be a passive vibration member, a vibration object, a display panel, a flexible display panel, a light panel, a vibration plate, a vibration substrate, a rear cover, a rear member, a vibration panel, a sound panel, or a passive vibration panel, but embodiments of the present disclosure are not limited thereto. Hereinafter, an example where the vibration member is a display panel will be described.

The vibration member 20 according to an embodiment of the present disclosure may be a display panel to display an image. For example, the display panel may display an image, for example, an electronic image, a digital image, a still image, or a video image, or the like. For example, the display panel may display an image by outputting light. The display panel may be a curved display panel, or may be any type of display panel, such as a liquid crystal display panel, an organic light emitting display panel, a quantum dot light emitting display panel, a micro light emitting diode display panel, and an electrophoresis display panel. The display panel may be a flexible display panel. For example, the display panel may a flexible light emitting display panel, a flexible electrophoretic display panel, a flexible electro-wetting display panel, a flexible micro light emitting diode display panel, or a flexible quantum dot light emitting display panel, but embodiments of the present disclosure are not limited thereto.

The display panel according to an embodiment of the present disclosure may include a display area for displaying an image according to driving of the plurality of pixels. In addition, the display panel may include a non-display area surrounding the display area, but embodiments of the present disclosure are not limited thereto.

The display panel according to an embodiment of the present disclosure may be configured to display an image in a type such as a top emission type, a bottom emission type, a dual emission type, or the like according to a structure of the pixel array layer including an anode electrode, a cathode electrode, and a light emitting device. The top emission type may display an image by outputting visible light generated from the pixel array layer to the forward region of a base substrate, and the bottom emission type may display an image by outputting visible light generated from the pixel array layer to the backward region of the base substrate, and a dual emission type may display an image by outputting visible light generated from the pixel array layer to both the forward region and the backward region of the base substrate.

The display panel according to an embodiment of the present disclosure may include a pixel array part disposed in a pixel area configured by a plurality of gate lines and/or a plurality of data lines. The pixel array part may include a plurality of pixels which display an image based on a signal supplied through the signal lines. The signal lines may include a gate line, a data line, a pixel driving power line, or the like, but embodiments of the present disclosure are not limited thereto.

Each of the plurality of pixels may include a pixel circuit layer including a driving thin film transistor (TFT) provided at the pixel area which is configured by a plurality of gate lines and/or a plurality of data line, an anode electrode electrically connected to the driving TFT, a light emitting device formed on the anode electrode, and a cathode electrode electrically connected to the light emitting device.

The driving TFT may be configured at a transistor region of each pixel area provided on a substrate. The driving TFT may include a gate electrode, a gate insulation layer, a semiconductor layer, a source electrode, and a drain electrode. The semiconductor layer of the driving TFT may include silicon such as amorphous silicon (a-Si), polysilicon (poly-Si), or low temperature poly-Si, or the like, or may include oxide such as indium-gallium-zinc-oxide (IGZO), or the like, but embodiments of the present disclosure are not limited thereto.

The anode electrode may be provided at an opening region disposed at each pixel area and may be electrically connected to the driving TFT.

The light emitting device according to an embodiment may include a light emitting device layer formed on an anode electrode. The light emitting device layer may be implemented to emit light having the same color (for example, white light) for each pixel, or may be implemented to emit light having a different color (for example, red light, green light, or blue light) for each pixel. The cathode electrode (e.g., a common electrode) may be connected to the light emitting device layer provided in each pixel area in common. For example, the light emitting device layer may be a single structure including the same color for each pixel, or may be a stack structure having two or more structures including the same color for each pixel. As another embodiment of the present disclosure, the light emitting device layer may be a stack structure having two or more structures including one or more different colors for each pixel. The two or more structures including the one or more different colors may be configured with one or more of blue, red, yellow-green, and green or a combination thereof, but embodiments of the present disclosure are not limited thereto. An example of the combination may include blue and red, red and yellow-green, red and green, red/yellow-green/green, or the like, but embodiments of the present disclosure are not limited thereto. Furthermore, regardless of a stack order thereof, the present disclosure may be applied. The stack structure having two or more structures including the same color or one or more different colors may further include a charge generating layer between the two or more structures. The charge generating layer may have a PN junction structure and may include an N-type charge generating layer and a P-type charge generating layer.

The light emitting device according to another embodiment of the present disclosure may include a micro light emitting diode device electrically connected to each of an anode electrode and a cathode electrode. The micro light emitting diode device may be a light emitting diode implemented as an integrated circuit (IC) or chip type. The micro light emitting diode device may include a first terminal electrically connected to the anode electrode and a second terminal electrically connected to the cathode electrode. The cathode electrode may be connected to the second terminal of the micro light emitting diode device provided in each pixel area in common.

An encapsulation part or encapsulation substrate may be formed on the substrate to surround the pixel array part on which the pixel array part is formed, thereby preventing or reducing oxygen or water from penetrating into the light emitting device of the pixel array part. The encapsulation part according to an embodiment of the present disclosure may be formed in a structure having two or more layers where an organic material layer and an inorganic material layer are alternately stacked, but embodiments of the present disclosure are not limited thereto. The inorganic material layer may prevent or reduce oxygen or water from penetrating into the light emitting device of the pixel array part. The organic material layer may be formed to have a thickness which is relatively thicker than the inorganic material layer so as to cover particles occurring in a manufacturing process, but embodiments of the present disclosure are not limited thereto. For example, the encapsulation part may include a first inorganic layer, an organic layer on the first inorganic layer, and a second inorganic layer on the organic layer. The organic layer may be a particle cover layer, but embodiments of the present disclosure are not limited thereto. A touch panel may be disposed on the encapsulation part or may be disposed at a rear surface of the pixel array part or in the pixel array part.

The display panel according to an embodiment of the present disclosure may include a first substrate, a second substrate, and a liquid crystal layer. The first substrate may be an upper substrate or a thin film transistor (TFT) array substrate. For example, the display panel may include the first substrate including a TFT which is a switching element for adjusting a light transmittance of each pixel, the second substrate including a color filter and/or a black matrix, and the liquid crystal layer which is formed between the first substrate and the second substrate. For example, the first substrate may include the pixel array part (or a display part or a display area) including a plurality of pixels which are respectively provided in a plurality of pixel areas crossed by a plurality of gate lines and/or a plurality of data lines. Each of the plurality of pixels may include a TFT connected to a gate line and/or a data line, a pixel electrode connected to the TFT, and a common electrode which is provided adjacent to the pixel electrode and is supplied with a common voltage.

The first substrate may further include a pad part provided at a first periphery (or a first non-display part) and a gate driving circuit provided at a second periphery (or a second non-display part) thereof.

The pad part may supply a signal supplied from the outside to the pixel array part and/or the gate driving circuit. For example, the pad part may include a plurality of data pads connected to the plurality of data lines through a plurality of data link lines and/or a plurality of gate input pads connected to the gate driving circuit through a gate control signal line. For example, a size of the first substrate may have a size which is same as or greater than the second substrate, but embodiments of the present disclosure are not limited thereto.

The gate driving circuit may be embedded (or integrated) into a second periphery of the first substrate so as to be connected to the plurality of gate lines. For example, the gate driving circuit may be implemented as a shift register including a transistor which is formed through the same process as the TFT provided at the pixel area. The gate driving circuit according to another embodiment of the present disclosure may not be embedded into the first substrate and may be included a panel driving circuit as an integrated circuit (IC) type.

The second substrate may be a lower substrate or a color filter array substrate. For example, the second substrate may include a pixel opening part (e.g., pixel pattern) including an opening area overlapping with the pixel area formed in the first substrate, and a color filter layer formed at the opening area, but embodiments of the present disclosure are not limited thereto. The second substrate may have a size which is smaller than or same as the first substrate, but embodiments of the present disclosure are not limited thereto. For example, the second substrate may overlap a remaining portion, other than the first periphery, of the upper substrate (i.e., the first substrate). The second substrate may be attached to a remaining portion, other than the first periphery, of the first substrate with a liquid crystal layer therebetween using a sealant.

The liquid crystal layer may be disposed between the first substrate and the second substrate. The liquid crystal layer may include a liquid crystal including liquid crystal molecules where an alignment direction thereof is changed based on an electric field generated by the common voltage and a data voltage applied to a pixel electrode for each pixel.

A second polarization member may be disposed at a lower surface of the second substrate and may polarize light which is incident from the backlight and travels to the liquid crystal layer. A first polarization member may be disposed at an upper surface of the first substrate and may polarize light which passes through the first substrate and is output to the outside.

The display panel according to an embodiment of the present disclosure may drive the liquid crystal layer based on an electric field which is generated in each pixel by the common voltage and the data voltage applied to each pixel, and thus, may display an image based on light passing through the liquid crystal layer.

In display panel according to another embodiment of the present disclosure, the first substrate may be implemented as the color filter array substrate, and the second substrate may be implemented as the TFT array substrate. For example, the display panel according to another embodiment of the present disclosure may have a type where the display panel according to an embodiment of the present disclosure are vertically reversed therebetween. For example, a pad part of the display panel according to another embodiment of the present disclosure may be covered by a separate mechanism.

The display panel according to another embodiment of the present disclosure may include a bending portion that may be bent or curved to have a certain curvature radius or a curved shape.

The bending portion of the display panel may be implemented in at least one or more of one periphery and the other periphery of the display panel, which are parallel to each other. The one periphery and/or the other periphery, where the bending portion is implemented, of the display panel may include only the non-display area, or may include a periphery of the display area and the non-display area. The display panel including the bending portion implemented by bending of the non-display area may have a one-side bezel bending structure or a both-side bezel bending structure. Moreover, the display panel including the bending portion implemented by bending of the periphery of the display area and the non-display area may have a one-side active bending structure or a both-side active bending structure.

According to another embodiment of the present disclosure, the vibration member 20 may include one or more material of metal, wood, rubber, plastic, glass, cloth, fiber, paper, a mirror, carbon, leather, an interior material of a vehicle, an indoor ceiling of a building, and an interior material of an aircraft, but embodiments of the present disclosure are not limited thereto. For example, the paper may be cone paper for speakers. For example, the cone paper may be pulp or foamed plastic, or the like, but embodiments of the present disclosure are not limited thereto.

According to another embodiment of the present disclosure, the vibration member 20 may include a display panel having a plurality of pixels configured to display an image, or may include a non-display panel. For example, the vibration member 20 may include one or more of a vehicular interior material, a vehicular exterior material, a vehicular glass window, a building indoor ceiling, a building glass window, a building interior material, an aircraft interior material, an aircraft exterior material, an aircraft glass window, or the like, but embodiments of the present disclosure are not limited thereto. For example, the vibration member 20 may include one or more of a display panel having a plurality of pixels configured to display an image, a screen panel on which an image is projected from a display apparatus, a lighting panel (or a non-display panel), a signage panel, a vehicular interior material, a vehicular glass window, a vehicular exterior material, a building ceiling material, a building interior material, a building glass window, and a mirror, but embodiments of the present disclosure are not limited thereto. For example, the display panel may be a curved display panel, or may be any type of display panel, such as a liquid crystal display panel, an organic light emitting display panel, a quantum dot light emitting display panel, a micro light emitting diode display panel, an electro-wetting display panel, an electrophoresis display panel, and an inorganic light emitting diode display panel, or the like. For example, the display panel may be a flexible display panel. For example, the display panel may be a flexible light emitting display panel, a flexible electrophoretic display panel, a flexible electro-wetting display panel, a flexible micro light emitting diode display panel, or a flexible quantum dot light emitting display panel, but embodiments of the present disclosure are not limited thereto. For example, the non-display panel may be a light emitting diode lighting panel (or apparatus), an organic light emitting lighting panel (or apparatus), an inorganic light emitting lighting panel (or apparatus), or the like, but embodiments of the present disclosure are not limited thereto. For example, the vibration member 20 may include a display panel including a plurality of pixels configured to display an image, or may include one or more of a light emitting diode lighting panel (or apparatus), an organic light emitting lighting panel (or apparatus), or an inorganic light emitting lighting panel (or apparatus), but embodiments of the present disclosure are not limited thereto. For example, the vibration member 20 may include a structure material of a vehicular means (or a car or a vehicle or a vehicular apparatus) having one or more of a flat portion and a curved portion. For example, the vibration member 20 may include one or more of a garnish, an A pillar, a door frame, and a roof panel of the vehicular means (or a car or a vehicle or a vehicular apparatus).

The vibration device 200 or the vibrator 1 may be at a rear surface of the vibration member 20. For example, the vibration device 200 or the vibrator 1 may vibrate the vibration member 20. For example, the vibration device 200 may be implemented at the rear surface of the vibration member 20 to directly vibrate the vibration member 20. For example, the vibration device 200 may vibrate the vibration member 20 at the rear surface of the vibration member 20, thereby providing a sound and/or a haptic feedback based on the vibration of the vibration member 20 to a user. For example, the vibration member 20 may output sound according to the vibration of the vibration device 200. The vibration device 200 may use the vibration member 20 as a vibration plate to output sound. For example, the vibration device 200 may use the vibration member 20 as a vibration plate to output sound to a front surface of the vibration member 20. For example, the vibration device 200 may generate a sound so that a traveling direction of the sound is a direction toward a forward region in front of the display panel or the vibration member 20. The vibration device 200 may vibrate the vibration member 20 to output sound. For example, the vibration device 200 may directly vibrate the vibration member 20 to output a sound.

According to an embodiment of the present disclosure, the vibration device 200 may vibrate according to a voice signal synchronized with an image displayed on the display panel as the vibration member 20 to vibrate the display panel. According to another embodiment of the present disclosure, the vibration device 200 may vibrate according to a haptic feedback signal (or a tactile feedback signal) synchronized with a user touch applied to a touch panel (or a touch sensor layer) which is disposed on the display panel or embedded into the display panel and may vibrate the display panel. Accordingly, the display panel may vibrate based on a vibration of the vibration device 200 to provide a user (or a viewer) with at least one or more of a sound and a haptic (or tactile) feedback, but embodiments of the present disclosure are not limited thereto.

The vibration device 200 or the vibrator 1 according to an embodiment of the present disclosure may be implemented to have a size corresponding to the vibration member 20 or the display area of the display panel. A size of the vibration device 200 may be 0.9 to 1.1 times a size of the vibration member 20 or the display area, but embodiments of the present disclosure are not limited thereto. For example, a size of the vibration device 200 may be the same as or smaller than the size of the vibration member 20 or the display area. For example, a size of the vibration device 200 may be the same as or approximately same as the vibration member 20 or the display area of the display panel, and thus, the vibration device 200 may cover a most region of the vibration member 20 or the display panel and a vibration generated by the vibration device 200 may vibrate an entire region of the vibration member 20 or the display panel, and thus, localization of a sound may be high, and satisfaction of a user may be improved. Also, a contact area (or panel coverage) between the vibration member 20 or the display panel and the vibration device 200 may increase, and thus, a vibration region of the vibration member 20 or the display panel may increase, thereby improving a sound of a middle-low-pitched sound band generated based on a vibration of the vibration member 20 or the display panel. Also, a vibration device 200 applied to a large-sized apparatus (or a large-sized display apparatus) may vibrate the entire vibration member 20 or display panel having a large size (or a large area), and thus, localization of a sound based on a vibration of the vibration member 20 or the display panel may be further enhanced, thereby realizing an improved sound effect. Therefore, the apparatus 10 or the vibration apparatus according to an embodiment of the present disclosure may be disposed at the rear surface of the vibration member 20 or the display panel to sufficiently vibrate the vibration member 20 or the display panel in a vertical direction (or front-to-rear direction), thereby outputting a desired sound to a forward region or a forward direction in front of the apparatus. For example, the vibration device 200 according to an embodiment of the present disclosure may be disposed at the rear surface of the display panel to sufficiently vibrate the display panel in a vertical (or front-to-rear) direction of the display panel, thereby outputting a desired sound to a forward region in front of the apparatus or the display apparatus.

The vibration device 200 according to an embodiment of the present disclosure may be implemented as a film type, since the vibration device 200 may be implemented as a film-type, the vibration device 200 may have a thickness which is thinner than the vibration member 20 or the display panel, and thus, an increase in the thickness of the display apparatus may be minimized or reduced due to the arrangement of the vibration device 200. For example, the vibration device 200 may use the vibration member 20 or the display panel as a sound vibration plate. For example, the vibration device 200 may be referred to as a vibration apparatus, a vibration generating apparatus, a displacement apparatus, a sound apparatus, a sound generating module, a sound generating apparatus, a film actuator, a film-type piezoelectric composite actuator, a film speaker, a film-type piezoelectric speaker, a film-type piezoelectric composite speaker, a piezoelectric device, a piezoelectric vibration part, a piezoelectric driving part, a piezoelectric vibration layer, a piezoelectric structure, or the like, but embodiments of the present disclosure are not limited thereto.

As another embodiment of the present disclosure, the apparatus 10 or the vibration apparatus may not be disposed at the rear surface of the vibration member 20 or the display panel and may be applied to the non-display panel instead of the display panel. For example, the non-display panel may include one or more of wood, plastic, glass, metal, cloth, fiber, rubber, paper, leather, a vehicular interior material, a building ceiling material, or an aircraft interior material, or the like, but embodiments of the present disclosure are not limited thereto. In this case, the non-display panel may be applied as a vibration plate, and the vibration device 200 may vibrate the non-display panel to output a sound.

As another embodiment of the present disclosure, the apparatus 10 or the vibration apparatus may be applied to implement a sound apparatus, a sound output apparatus, a sound bar, a sound system, a sound apparatus for vehicular apparatuses, a sound output apparatus for vehicular apparatuses, or a sound bar for vehicular apparatuses, or the like. For example, the vehicular apparatus may include one or more seats and one or more glass windows. For example, the vehicular apparatus may include a vehicle, a train, a ship, or an aircraft, but embodiments of the present disclosure are not limited thereto. Alternatively, the apparatus 10 or the vibration apparatus may implement an analog signage or a digital signage, or the like such as an advertising signboard, a poster, or a noticeboard, or the like.

The apparatus 10 or the vibration apparatus according to an embodiment of the present disclosure may be disposed at the rear surface of the vibration member 20 or the display panel to overlap the vibration member 20 or the display area of the display panel. For example, the apparatus 10 or the vibration apparatus may overlap half or more of the vibration member 20 or half or more of the display area of the display panel. For example, the apparatus 10 or the vibration apparatus may overlap 20%, 30%, 40%, 60%, 70%, 80%, or 90% of the entire area of the vibration member 20 or the display area of the display panel, but embodiments of the present disclosure are not limited thereto. According to another embodiment of the present disclosure, the apparatus 10 or the vibration apparatus may overlap the entire vibration member 20 or the entire display area of the display panel.

According to another embodiment of the present disclosure, a plate may be further disposed at the vibration device 200. For example, the plate may be disposed at a front surface and/or a rear surface of the vibration device 200. The plate may include a metal material, or may include a single nonmetal material or a composite nonmetal material of one or more of wood, rubber, plastic, glass, fiber, cloth, paper, mirror, carbon, and leather, but embodiments of the present disclosure are not limited thereto. For example, each of the vibration device 200 and the plate may have a same size, but embodiments of the present disclosure are not limited thereto.

The plate according to an embodiment of the present disclosure may increase a mass of the vibration device 200, and thus, may reduce a lowest resonance frequency (or a lowest natural frequency) of the vibration device 200. Therefore, the vibration device 200 may vibrate at a relatively low frequency due to a lowest resonance frequency (or a lowest natural frequency) based on an increase in mass caused by the plate. Accordingly, a sound characteristic and/or a sound pressure level characteristic of a low-pitched sound band generated based on a vibration of the vibration device 200 may be enhanced, and the flatness of a sound pressure level characteristic may be increased or enhanced. For example, the flatness of the sound pressure level characteristic may be a magnitude of a deviation between a highest sound pressure level and a lowest sound pressure level. For example, the plate may be a resonance pad, a mass member, a weight clapper, a weight member, a sound planarization member, a supporting plate, a rigid plate, a transfer plate, an intermediate plate, or a vibration transfer plate, but embodiments of the present disclosure are not limited thereto. For example, the low-pitched sound band may be about 200 Hz or less, about 300 Hz or less, about 400 Hz or less, or about 500 Hz or less, but embodiments of the present disclosure are not limited thereto, and may be, for example, 3 kHz or less.

The vibration device 200 according to an embodiment of the present disclosure may vibrate by alternately and repeatedly contract and expand based on an inverse piezoelectric effect when an alternating current (AC) voltage is applied, thereby vibrating the vibration member 20 or the display panel through the vibration thereof. For example, the vibration device 200 may vibrate according to a voice signal synchronized with an image displayed on the display panel to vibrate the display panel. As another embodiment of the present disclosure, the vibration device 200 may vibrate according to a haptic feedback signal (or a tactile feedback signal) synchronized with a user touch applied to a touch panel (or a touch sensor layer) which is disposed on the display panel or embedded into the display panel and may vibrate the display panel. Accordingly, the display panel may vibrate based on a vibration of the vibration device 200 to provide a user (or a viewer) with at least one or more of a sound and a haptic feedback.

Therefore, the apparatus 10 or the vibration apparatus according to an embodiment of the present disclosure may output a sound, generated by a vibration of the vibration member 20 or the display panel based on a vibration of the vibration device 200, in a forward region (or a forward direction) in front of the vibration member 20 or the display panel. Moreover, in the apparatus according to an embodiment of the present disclosure, a most region of the vibration member 20 (or the display panel) may be vibrated by the vibration device 200 having a film-type, thereby more enhancing a sense of sound localization and a sound pressure level characteristic of a sound based on the vibration of the vibration member 20 (or the display panel).

With reference to FIG. 2, the first protection part 300 may be connected or coupled to a rear surface of the vibration device 200 (when a surface of the vibration device 200 facing the vibration member 20 is an upper surface) to cover the vibration device 200. For example, the first protection part 300 may be connected or coupled to the rear surface of the vibration device 200 by a connection member (or a coupling member). For example, the first protection part 300 may configure a closed space or a sealing space which covers or surrounds the vibration device 200. For example, there may be a space between the first protection part 300 and the vibration device 200. For example, the vibrator 1 or the apparatus may configure a space between the first protection part 300 and the vibration device 200. For example, the first protection part 300 may be an enclosure, a closed member, a closed cap, a closed box, a sealing member, a sealing cap, a sealing box, or a sound box, but embodiments of the present disclosure are not limited thereto. The closed space or the sealing space may be a gap space, an air gap, a vibration space, a sound space, or a sounding box, but embodiments of the present disclosure are not limited thereto.

The first protection part 300 according to an embodiment of the present disclosure may further include one or more holes 310. The one or more holes 310, which may also be referred to as communication parts (or connection parts), communicate or connect the closed space or the sealing space between the first protection part 300 and the vibration device 200 with outside of the apparatus 10.

The one or more holes 310 of the first protection part 300 may be disposed in (or within) a certain region of the first protection part 300 so as to decrease an air pressure of a gap space in (or within) the apparatus or the vibration apparatus. For example, the one or more holes 310 may be arranged (or disposed) with a certain interval. The one or more holes 310 may be configured to correspond to a size of the vibration device 200 or the vibration apparatus. The one or more holes 310 may overlap the vibration device 200 or the vibration apparatus. For example, the one or more holes 310 may have a size smaller than that of the vibration device 200. For example, the one or more holes 310 may be differently disposed toward a region where the vibration device 200 is not disposed, compared to a region where the vibration device 200 is disposed. For example, the one or more holes 310 of the first protection part 300 may be differently disposed toward a periphery of the vibration device 200 from a center of the vibration device 200. For example, a size of the one or more holes 310 may be different toward the periphery of the vibration device 200 from the center of the vibration device 200.

According to an embodiment of the present disclosure, the one or more holes 310 of the first protection part 300 may increase a band of a low-pitched sound band as an air pressure of the gap space is reduced, thereby improving a sound characteristic of the low-pitched sound band. For example, as a pressure (or an air pressure) of the gap space is lowered by the one or more holes 310, the amount of displacement (or a bending force) of the vibration device 200 disposed between the vibration member 20 or a display panel and the first protection part 300 may increase, and thus, a band of the low-pitched sound band may increase and the sound characteristic and/or the sound pressure level characteristic of the low-pitched sound band may be enhanced. When the one or more holes 310 are not disposed at the first protection part 300, an air pressure of the gap space may be increased by a sound wave or a sound generated by a vibration of the vibration device 200, and due to this, the sound characteristic of the low-pitched sound band may be reduced. In addition, when the one or more holes 310 are disposed at the first protection part 300, the vibration device 200 may vibrate more stably, and thereby improving the sound equality and sound characteristic.

According to an embodiment of the present disclosure, because the one or more holes 310 is configured at the first protection part 300, air may be discharged through the one or more holes 310 even when a sound wave or a sound is generated by the vibration of the vibration device 200 or the vibration apparatus, and due to this, an air pressure of the gap space may be lowered. Accordingly, the band of the low-pitched sound band may increase, thereby improving the sound characteristic of the low-pitched sound band.

With reference to FIG. 2, the connector 400 may further include at least one or more coupling parts 404.

The at least one or more coupling parts 404 may be at a periphery portion of the connector 400. The at least one or more coupling parts 404 may be connected or coupled to the vibrator 1. The at least one or more coupling parts 404 may be configured with a hook, but embodiments of the present disclosure are not limited thereto. For example, the at least one or more coupling parts 404 may be a connection part, a coupling member, a connection member, a hook part, a hook member, a fastening part, a fastening member, a fixing part, or a fixing member, but embodiments of the present disclosure are not limited thereto.

According to an embodiment of the present disclosure, an aligning member may be further disposed at the at least one or more coupling parts 404. The aligning member may be configured as an alignment key, an alignment scale, or an alignment groove, but embodiments of the present disclosure are not limited thereto. For example, the aligning member may control or adjust an alignment position of each of the connector 400 and the vibrator 1. For example, a user may check the assembly or not of the connector 400 and the vibrator 1 with eyes based on the aligning member, and thus, the reliability of the apparatus 10 or the vibration apparatus may be enhanced.

It is to be noted that although the vibrator 1 according to one or more embodiments of the present disclosure is illustrated for example as including a stacked structure of the vibration device 200, the first connection member 120, the supporting member 100 and the second connection member 105 (or further including the first protection part 300), but embodiments of the present disclosure are not limited thereto. For example, one or more of the first connection member 120, the supporting member 100, the second connection member 105, and the first protection part 300 may be omitted from the vibrator 1.

Figure 3:
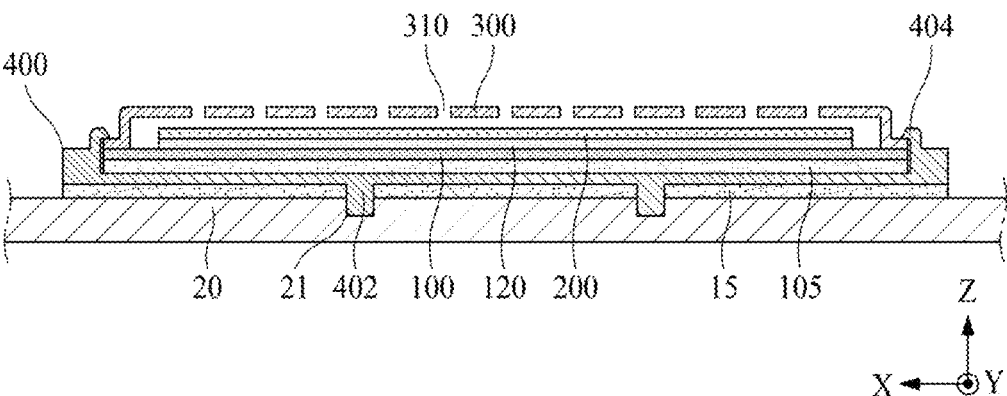
FIG. 3 illustrates an apparatus according to another embodiment of the present disclosure.

FIG. 3 illustrates an apparatus according to another embodiment of the present disclosure.

With reference to FIG. 3, an apparatus according to another embodiment of the present disclosure may include a vibration member 20, a vibrator 1, and a connector 400. A description thereof may be substantially the same as or similar to the above descriptions of FIGS. 1 and 2, and thus, like reference numerals refer to like elements and the repetitive description thereof may be omitted or will be briefly given below.

The apparatus according to another embodiment of the present disclosure may further include at least one or more protrusion portions 402.

For example, the at least one or more protrusion portions 402 according to an embodiment of the present disclosure may be configured as two or more, but embodiments of the present disclosure are not limited thereto. The at least one or more protrusion portions 402 may be disposed at a rear surface (or a rear surface side) of the connector 400. The at least one or more protrusion portions 402 may be connected or coupled to the vibration member 20. For example, the at least one or more protrusion portions 402 may protrude toward the vibration member 20. The at least one or more protrusion portions 402 may be configured to protrude toward the vibration member 20 from a center of the connector 400, but embodiments of the present disclosure are not limited thereto. For example, the at least one or more protrusion portions 402 may be configured to protrude toward the vibration member 20 from a periphery or an outer portion of the connector 400.

For example, the at least one or more protrusion portions 402 according to an embodiment of the present disclosure may overlap the vibrator 1 or a vibration apparatus. The at least one or more protrusion portions 402 may be configured so that the vibrator 1 is mounted (or attached) at the vibration member 20. The at least one or more protrusion portions 402 may be a mounting projection (or protrusion) or a mounting guide projection (or protrusion) so that the vibrator 1 is mounted (or attached) at the vibration member 20. For example, the at least one or more protrusion portions 402 may be a projection, a guide projection, or an alignment projection, but embodiments of the present disclosure are not limited thereto.

Figure 4:
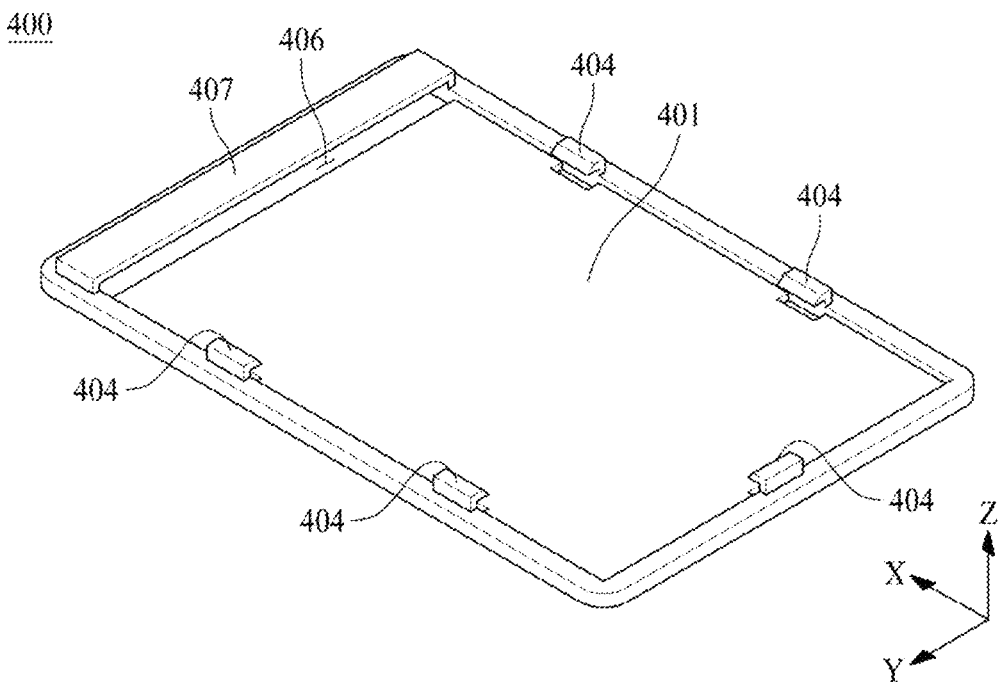
FIG. 4 illustrates a connector according to an embodiment of the present disclosure.
Figure 5:
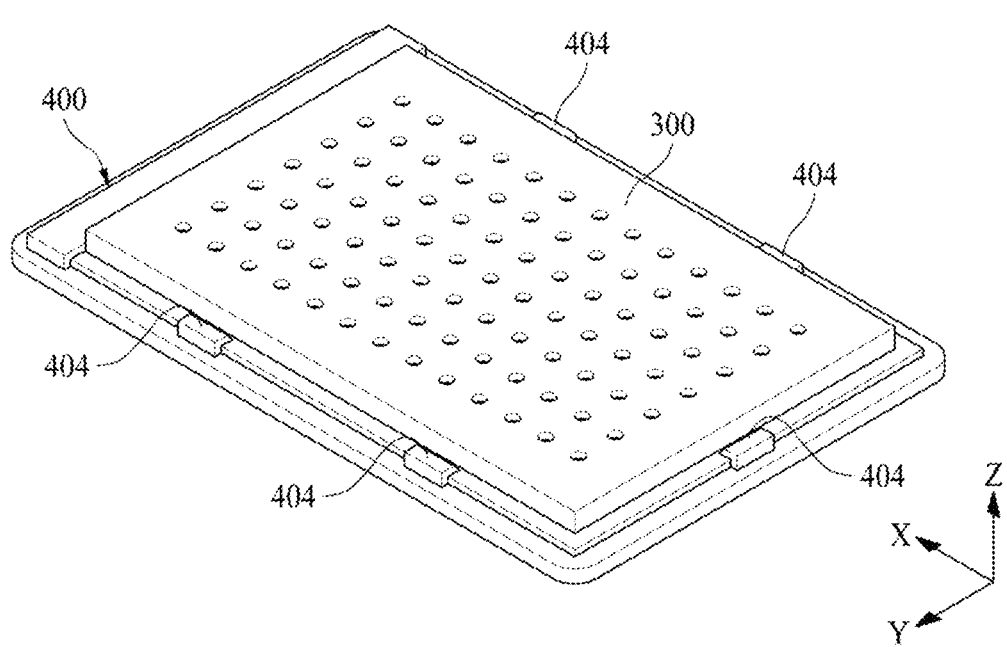
FIG. 5 illustrates a first protection part and a connector according to another embodiment of the present disclosure.

FIG. 4 illustrates a connector according to an embodiment of the present disclosure. FIG. 4 is a front perspective view illustrates the connector according to an embodiment of the present disclosure. FIG. 5 illustrates a connector and a cover according to an embodiment of the present disclosure.

With reference to FIGS. 4 and 5, a connector 400 according to an embodiment of the present disclosure may include a coupling part 404 and an accommodating part 407. A description of the coupling part 404 may be substantially the same as the above descriptions of FIGS. 1 to 3, and thus, like reference numerals refer to like elements and the repetitive description thereof may be omitted or will be briefly given below.

The accommodating part 407 according to an embodiment of the present disclosure may be disposed at a lateral surface of the connector 400. The connector 400 may include a long side and a short side. For example, the accommodating part 407 may be disposed along the short side of the connector 400. The vibrator 1 may be accommodated into the connector 400 by the accommodating part 407. The accommodating part 407 may be an inserting part or a binding part, but embodiments of the present disclosure are not limited thereto.

The connector 400 according to an embodiment of the present disclosure may further include at least one or more grooves 406. The at least one or more grooves 406 may be disposed at the short side of the connector 400, but embodiments of the present disclosure are not limited thereto. For example, the at least one or more grooves 406 may be disposed along the short side of the connector 400. The at least one or more grooves 406 may be disposed at the accommodating part 407. For example, the vibrator 1 may be connected or coupled to the at least one or more grooves 406. For example, the at least one or more grooves 406 may be a hole, an opening portion, a slot, or a slit, but embodiments of the present disclosure are not limited thereto.

The vibration device 200 according to an embodiment of the present disclosure may include a signal cable which applies a signal to an electrode layer included in the vibration device 200. The signal cable may be configured to pass through or by or via the at least one or more grooves 406. For example, the signal cable may include a power supply line which applies a signal to the electrode layer included in the vibration device 200. The power supply line may be configured to pass through or by or via the at least one or more grooves 406. The electrode layer, the signal cable, and the power supply line will be described below with reference to FIG. 11. For example, positions of the at least one or more grooves 406 may be changed based on a position of a pad portion connected to the signal cable and/or the power supply line. The at least one or more grooves 406 may be connected or coupled to the vibrator 1 so that the vibrator 1 is connected or coupled to the connector 400 and may enable the signal cable and/or the power supply line to be loaded or unloaded. For example, the at least one or more grooves 406 may be connected or coupled to the connector 400 so that the vibrator 1 is connected or coupled to the connector 400 and may enable the signal cable and/or the power supply line to be loaded or unloaded simultaneously.

The connector 400 according to an embodiment of the present disclosure may include a first surface 401. The first surface 401 may be an attachment surface of the vibrator 1. For example, the first surface 401 may be an attachment surface of a connection member which connects the vibrator 1 with the connector 400. The first surface 401 may be configured to have different surface roughness. For example, surface treatment may be performed on the first surface 401. For example, a mirror surface or an uneven surface (or a concave-convex portion) may be applied to the first surface 401, but embodiments of the present disclosure are not limited thereto. For example, the connector 400 may be implemented by applying a mirror surface or an uneven surface (or a concave-convex portion) to an injection material including an ABS material, but embodiments of the present disclosure are not limited thereto. As surface treatment is performed on the first surface 401 of the connector 400, an attaching force or an adhesive force of a connection member between the vibrator 1 and the connector 400 may be verified, and thus, the reliability of the apparatus 10 or a vibration apparatus may be enhanced. For example, the first surface 401 may be a supporting surface, a bottom surface, a floor surface, or a vibrator attachment surface, but embodiments of the present disclosure are not limited thereto.

The coupling part 404 according to an embodiment of the present disclosure may be disposed along a periphery of the connector 400. The coupling part 404 may be configured as at least one or more coupling parts. The coupling part 404 may be configured as at least one or more at the long side and/or the short side of the connector 400. For example, the coupling part 404 may be configured as at least one or more coupling parts along the long side and/or the short side of the connector 400. The coupling part 404 configured at the long side of the connector 400 may be selectively configured. The coupling part 404 configured at the short side of the connector 400 may be configured, and thus, may connect or couple the vibrator 1 to the connector 400. For example, the vibrator 1 may be connected or coupled to the connector 400 by the coupling part 404 facing the at least one or more grooves 406. For example, the coupling part 404 facing the at least one or more grooves 406 may be configured to connect the vibrator 1 to the connector 400. For example, a coupling part 404 facing the at least one or more grooves 406 and a coupling part 404 disposed at a surface which differs from the coupling part 404 facing the at least one or more grooves 406, may be selectively configured.

With reference to FIG. 5, a first protection part 300 may be disposed at the connector 400. The first protection part 300, as described above with reference to FIGS. 2 and 3, may include at least one or more holes. The first protection part 300 may overlap the connector 400. For example, the first protection part 300 may cover the connector 400. In another example, the first protection part 300 may be connected or coupled to the connector 400 so as to fix the first protection part 300.

According to an embodiment of the present disclosure, because the at least one or more grooves 406 and/or the at least one or more coupling parts 404 are/is configured, the vibrator 1 may be connected or coupled to the connector 400. According to an embodiment of the present disclosure, because surface treatment, for example, a mirror surface or an uneven portion (or a concave-convex portion) is applied to the first surface 401 of the connector 400, an attaching force or an adhesive force of the connection member (e.g., the second connection member 105) between the vibrator 1 and the connector 400 may be enhanced, and thus, the reliability of the apparatus 10 or the vibration apparatus may be enhanced.

The connector 400 according to an embodiment of the present disclosure may be attached on the vibration member 20 or an exterior material and/or an interior material of a vehicle (or a vehicular means) by the third connection member 15, and then, the vibrator 1 may be attached on the connector 400 by the second connection member 105. Therefore, a process of attaching the vibrator 1 on the vibration member 20 may be simplified, and a design of the connector 400 may be easily changed by changing a part of an exterior material and/or an interior material of a vehicle, thereby providing the apparatus 10 or a vibration apparatus having enhanced productivity and reliability. For example, the connector 400 may be configured based on a shape of a component of a vehicle, and the connector 400 may be attached on a component of a vehicle, which is a vibration member, by the third connection member 15, thereby configuring the connector 400 integrated with a component of a vehicle, which is a vibration member. Furthermore, the vibrator 1 may be attached on the first surface 401 of the connector 400 by the second connection member 105.

Figure 6:
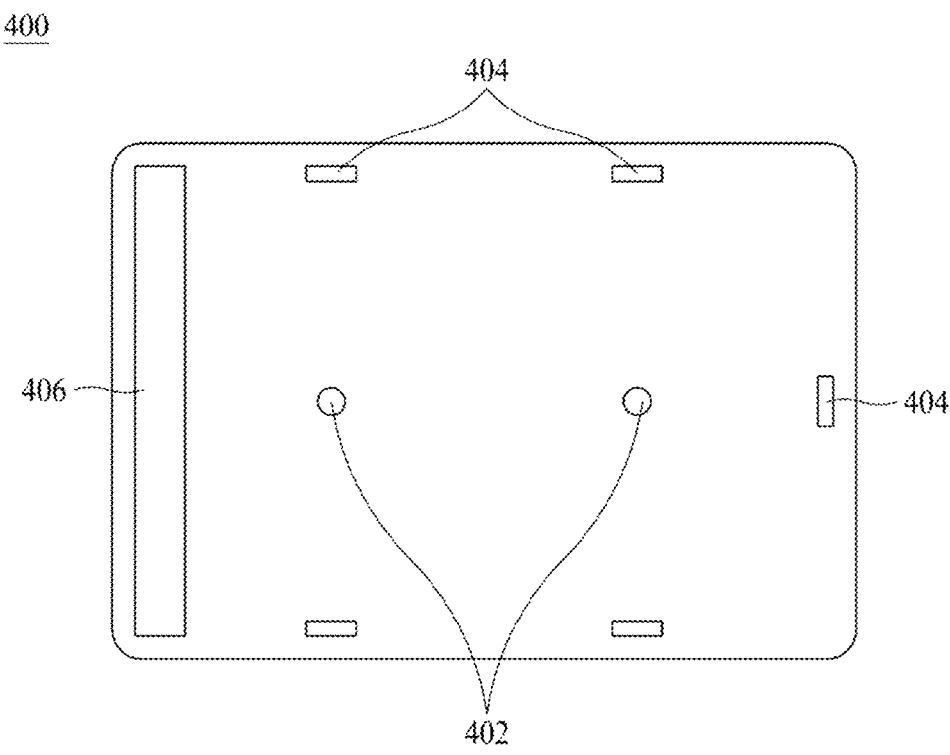
FIG. 6 illustrates a connector according to an embodiment of the present disclosure.

FIG. 6 illustrates a connector according to an embodiment of the present disclosure. FIG. 6 is a rear view of a connector according to an embodiment of the present disclosure.

With reference to FIG. 6, a rear surface of the connector 400 according to another embodiment of the present disclosure may include at least one or more protrusion portions 402.

The at least one or more protrusion portions 402 may be disposed at a center of the rear surface of the connector 400, but embodiments of the present disclosure are not limited thereto. For example, the at least one or more protrusion portions 402 may be disposed at a periphery or an outer portion of the connector 400.

The connector 400 may include a long side and a short side. At least one or more coupling parts 404 may be disposed at the long side of the connector 400. For example, the at least one or more coupling parts 404 may be disposed on a same line as the at least one or more protrusion parts 402 with respect to the short side of the connector 400, but embodiments of the present disclosure are not limited thereto. Accordingly, a coupling force or an attaching force of the vibrator 1 coupled to the connector 400 may be further enhanced. For example, the at least one or more coupling parts 404 may be asymmetrical or may be disposed on a line which differs from the at least one or more protrusion portions 402 with respect to the short side of the connector 400. For example, the at least one or more coupling parts 404 may be disposed to be more adjacent to a center of the connector 400 than that of the at least one or more protrusion portions 402. For example, the at least one or more coupling parts 404 may be disposed to be more adjacent to the periphery of the connector 400 than that of the at least one or more protrusion portions 402.

The at least one or more coupling parts 404 may be disposed along the long side of the connector 400. For example, the at least one or more coupling parts 404 may be disposed along the short side of the connector 400. For example, the at least one or more coupling parts 404 may be disposed along the long side and the short side of the connector 400.

According to an embodiment of the present disclosure, the at least one or more coupling parts 404 disposed along the short side of the connector 400 may be disposed on a same line as the at least one or more protrusion portions 402 with respect to the long side of the connector 400.

According to an embodiment of the present disclosure, the at least one or more grooves 406 may be disposed along the short side of the connector 400. For example, the at least one or more protrusion portions 402 may be disposed at a center of the at least one or more grooves 406. For example, the at least one or more coupling parts 404 may be disposed at the center of the at least one or more grooves 406.

Figure 7:
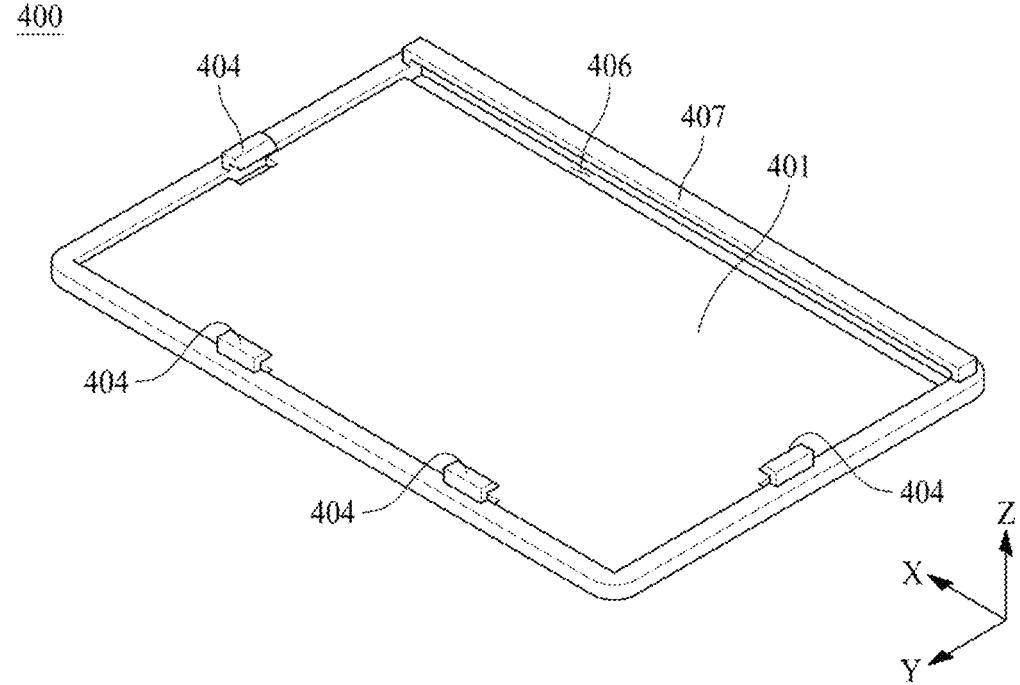
FIG. 7 illustrates a connector according to another embodiment of the present disclosure.

FIG. 7 illustrates a connector according to another embodiment of the present disclosure. FIG. 7 is a front perspective view illustrates the connector according to another embodiment of the present disclosure.

With reference to FIG. 7, a connector 400 according to another embodiment of the present disclosure may include an accommodating part 407 and one or more grooves 406, which are provided at a long side of the connector 400.

At least one or more coupling parts 404 may be provided at a long side facing the one or more grooves 406 and the accommodating part 407 provided at the long side of the connector 400. For example, the at least one or more coupling parts 404 may be disposed along the short side of the connector 400. For example, the at least one or more coupling parts 404 may be disposed along the long side and the short side of the connector 400. The accommodating part 407, a first surface 401, the at least one or more grooves 406, and the at least one or more coupling parts 404 may be substantially the same as or similar to the above descriptions of FIGS. 4 to 6, and thus, repeated descriptions thereof may be omitted or may be briefly discussed. Also, a description of a rear surface of the connector 400 described above with reference to FIG. 6 may be identically or similarly applied to FIG. 7.

Figure 8:
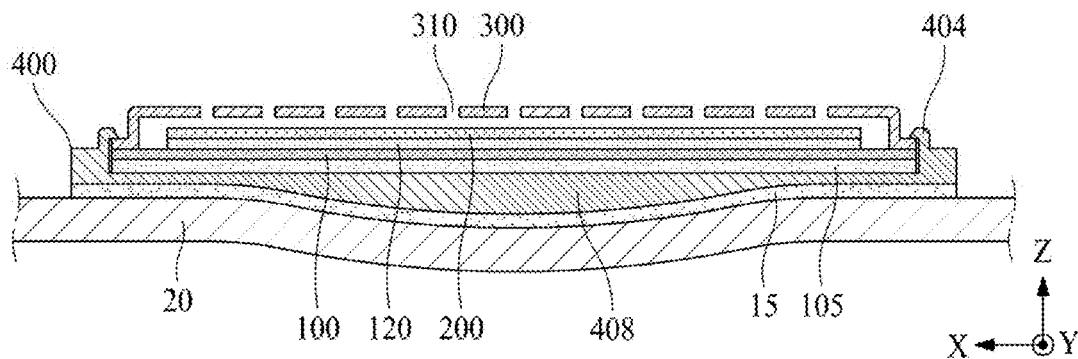
FIG. 8 illustrates an apparatus according to another embodiment of the present disclosure.

FIG. 8 illustrates an apparatus according to another embodiment of the present disclosure.

With reference to FIG. 8, an apparatus according to another embodiment of the present disclosure may include a vibration member 20, a vibrator 1, and a connector 400. A description thereof may be substantially the same as or similar to the above descriptions of FIGS. 1 to 7, and thus, like reference numerals refer to like elements and the repetitive description thereof may be omitted or will be briefly given below.

The vibration member 20 according to an embodiment of the present disclosure may include at least one or more curved portions. For example, the vibration member 20 may include at least one or more flat portions and at least one or more curved portions. The at least one or more curved portions may be disposed adjacent to the at least one or more flat portions, but embodiments of the present disclosure are not limited thereto. Therefore, the connector 400 may be configured along a shape of the at least one or more curved portions of the vibration member 20. For example, the connector 400 may be disposed or configured to correspond to a shape of the at least one or more curved portions of the vibration member 20. For example, the connector 400 may have at least one or more curved portions 408 corresponding to a shape of the at least one or more curved portions of the vibration member 20. In other words, the connector 400 may be configured to fully attached to the vibration member 20, and may be configured to planarize or flatten the at least one or more curved portions of the vibration member 20, such that the vibration device 200 may be easily attached to the vibration member 20 and the vibration device 200 disposed thereon can be protected from being bent or curved. The at least one or more curved portions 408 may disposed at the first surface 401 of the connector 400 and may have a concave shape, but embodiments of the present disclosure are not limited thereto. For example, the at least one or more curved portions 408 may have a concave shape toward the vibration member 20, but embodiments of the present disclosure are not limited thereto. For example, when the vibration member 20 is an exterior material and/or an interior material of a vehicle, the exterior material and/or the interior material of the vehicle may include at least one or more curved portions. The connector 400 including the at least one or more curved portions 408 may be connected or disposed along a shape of the vibration member 20 or the exterior material and/or the interior material of the vehicle, and thus, the vibrator 1 may be easily connected to or attached on the exterior material and/or the interior material of the vehicle or the vibration member 20 including the at least one or more curved portions by the connector 400 without decreasing the attaching force or the adhesive force of the vibrator 1.

According to an embodiment of the present disclosure, the connector 400 including the at least one or more curved portions 408 may be implemented based on a shape of the exterior material and/or the interior material of the vehicle, and the connector 400 may be attached on the exterior material and/or the interior material of the vehicle by using a connection member, thereby providing an integrated vibration apparatus. The integrated vibration apparatus may be attached on the first surface 401 of the connector 400, and thus, a process of attaching the vibration apparatus on the vibration member 20 may be simplified. An attachment position of the vibrator 1 may be guided by the connector 400, and thus, a deviation of a sound characteristic of the vibrator 1 may be reduced or minimized. According to an embodiment of the present disclosure, because the connector 400 includes the at least one or more coupling parts 404, the vibrator 1 may be coupled or fixed to the connector 400 without lifting (or partial detachment).

Figure 9:
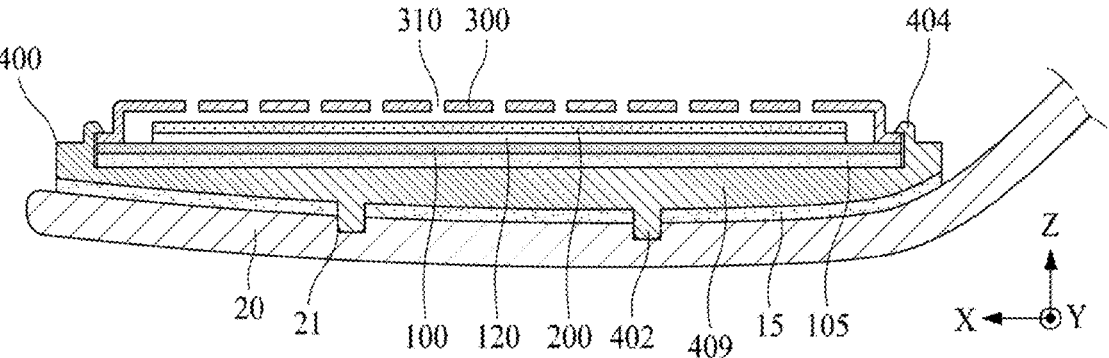
FIG. 9 illustrates an apparatus according to another embodiment of the present disclosure.

FIG. 9 illustrates an apparatus according to another embodiment of the present disclosure.

With reference to FIG. 9, an apparatus according to another embodiment of the present disclosure may include a vibration member 20, a vibrator 1, and a connector 400. A description thereof may be substantially the same as or similar to the above descriptions of FIGS. 1 to 7, and thus, like reference numerals refer to like elements and the repetitive description thereof may be omitted or will be briefly given below.

The vibration member 20 according to an embodiment of the present disclosure may include at least one or more curved portions 409. Therefore, the connector 400 may be configured along a shape of the at least one or more curved portions 409 of the vibration member 20. For example, the connector 400 may be configured to correspond to a shape of the at least one or more curved portions of the vibration member 20. For example, the connector 400 may have at least one or more curved portions 409 corresponding to a shape of the at least one or more curved portions of the vibration member 20. The at least one or more curved portions 409 may have a streamline shape or a boat shape, but embodiments of the present disclosure are not limited thereto. For example, when the vibration member 20 is an exterior material and/or an interior material of a vehicle, the exterior material and/or the interior material of the vehicle may include at least one or more curved portions 409. The connector 400 including the at least one or more curved portions 409 may be connected or disposed along a shape of the vibration member 20 or the exterior material and/or the interior material of the vehicle, and thus, the vibrator 1 may be easily connected to or attached on the exterior material and/or the interior material of the vehicle or the vibration member 20 including the at least one or more curved portions 409 by the connector 400.

The connector 400 according to an embodiment of the present disclosure may include at least one or more protrusion portions 402. For example, the at least one or more protrusion portions 402 may be included in the at least one or more curved portions 409. The vibration member 20 may include at least one or more grooves 21. The at least one or more grooves 21 may be a protrusion portion, but embodiments of the present disclosure are not limited thereto. For example, the at least one or more protrusion portions 402 may be a first protrusion portion, and the at least one or more grooves 21 may be a second protrusion portion, and the first protrusion portion and the second protrusion portion may be alternatively arranged, but embodiments of the present disclosure are not limited thereto. The at least one or more protrusion portions 402 may correspond to the at least one or more grooves 21 and/or overlap the at least one or more grooves 21. Accordingly, the connector 400 including the vibrator 1 may be coupled or fixed to the vibration member 20 without lifting (or partial detachment). The at least one or more protrusion portions 402 of the connector 400 and the one or more grooves 21 of the vibration member 20 may be identically or similarly applied to FIG. 8.

According to an embodiment of the present disclosure, the connector 400 including the at least one or more curved portions 408 or 409 may be implemented based on a shape of the exterior material and/or the interior material of the vehicle, and the connector 400 may be attached on the exterior material and/or the interior material of the vehicle by using a connection member, thereby providing an integrated vibration apparatus. The integrated vibration apparatus may be attached on the first surface 401 of the connector 400, and thus, a process of attaching the vibration apparatus on the vibration member 20 may be simplified. An attachment position of the vibrator 1 may be guided by the connector 400, and thus, a deviation of a sound characteristic of the vibrator 1 may be reduced or minimized. According to an embodiment of the present disclosure, because the connector 400 includes at least one or more protrusion portions 402 and/or the at least one or more coupling parts 404, the vibrator 1 may be coupled or fixed to the connector 400 without lifting (or partial detachment). According to an embodiment of the present disclosure, because the connector 400 includes the one or more protrusion portions 402 and the vibration member 20 includes the one or more grooves 21, the connector 400 including the vibrator 1 may be coupled or fixed to the vibration member 20 without lifting (or partial detachment).

Figure 10A:
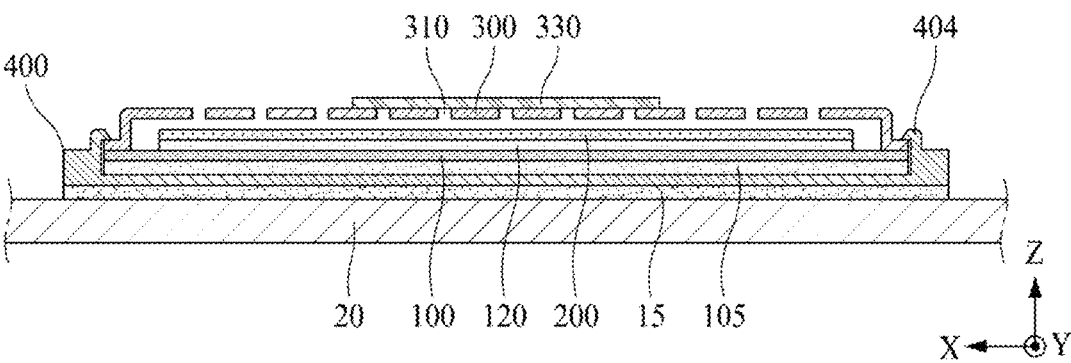
FIG. 10A illustrates an apparatus according to another embodiment of the present disclosure.
Figure 10B:
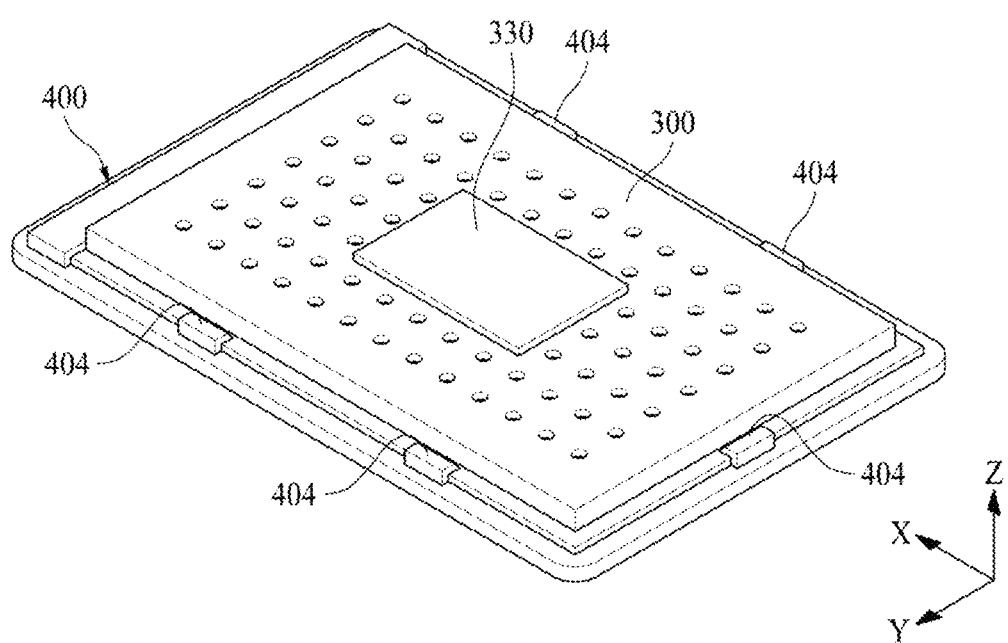
FIG. 10B illustrates an apparatus according to another embodiment of the present disclosure.

FIG. 10A illustrates an apparatus according to another embodiment of the present disclosure. FIG. 10B illustrates an apparatus according to another embodiment of the present disclosure.

With reference to FIGS. 10A and 10B, an apparatus according to another embodiment of the present disclosure may include a vibration member 20, a vibrator 1, and a connector 400. A description thereof may be substantially the same as or similar to the above descriptions of FIGS. 1 to 9, and thus, like reference numerals refer to like elements and the repetitive description thereof may be omitted or will be briefly given below.

With reference to FIGS. 10A and 10B, an apparatus according to another embodiment of the present disclosure may further include a second protection part 330.

The second protection part 330 may include one or more of a metal material and a nonmetal material (or a composite nonmetal material). For example, the second protection part 330 may include one or more materials of a metal material, plastic, and wood, but embodiments of the present disclosure are not limited thereto. For example, the second protection part 330 may be a protection part, a protection member, a cover, or a hole cover, but embodiments of the present disclosure are not limited thereto.

The second protection part 330 according to an embodiment of the present disclosure may be disposed or arranged at a first protection part 300. The second protection part 330 may cover the first protection part 300. For example, the second protection part 330 may cover a portion of the first protection part 300. The second protection part 330 may cover at least one or more holes 310. For example, the second protection part 330 may cover a portion of the at least one or more holes 310 of the first protection part 300. For example, a size of the second protection part 330 may be smaller than or equal to that of the first protection part 300, but embodiments of the present disclosure are not limited thereto. For example, the second protection part 330 may be disposed at a center of the first protection part 300, but embodiments of the present disclosure are not limited thereto. The second protection part 330 may protect the vibration device 200 from particles flowing into the at least one or more holes 310 from the outside.

Figure 11:
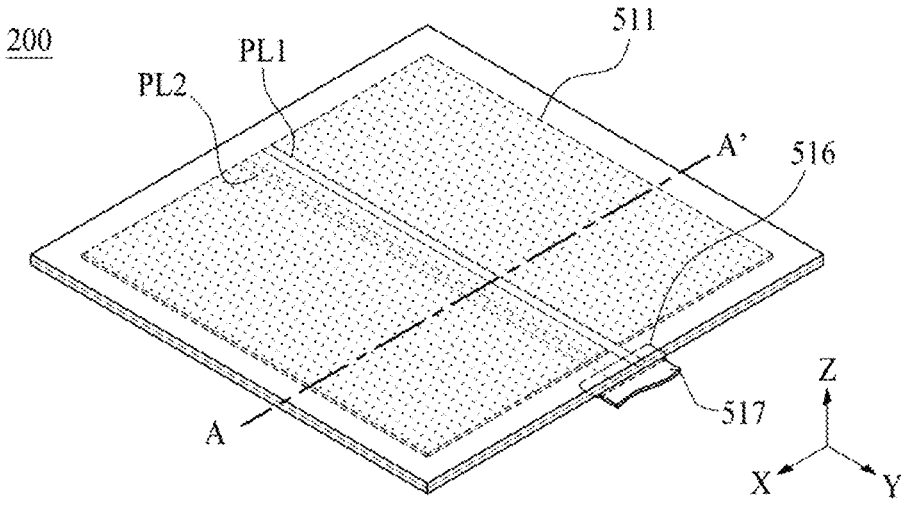
FIG. 11 illustrates a vibration device according to an embodiment of the present disclosure.
Figure 12:
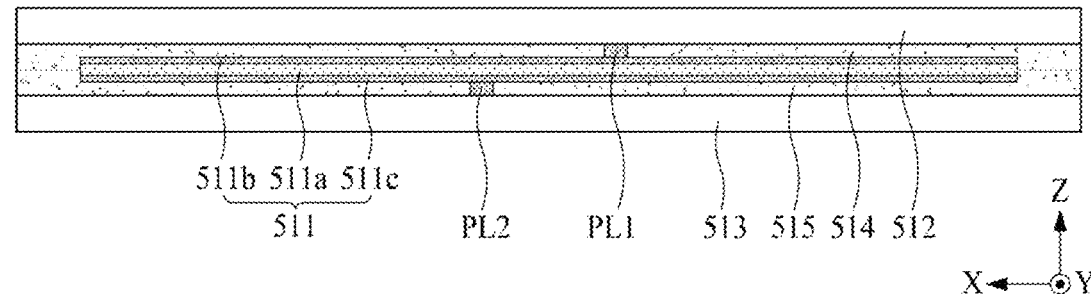
FIG. 12 is a cross-sectional view taken along line A-A' of FIG. 11 according to an embodiment of the present disclosure.
Figure 13:
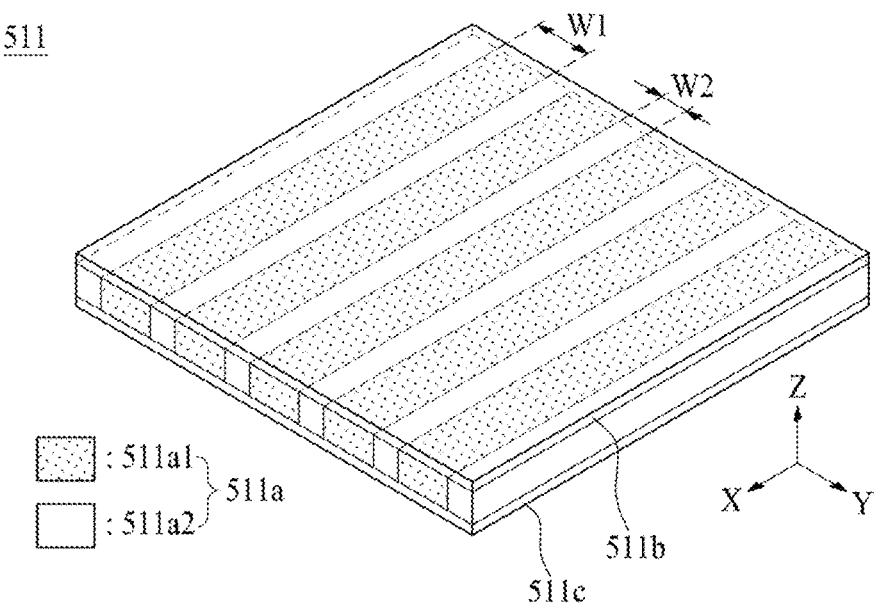
FIG. 13 illustrates a vibration part illustrated in FIG. 12 according to an embodiment of the present disclosure.

FIG. 11 illustrates a vibration device according to an embodiment of the present disclosure. FIG. 12 is a cross-sectional view taken along line A-A' of FIG. 11 according to an embodiment of the present disclosure. FIG. 13 illustrates a vibration part illustrated in FIG. 12 according to an embodiment of the present disclosure.

With reference to FIGS. 11 to 13, a vibration device 200 according to an embodiment of the present disclosure may be referred to as an active vibration member, a vibration apparatus, a flexible vibration apparatus, a flexible vibration structure, a flexible vibrator, a flexible vibration generating device, a flexible vibration generator, a flexible sounder, a flexible sound device, a flexible sound generating device, a flexible sound generator, a flexible actuator, a flexible speaker, a flexible piezoelectric speaker, a film actuator, a film-type piezoelectric composite actuator, a film speaker, a film-type piezoelectric speaker, or a film-type piezoelectric composite speaker, or the like, but embodiments of the present disclosure are not limited thereto.

The vibration device 200 according to an embodiment of the present disclosure may include a vibration part 511. The vibration part 511 may include a vibration layer 511a, a first electrode layer 511b, and a second electrode layer 511c.

The vibration part 511 according to an embodiment of the present disclosure may include a piezoelectric-type vibration part. The vibration layer 511a may include a piezoelectric material (or an electroactive material) which includes a piezoelectric effect. For example, the piezoelectric material may have a characteristic in which, when pressure or twisting phenomenon is applied to a crystalline structure by an external force, a potential difference occurs due to dielectric polarization caused by a relative position change of a positive (+) ion and a negative (−) ion, and a vibration is generated by an electric field based on a reverse voltage applied thereto. The vibration layer 511a may be referred to as a piezoelectric layer, a piezoelectric material layer, an electroactive layer, a piezoelectric material portion, an electroactive portion, a piezoelectric structure, a piezoelectric composite layer, a piezoelectric composite, or a piezoelectric ceramic composite, or the like, but embodiments of the present disclosure are not limited thereto. The vibration layer 511a may be formed of a transparent, semitransparent, or opaque piezoelectric material, and thus, may be transparent, semitransparent, or opaque.

With reference to FIG. 13, the vibration layer 511a according to an embodiment of the present disclosure may include a plurality of inorganic material portions and an organic material portion between the plurality of inorganic material portions. For example, each of the plurality of inorganic material portions may have a piezoelectric characteristic. For example, each of the plurality of inorganic material portions may be a first portion 511a, and the organic material portion may be a second portion 511a2. For example, the vibration layer 511a may include a plurality of first portions 511a1 and a plurality of second portions 511a2. For example, the plurality of first portions 511a1 and the plurality of second portions 511a2 may be alternately and repeatedly disposed along a second direction Y (or a first direction X). For example, the first direction X may be a widthwise direction of the vibration layer 511a, the second direction Y may be a lengthwise direction of the vibration layer 511a crossing the first direction (X), but embodiments of the present disclosure are not limited thereto, the first direction X may be the lengthwise direction of the vibration layer 511a, and the second direction Y may be the widthwise direction of the vibration layer 511a.

Each of the plurality of first portions 511a1 may be configured as an inorganic material portion. The inorganic material portion may include a piezoelectric material, a composite piezoelectric material, or an electroactive material which includes a piezoelectric effect, but embodiments of the present disclosure are not limited thereto.

Each of the plurality of first portions 511a1 may be configured as a ceramic-based material for generating a relatively high vibration, or may be configured as a piezoelectric ceramic having a perovskite crystalline structure. The perovskite crystalline structure may have a piezoelectric effect and/or an inverse piezoelectric effect, and may be a structure (e.g., a plate-shaped or a film-shaped structure) having orientation. The perovskite crystalline structure may be represented by a chemical formula "$ABO_3$." In the chemical formula, "A" may include a divalent metal element, and "B" may include a tetravalent metal element. As an embodiment of the present disclosure, in the chemical formula "$ABO_3$," "A" and "B" may be cations, and "O" may be anions. For example, each of the plurality of first portions 511a1 may include at least one or more of lead (II) titanate ($PbTiO_3$), lead zirconate ($PbZrO_3$), lead zirconate titanate ($PbZrTiO_3$), barium titanate ($BaTiO_3$), and strontium titanate ($SrTiO_3$), but embodiments of the present disclosure are not limited thereto.

When the perovskite crystalline structure includes a center ion (for example, $PbTiO_3$), a position of a titanium (Ti) ion may be changed by an external stress or a magnetic field. Thus, polarization may be changed, thereby generating a piezoelectric effect. For example, in the perovskite crystalline structure, a cubic shape corresponding to a symmetric structure may be changed to a tetragonal (e.g., quadrilateral), orthorhombic, or rhombohedral structure corresponding to an unsymmetric structure, and thus, a piezoelectric effect may be generated. In a tetragonal (e.g., quadrilateral), orthorhombic, or rhombohedral structure corresponding to an unsymmetric structure, polarization may be high in a morphotropic phase boundary, and realignment of polarization may be easy, whereby the perovskite crystalline structure may have a high piezoelectric characteristic.

The vibration layer 511a or first portions 511a1 according to an embodiment of the present disclosure may include one or more of lead (Pb), zirconium (Zr), titanium (Ti), zinc (Zn), nickel (Ni), and niobium (Nb), but embodiments of the present disclosure are not limited thereto.

The vibration layer 511a or first portions 511a1 according to another embodiment of the present disclosure may include a lead zirconate titanate (PZT)-based material, including lead (Pb), zirconium (Zr), and titanium (Ti), or may include a lead zirconate nickel niobate (PZNN)-based material, including lead (Pb), zirconium (Zr), nickel (Ni), and niobium (Nb), but embodiments of the present disclosure are not limited thereto. Also, the vibration layer 511a or first portions 511a1 may include at least one or more of calcium titanate ($CaTiO_3$), $BaTiO_3$, and $SrTiO_3$, each without lead (Pb), but embodiments of the present disclosure are not limited thereto.

Each of the plurality of first portions 511a1 according to an embodiment of the present disclosure may be disposed between the plurality of second portions 511a2 and may have a first width W1 parallel to the second direction Y (or the first direction X) and a length parallel to the first direction X (or the second direction Y). Each of the plurality of second portions 511a2 may have a second width W2 parallel to the second direction Y (or the first direction X) and may have a length parallel to the first direction X (or the second direction Y). The first width W1 may be the same as or different from the second width W2. For example, the first width W1 may be greater than that of the second width W2. For example, the first portion 511a1 and the second portion 511a2 may include a line shape or a stripe shape which has the same size or different sizes. Therefore, the vibration layer 511a may include a 2-2 composite structure having a piezoelectric characteristic of a 2-2 vibration mode, and thus, may have a resonance frequency of 20 kHz or less, but embodiments of the present disclosure are not limited thereto. For example, a resonance frequency of the vibration layer 511a may vary based on at least one or more of a shape, a length, and a thickness, or the like of first portions 511a1.

In the vibration layer 511a, each of the plurality of first portions 511a1 and the plurality of second portions 511a2 may be disposed (or arranged) at a same plane (or a same layer) in parallel. Each of the plurality of second portions 511a2 may be configured to fill a gap between two adjacent first portions of the plurality of first portions 511a1, and thus, may be connected to or attached on the first portion 511a1 adjacent thereto. Therefore, the vibration layer 511a may extend by a desired size or length based on a lateral coupling (or a lateral connection) of the first portion 511a1 and the second portion 511a2.

In the vibration layer 511a, a width W2 of each of the plurality of second portions 511a2 may progressively decrease in a direction from a center portion to both peripheries (or both ends) of the vibration layer 511a or the vibration device 200.

According to an embodiment of the present disclosure, a second portion 511a2, having a largest width W2 of the plurality of second portions 511a2, may be located at a portion at which a highest stress may concentrate when the vibration layer 511a or the vibration device 200 is vibrating in a vertical direction Z (or a thickness direction). A second portion 511a2, having a smallest width W2 of the plurality of second portions 511a2, may be located at a portion where a relatively low stress may occur when the vibration layer 511a or the vibration device 200 is vibrating in the vertical direction Z. For example, the second portion 511a2, having the largest width W2 of the plurality of second portions 511a2, may be disposed at the center portion of the vibration layer 511a, and the second portion 511a2, having the smallest width W2 of the plurality of second portions 511a2 may be disposed at each of the both peripheries of the vibration layer 511a. Therefore, when the vibration layer 511a or the vibration device 200 is vibrating in the vertical direction Z, interference of a sound wave or overlapping of a resonance frequency, each occurring in the portion on which the highest stress concentrates, may be reduced or minimized. Thus, dip phenomenon of a sound pressure level occurring in the low-pitched sound band may be reduced, thereby improving flatness of a sound characteristic in the low-pitched sound band. For example, flatness of a sound characteristic may be a level of a deviation between a highest sound pressure level and a lowest sound pressure level.

In the vibration layer 511a, each of the plurality of first portions 511a1 may have different sizes (or widths). For example, a size (or a width) of each of the plurality of first portions 511a1 may progressively decrease or increase in a direction from the center portion to the both peripheries (or both ends) of the vibration layer 511a or the vibration device 200. For example, in the vibration layer 511a, a sound pressure level characteristic of a sound may be enhanced and a sound reproduction band may increase, based on various natural vibration frequencies according to a vibration of each of the plurality of first portions 511a1 having different sizes.

The plurality of second portions 511a2 may be disposed between the plurality of first portions 511a1. Therefore, in the vibration layer 511a or the vibration device 200, vibration energy by a link in a unit lattice of each first portion 511a1 may increase by a corresponding second portion 511a2, and thus, a vibration characteristic may increase, and a piezoelectric characteristic and flexibility may be secured. For example, the second portion 511a2 may include one or more of an epoxy-based polymer, an acrylic-based polymer, and a silicone-based polymer, but embodiments of the present disclosure are not limited thereto.

The plurality of second portions 511a2 according to an embodiment of the present disclosure may be configured as an organic material portion. For example, the organic material portion may be disposed between the inorganic material portions, and thus, may absorb an impact applied to the inorganic material portion (or the first portion), may release a stress concentrating on the inorganic material portion to enhance the total durability of the vibration layer 511 a or the vibration device 200, and may provide flexibility to the vibration layer 511a or the vibration device 200. For example, the vibration device 200 may be configured to be bent in a non-planar shape including a curved surface. Thus, the vibration device 200 may have flexibility, and thus, may be bent in a shape which matches a shape of a curved portion of a supporting member. For example, the vibration device 200 may have flexibility, and thus, may be disposed in a shape corresponding to a shape of the curved portion of the connector 400 or the vibration member 20.

The plurality of second portions 511a2 according to an embodiment of the present disclosure may have modulus (or Young's modulus) and viscoelasticity that are lower than that of the first portion 511a1, and thus, the second portion 511a2 may enhance the reliability of each first portion 511a1 vulnerable to an impact due to a fragile characteristic. For example, the second portion 511a2 may be configured as a material having a loss coefficient of about 0.01 to about 1 and modulus of about 0.1 GPa (Giga Pascal) to about 10 GPa (Giga Pascal).

The organic material portion configured at the second portion 511a2 may include an organic material, an organic polymer, an organic piezoelectric material, or an organic non-piezoelectric material that has a flexible characteristic in comparison with the inorganic material portion of the first portions 511a1. For example, the second portion 511a2 may be referred to as an adhesive portion, an elastic portion, a bending portion, a damping portion, or a flexible portion, or the like having flexibility, but embodiments of the present disclosure are not limited thereto.

The plurality of first portions 511a1 and the second portion 511a2 may be disposed on (or connected to) a same plane, and thus, the vibration layer 511a according to an embodiment of the present disclosure may have a single thin film type. For example, the vibration layer 511a may have a structure in which a plurality of first portions 511a1 are connected to one side (or one lateral). For example, the plurality of first portions 511a1 may have a connection structure throughout the vibration layer 511a. For example, the vibration layer 511a may be vibrated in a vertical direction by the first portion 511a1 having a vibration characteristic and may be bent in a curved shape by the second portion 511a2 having flexibility. In addition, in the vibration layer 511a according to an embodiment of the present disclosure, a size of the first portion 511a1 and a size of the second portion 511a2 may be adjusted based on a piezoelectric characteristic and flexibility needed for the vibration layer 511a or the vibration device 200. As an embodiment of the present disclosure, when the vibration layer 511a needs a piezoelectric characteristic rather than flexibility, a size of the first portion 511a1 may be configured to be greater than that of the second portion 511a2. As another embodiment of the present disclosure, when the vibration layer 511a needs flexibility rather than a piezoelectric characteristic, a size of the second portion 511a2 may be configured to be greater than that of the first portion 511a1. Accordingly, a size of the vibration layer 511a may be adjusted based on a characteristic needed therefor, and thus, the vibration layer 511 a may be easy to design.

The first electrode layer 151b may be disposed at a first surface (or an upper surface) of the vibration layer 511a. The first electrode layer 511b may be disposed at or coupled (or connected) to a first surface of each of the plurality of first portions 511a1 and a first surface of each of the plurality of second portions 511a2 in common and may be electrically connected to the first surface of each of the plurality of first portions 511a1. For example, the first electrode layer 511b may have a single-body electrode (or one electrode) shape which is disposed at the entire first surface of the vibration layer 511a. For example, the first electrode layer 511b may have substantially the same shape as that of the vibration layer 511a, but embodiments of the present disclosure are not limited thereto.

The second electrode layer 511c may be disposed at a second surface (or a rear surface) different from (or opposite to) the first surface of the vibration layer 511a. The second electrode layer 511c may be disposed at or coupled to a second surface of each of the plurality of first portions 511a1 and a second surface of each of the plurality of second portions 511a2 in common and may be electrically connected to the second surface of each of the plurality of first portions 511a1. For example, the second electrode layer 511c may have a single-body electrode (or one electrode) shape which is disposed at the entire second surface of the vibration layer 511a. For example, the second electrode layer 511c may have the same shape as the vibration layer 511a, but embodiments of the present disclosure are not limited thereto. However, embodiments of the present disclosure is not limited thereto. For example, one or both of the first electrode layer 511b and the second electrode layer 511c may be formed of a pattern-shaped electrode such that it is disposed to correspond to each of the plurality of first portions 511a1 only.

One or more of the first electrode layer 511b and the second electrode layer 511c according to an embodiment of the present disclosure may be formed of a transparent conductive material, a semitransparent conductive material, or an opaque conductive material. For example, the transparent conductive material or the semitransparent conductive material may include indium tin oxide (ITO) or indium zinc oxide (IZO), but embodiments of the present disclosure are not limited thereto. The opaque conductive material may include aluminum (Al), copper (Cu), gold (Au), silver (Ag), molybdenum (Mo), or a magnesium (Mg), or the like, or an alloy thereof, but embodiments of the present disclosure are not limited thereto.

The vibration layer 511a may be polarized (or poling) by a certain voltage applied to the first electrode layer 511b and the second electrode layer 511c in a certain temperature atmosphere, or a temperature atmosphere that may be changed from a high temperature to a room temperature, but embodiments of the present disclosure are not limited thereto. For example, the vibration layer 511*a* may alternately and repeatedly contract and/or expand based on an inverse piezoelectric effect according to a sound signal (or a voice signal or a driving signal) applied to the first electrode layer 511*b* and the second electrode layer 511*c* from the outside to vibrate. For example, the vibration layer 511*a* may vibrate based on a vibration of a vertical direction and a vibration of a planar direction by the sound signal applied to the first electrode layer 151*b* and the second electrode layer 511*c*. The vibration layer 511*a* may increase the displacement of a vibration member by contraction and/or expansion of the planar direction, thereby further improving the vibration of the vibration member.

The vibration device 200 according to an embodiment of the present disclosure may further include a first cover member 512 and a second cover member 513.

The first cover member 512 may be disposed at a first surface of the vibration part 511. For example, the first cover member 512 may be configured to cover the first electrode layer 151*b*. Accordingly, the first cover member 512 may protect the first electrode layer 511*b*.

The second cover member 513 may be disposed at a second surface of the vibration part 511. For example, the second cover member 513 may be configured to cover the second electrode layer 511*c*. Accordingly, the second cover member 513 may protect the second electrode layer 511*c*.

Each of the first cover member 512 and the second cover member 513 according to an embodiment of the present disclosure may include one or more material of plastic, fiber, cloth, paper, leather, rubber, carbon, and wood, but embodiments of the present disclosure are not limited thereto. For example, each of the first cover member 512 and the second cover member 513 may include the same material or different material. For example, each of the first cover member 512 and the second cover member 513 may be a polyimide (PI) film or a polyethylene terephthalate (PET) film, but embodiments of the present disclosure are not limited thereto.

The first cover member 512 according to an embodiment of the present disclosure may be connected or coupled to the first electrode layer 151*b* by a first adhesive layer 514. For example, the first cover member 512 may be connected or coupled to the first electrode layer 151*b* by a film laminating process by the first adhesive layer 514.

The second cover member 513 according to an embodiment of the present disclosure may be connected or coupled to the second electrode layer 511*c* by a second adhesive layer 515. For example, the second cover member 513 may be connected or coupled to the second electrode layer 511*c* by a film laminating process by the second adhesive layer 515. For example, the vibration device 200 may be implemented as one film by the first cover member 512 and the second cover member 513.

The first adhesive layer 514 may be disposed between the first electrode layer 511*b* and the first cover member 512. The second adhesive layer 515 may be disposed between the second electrode layer 511*c* and the second cover member 513. For example, the first adhesive layer 514 and second adhesive layer 515 may be configured between the first cover member 512 and the second cover member 513 to surround the vibration layer 511*a*, the first electrode layer 511*b*, and the second electrode layer 511*c*. For example, the first adhesive layer 514 and second adhesive layer 515 may be configured between the first cover member 512 and the second cover member 513 to at least partially or completely surround the vibration layer 511*a*, the first electrode layer 511*b*, and the second electrode layer 511*c*. For example, the vibration layer 511*a*, the first electrode layer 511*b*, and the second electrode layer 511*c* may be embedded or built-in between the first adhesive layer 514 and the second adhesive layer 515.

Each of the first adhesive layer 514 and second adhesive layer 515 according to an embodiment of the present disclosure may include an electrically insulating material which has adhesiveness and is capable of compression and decompression. For example, each of the first adhesive layer 514 and the second adhesive layer 515 may include an epoxy resin, an acrylic resin, a silicone resin, or a urethane resin, but embodiments of the present disclosure are not limited thereto.

The vibration device 200 according to an embodiment of the present disclosure may further include a first power supply line PL1 disposed at the first cover member 512, a second power supply line PL2 disposed at the second cover member 513, and a pad part 516 electrically connected to the first power supply line PL1 and the second power supply line PL2.

The first power supply line PL1 may be disposed between the first electrode layer 151*b* and the first cover member 512 and may be electrically connected to the first electrode layer 151*b*. The first power supply line PL1 may be extended long along the second direction Y (or the first direction X) and may be electrically connected to a central portion of the first electrode layer 511*b*, but embodiments of the present disclosure are not limited thereto. As an embodiment of the present disclosure, the first power supply line PL1 may be electrically connected to the first electrode layer 151*b* by an anisotropic conductive film. As another embodiment of the present disclosure, the first power supply line PL1 may be electrically connected to the first electrode layer 511*b* through a conductive material (or particle) included in the first adhesive layer 514.

The second power supply line PL2 may be disposed between the second electrode layer 511*c* and the second cover member 513 and may be electrically connected to the second electrode layer 511*c*. The second power supply line PL2 may be extended long along the second direction Y (or the first direction X) and may be electrically connected to a central portion of the second electrode layer 511*c*, but embodiments of the present disclosure are not limited thereto. As an embodiment of the present disclosure, the second power supply line PL2 may be electrically connected to the second electrode layer 511*c* by an anisotropic conductive film. As another embodiment of the present disclosure, the second power supply line PL2 may be electrically connected to the second electrode layer 511*c* through a conductive material (or particle) included in the second adhesive layer 515.

According to an embodiment of the present disclosure, the first power supply line PL1 may be disposed not to overlap the second power supply line PL2. When the first power supply line PL1 is disposed not to overlap the second power supply line PL2, a short circuit between the first power supply line PL1 and the second power supply line PL2 may be prevented or reduced.

The pad part 516 may be configured at one periphery portion of any one of the first cover member 512 and the second cover member 513 to be electrically connected to one portion (or one end) of each of the first power supply line PL1 and the second power supply line PL2.

The pad part 516 according to an embodiment of the present disclosure may include a first pad electrode electrically connected to one end of the first power supply line PL1, and a second pad electrode electrically connected to one end of the second power supply line PL2.

The first pad electrode may be disposed at one periphery portion of any one of the first cover member 512 and the second cover member 513 to be electrically connected to one portion of the first power supply line PL1. For example, the first pad electrode may pass through any one of the first cover member 512 and the second cover member 513 to be electrically connected to one portion of the first power supply line PL1.

The second pad electrode may be disposed in parallel with the first pad electrode to be electrically connected to one portion of the second power supply line PL2. For example, the second pad electrode may pass through any one of the first cover member 512 and the second cover member 513 to be electrically connected to one portion of the second power supply line PL2. The first power supply line PL1 and the second power supply line PL2 according to an embodiment of the present disclosure may be led out through at least one or more grooves 406 of the connector 400 described with reference to FIGS. 4 to 7.

According to an embodiment of the present disclosure, each of the first power supply line PL1, the second power supply line PL2, and the pad part 516 may be configured to be transparent, translucent, or opaque.

The pad part 516 according to an embodiment of the present disclosure may be electrically connected to a signal cable 517.

The signal cable 517 may be electrically connected to the pad part 516 disposed at the vibration device 200 and may supply the vibration device 200 with a vibration driving signal (or a sound signal or a voice signal) provided from a sound processing circuit. The signal cable 517 according to an embodiment of the present disclosure may include a first terminal electrically connected to the first pad electrode of the pad part 516 and a second terminal electrically connected to the second pad electrode of the pad part 516. For example, the signal cable 517 may be a flexible printed circuit cable, a flexible flat cable, a single-sided flexible printed circuit, a single-sided flexible printed circuit board, a flexible multilayer printed circuit, or a flexible multilayer printed circuit board, but embodiments of the present disclosure are not limited thereto.

The sound processing circuit may generate an alternating current (AC) vibration driving signal including a first vibration driving signal and a second vibration driving signal based on a sound data provided from an external sound data generating circuit part. The first vibration driving signal may be any one of a positive (+) vibration driving signal and a negative (−) vibration driving signal, and the second vibration driving signal may be any one of a positive (+) vibration driving signal and a negative (−) vibration driving signal. For example, the first vibration driving signal may be supplied to the first electrode layer 151b through the first terminal of the signal cable 517, the first pad electrode of the pad part 516, and the first power supply line PL1. The second vibration driving signal may be supplied to the second electrode layer 511c through the second terminal of the signal cable 517, the second pad electrode of the pad part 516, and the second power supply line PL2.

According to an embodiment of the present disclosure, the signal cable 517 may be configured to be transparent, semitransparent, or opaque.

The signal cable 517 according to an embodiment of the present disclosure may be led out through at least one or more grooves 406 of the connector 400 described with reference to FIGS. 4 to 7.

The vibration device 200 according to an embodiment of the present disclosure may be implemented as a thin film type, where the first portion 511a1 having a piezoelectric characteristic and a second portion 511a2 having flexibility are alternately repeated and connected. Accordingly, the vibration device 200 may be bent in a shape corresponding to a shape of the curved portion of the vibration member and/or a shape of the vibration member, and/or a shape of the connector 400. For example, when the vibration device 200 is connected or coupled to the vibration member including various curved portions by the connection member, the vibration device 200 may be bent in a curved shape along a shape of a curved portion of the connector 400 and/or the vibration device 200 and reliability against damage or breakdown may not be reduced despite being bent in the curved shape. In addition, in the vibration device 200 according to an embodiment of the present disclosure, a vibration width (or a displacement width) may be increased due to the flexible second portion 511a2 having flexibility. Thus, a sound characteristic and/or a sound pressure level characteristic generated based on a vibration of the vibration member may be enhanced.

Figure 14:
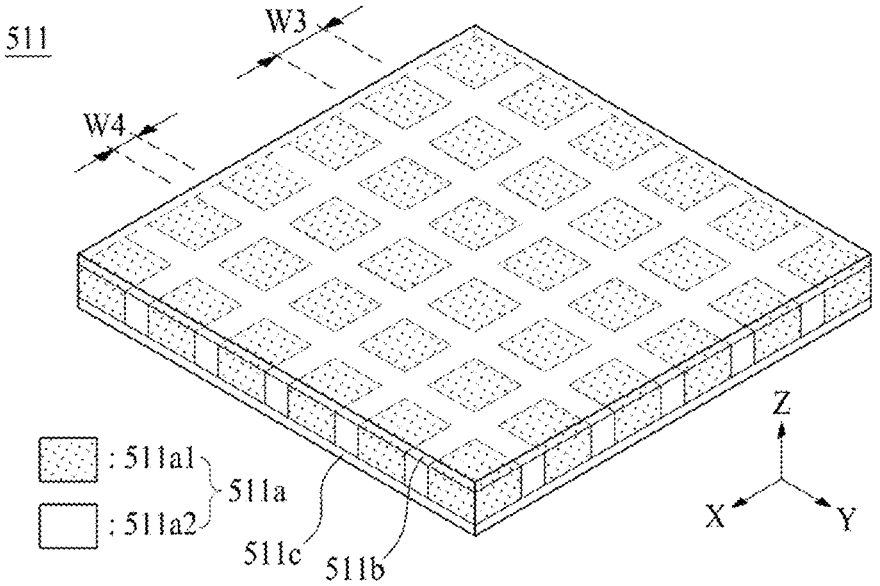
FIG. 14 illustrates a vibration part illustrated in FIG. 13 according to another embodiment of the present disclosure.

FIG. 14 illustrates a vibration part illustrated in FIG. 13 according to another embodiment of the present disclosure.

With reference to FIG. 14, the vibration layer 511a according to another embodiment of the present disclosure may include a plurality of first portions 511a1, which are spaced apart from one another along a first direction X and a second direction Y, and a second portion 511a2 disposed between the plurality of first portions 511a1.

Each of the plurality of first portions 511a1 may be disposed to be spaced apart from one another along the first direction X and the second direction Y. For example, each of the plurality of first portions 511a1 may have a hexahedral shape (or a six-sided object shape) having the same size and may be disposed in a lattice shape. Each of the plurality of first portions 511a1 may include a piezoelectric material which may be substantially the same as or similar to the first portion 511a1 described above with reference to FIGS. 11 to 13, and thus, like reference numeral refer to like element and the repetitive description thereof may be omitted or may be briefly discussed.

The second portion 511a2 may be disposed between the plurality of first portions 511a1 along each of the first direction X and the second direction Y. The second portion 511a2 may be configured to fill a gap between two adjacent first portions 511a1 or to surround each of the plurality of first portions 511a1, and thus, may be connected to or attached on an adjacent first portion 511a1. According to an embodiment of the present disclosure, a width W4 of a second portion 511a2 disposed between two first portions 511a1 adjacent to each other along the first direction X may be the same as or different from that of a width W3 of the first portion 511a1, and the width W4 of a second portion 511a2 disposed between two first portions 511a1 adjacent to each other along the second direction Y may be the same as or different from that of the width W3 of the first portion 511a1. The second portion 511a2 may include an organic material which may be substantially the same as or similar to the second portion 511a2 described above with reference to FIGS. 11 to 13, and thus, like reference numeral refer to like element and the repetitive description thereof may be omitted or may be briefly discussed.

The vibration layer 511a according to another embodiment of the present disclosure may include a 1-3 composite structure having a piezoelectric characteristic of a 1-3 vibration mode, and thus, may have a resonance frequency of 30

MHz or less, but embodiments of the present disclosure are not limited thereto. For example, a resonance frequency of the vibration layer 511a may vary based on at least one or more of a shape, a length, and a thickness, or the like of the first portion 511a1.

Figure 15:
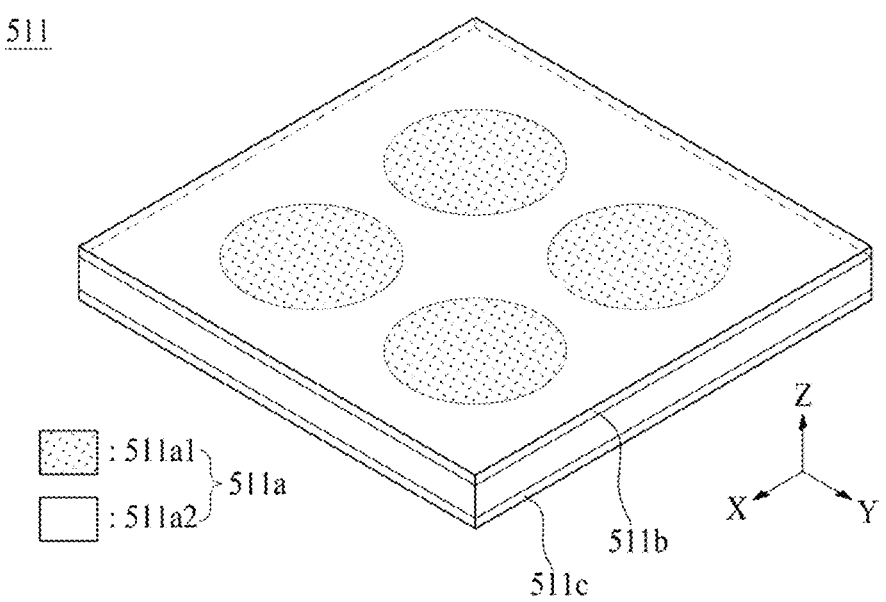
FIG. 15 illustrates a vibration part illustrated in FIG. 13 according to another embodiment of the present disclosure.

FIG. 15 illustrates a vibration part illustrated in FIG. 13 according to another embodiment of the present disclosure.

With reference to FIG. 15, the vibration layer 511a according to another embodiment of the present disclosure may include a plurality of first portions 511a1, which are spaced apart from one another along a first direction X and a second direction Y, and a second portion 511a2 disposed between the plurality of first portions 511a1.

Each of the plurality of first portions 511a1 may have a flat structure of a circular shape or a circular-shaped planar structure. For example, each of the plurality of first portions 511a1 may have a circular plate shape, but embodiments of the present disclosure are not limited thereto. For example, each of the plurality of first portions 511a1 may have a dot shape including an oval shape, a polygonal shape, or a donut shape. Each of the plurality of first portions 511a1 may include a piezoelectric material which may be substantially the same as or similar to the first portion 511a1 described above with reference to FIGS. 11 to 13, and thus, like reference numeral refer to like element and the repetitive description thereof may be omitted or may be briefly discussed.

The second portion 511a2 may be disposed between the plurality of first portions 511a1 along each of the first direction X and the second direction Y. The second portion 511a2 may be configured to be adjacent to or surround each of the plurality of first portions 511a1, and thus, may be connected to or attached on a side surface of each of the plurality of first portions 511a1. Each of the plurality of first portions 511a1 and the second portion 511a2 may be disposed (or arranged) in parallel on the same plane (or the same layer). The second portion 511a2 may include an organic material which may be substantially the same as or similar to the second portion 511a2 described above with reference to FIGS. 11 to 13, and thus, like reference numeral refer to like element and the repetitive description thereof may be omitted or may be briefly discussed.

Figure 16:
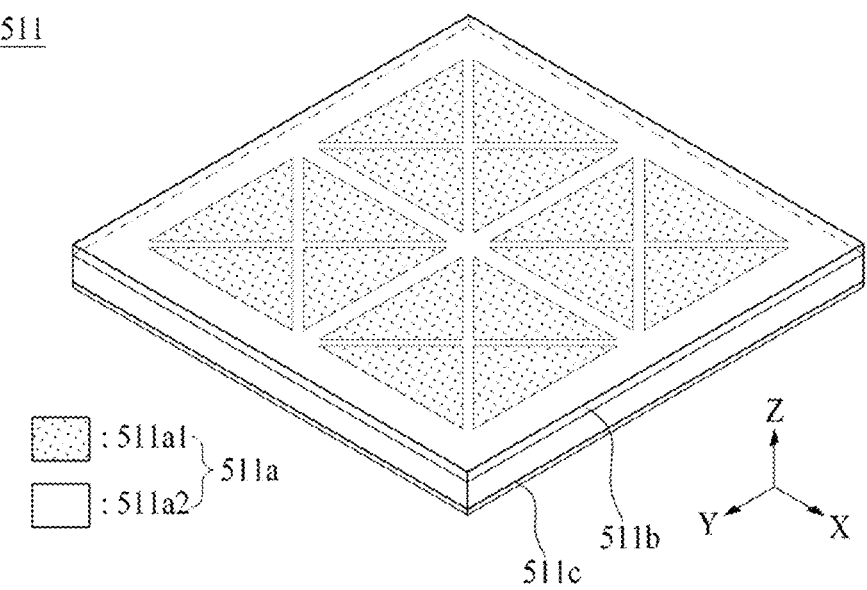
FIG. 16 a vibration part illustrated in FIG. 13 according to another embodiment of the present disclosure.

FIG. 16 illustrates a vibration part illustrated in FIG. 13 according to another embodiment of the present disclosure.

With reference to FIG. 16, the vibration layer 511a according to another embodiment of the present disclosure may include a plurality of first portions 511a1, which are spaced apart from one another along a first direction X and a second direction Y, and a second portion 511a2 disposed between the plurality of first portions 511a1.

Each of the plurality of first portions 511a1 may have a flat structure of a triangular shape or a triangular-shaped planar structure. For example, each of the plurality of first portions 511a1 may have a triangular plate shape, but embodiments of the present disclosure are not limited thereto. Each of the plurality of first portions 511a1 may include a piezoelectric material which may be substantially the same as or similar to the first portion 511a1 described above with reference to FIGS. 11 to 13, and thus, like reference numeral refer to like element and the repetitive description thereof may be omitted or may be briefly discussed.

According to an embodiment of the present disclosure, four adjacent first portions 511a1 of the plurality of first portions 511a1 may be adjacent to one another to form a tetragonal (or quadrilateral shape or a square shape). Vertices of the four adjacent first portions 511a1 forming a tetragonal shape may be adjacent to one another at a center portion (or a central portion) of the tetragonal shape.

The second portion 511a2 may be disposed between the plurality of first portions 511a1 along each of the first direction X and the second direction Y. The second portion 511a2 may be configured to be adjacent to or surround each of the plurality of first portions 511a1, and thus, may be connected to or attached on a side surface of each of the plurality of first portions 511a1. Each of the plurality of first portions 511a1 and the second portion 511a2 may be disposed (or arranged) in parallel on the same plane (or the same layer). The second portion 511a2 may include an organic material which may be substantially the same as or similar to the second portion 511a2 described above with reference to FIGS. 11 to 13, and thus, like reference numeral refer to like element and the repetitive description thereof may be omitted or may be briefly discussed.

According to another embodiment of the present disclosure, 2N (where N is a natural number greater than or equal to 2) adjacent first portions 511a1 of the plurality of first portions 511a1 having the triangular shape may be disposed adjacent to one another to form a 2N-angular shape. For example, six adjacent first portions 511a1 of the plurality of first portions 511a1 may be adjacent to one another to form a hexagonal shape (or a regularly hexagonal shape). Vertices of the six adjacent first portions 511a1 forming a hexagonal shape may be adjacent to one another in a center portion (or a central portion) of the hexagonal shape. The second portion 511a2 may be configured to be adjacent to or surround each of the plurality of first portions 511a1, and thus, may be connected to or attached on a side surface of each of the plurality of first portions 511a1. Each of the plurality of first portions 511a1 and the second portion 511a2 may be disposed (or arranged) in parallel on the same plane (or the same layer).

Figure 17:
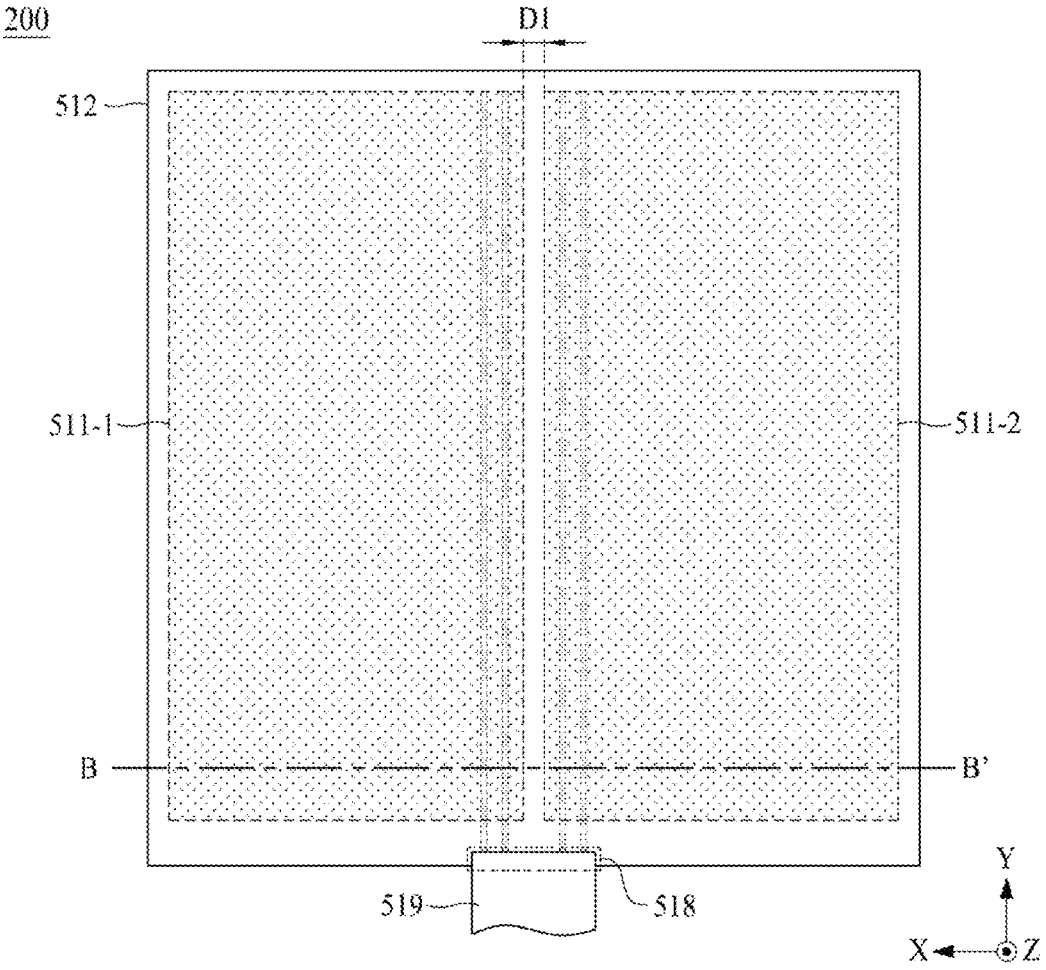
FIG. 17 illustrates a vibration device according to another embodiment of the present disclosure.
Figure 18:
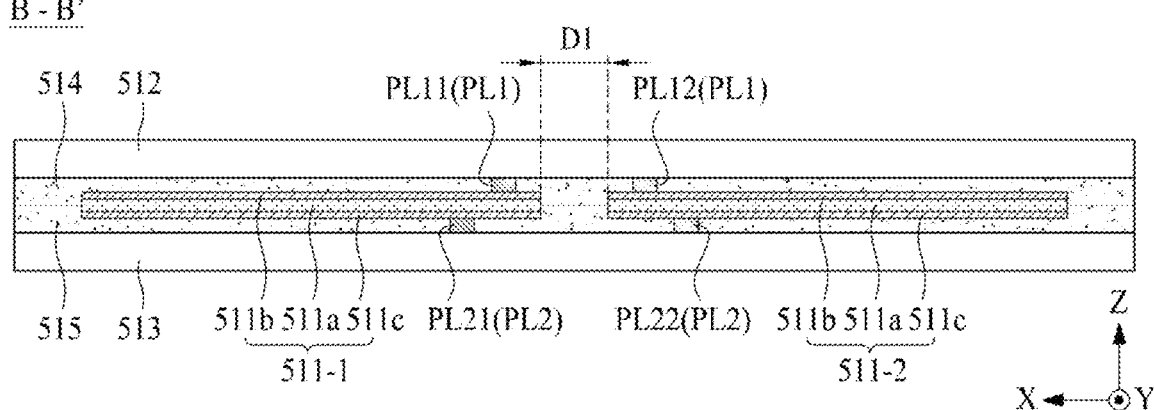
FIG. 18 is a cross-sectional view taken along line B-B' of FIG. 17 according to another embodiment of the present disclosure.

FIG. 17 illustrates a vibration device according to another embodiment of the present disclosure. FIG. 18 is a cross-sectional view taken along line B-B' illustrated in FIG. 17 according to another embodiment of the present disclosure. FIGS. 17 and 18 illustrate another embodiment of the vibration device described with reference to FIGS. 1 to 10B.

With reference to FIGS. 17 and 18, a vibration device 200 or a vibration part according to another embodiment of the present disclosure may include at least two or more vibration parts between the first cover member 512 and the second cover member 513. The vibration device 200 according to another embodiment of the present disclosure may include first and second vibration parts 511-1 and 511-2.

Each of the first and second vibration parts 511-1 and 511-2 may be electrically separated and disposed while being spaced apart from each other along a first direction X. Each of the first and second vibration parts 511-1 and 511-2 may alternately and repeatedly contract and/or expand based on a piezoelectric effect to vibrate. The first and second vibration parts 511-1 and 511-2 may be disposed or tiled at a certain interval (or distance) D1. Thus, the vibration device 200 in which the first and second vibration parts 511-1 and 511-2 are tiled may be a vibration array, a vibration array part, a vibration module array part, a vibration array structure, a tiling vibration array, a tiling vibration array module, or a tiling vibration film.

Each of the first and second vibration parts 511-1 and 511-2 according to an embodiment of the present disclosure may have a tetragonal shape. For example, each of the first and second vibration parts 511-1 and 511-2 may have a tetragonal shape having a width of about 5 cm or more. For example, each of the first and second vibration parts 511-1 and 511-2 may have a square shape having a size of 5 cm×5 cm or more, but embodiments of the present disclosure are not limited thereto.

Each of the first and second vibration parts 511-1 and 511-2 may be arranged or tiled on the same plane, and thus, the vibration device 200 may have an enlarged area based on tiling of the first and second vibration parts 511-1 and 511-2 having a relatively small size.

Each of the first and second vibration parts 511-1 and 511-2 may be arranged or tiled at a certain interval, and thus, may be implemented as one vibration apparatus (or a single vibration apparatus) which is driven as one complete single-body without being independently driven. According to an embodiment of the present disclosure, with respect to the first direction X, a first separation distance D1 between the first and second vibration parts 511-1 and 511-2 may be 0.1 mm or more and less than 3 cm, but embodiments of the present disclosure are not limited thereto.

According to an embodiment of the present disclosure, each of the first and second vibration parts 511-1 and 511-2 may be disposed or tiled to have the separation distance (or an interval) D1 of 0.1 mm or more and less than 3 cm, and thus, may be driven as one vibration apparatus, thereby increasing a reproduction band of a sound and a sound pressure level characteristic of a sound which is generated based on a single-body vibration of the first and second vibration parts 511-1 and 511-2. For example, the first and second vibration parts 511-1 and 511-2 may be disposed in an interval D1 of 0.1 mm or more and less than 5 mm, to increase a reproduction band of a sound generated based on a single-body vibration of the first and second vibration parts 511-1 and 511-2 and to increase a sound of a low-pitched sound band (for example, a sound pressure level characteristic in 500 Hz or less).

According to an embodiment of the present disclosure, when the first and second vibration parts 511-1 and 511-2 are disposed in the interval D1 of less than 0.1 mm or without the interval D1, the reliability of the first and second vibration parts 511-1 and 511-2 or the vibration device 200 may be reduced due to damage or a crack caused by a physical contact therebetween which occurs when each of the first and second vibration parts 511-1 and 511-2 vibrates.

According to an embodiment of the present disclosure, when the first and second vibration parts 511-1 and 511-2 are disposed in the interval D1 of 3 cm or more, the first and second vibration parts 511-1 and 511-2 may not be driven as one vibration apparatus due to an independent vibration of each of the first and second vibration parts 511-1 and 511-2. Therefore, a reproduction band of a sound and a sound pressure level characteristic of a sound which is generated based on vibrations of the first and second vibration parts 511-1 and 511-2 may be reduced. For example, when the first and second vibration parts 511-1 and 511-2 are disposed in the interval D1 of 3 cm or more, a sound characteristic and a sound pressure level characteristic of the low-pitched sound band (for example, in 500 Hz or less) may each be reduced.

According to an embodiment of the present disclosure, when the first and second vibration parts 511-1 and 511-2 are disposed in an interval D1 of 5 mm, each of the first and second vibration parts 511-1 and 511-2 may not be perfectly driven as one vibration apparatus, and thus, a sound characteristic and a sound pressure level characteristic of the low-pitched sound band (for example, in 200 Hz or less) may each be reduced.

According to another embodiment of the present disclosure, when the first and second vibration parts 511-1 and

511-2 are disposed in the interval D1 of 1 mm, each of the first and second vibration parts 511-1 and 511-2 may be driven as one vibration apparatus, and thus, a reproduction band of a sound may increase and a sound of the low-pitched sound band (for example, a sound pressure level characteristic in 500 Hz or less) may increase. For example, when the first and second vibration parts 511-1 and 511-2 are disposed in the interval D1 of 1 mm, the vibration device 200 may be implemented as a large-area vibrator which is enlarged based on optimization of a separation distance between the first and second vibration parts 511-1 and 511-2. Therefore, the vibration device 200 may be driven as a large-area vibrator based on a single-body vibration of the first and second vibration parts 511-1 and 511-2, and thus, a sound characteristic and a sound pressure level characteristic may each increase a reproduction band of a sound and the low-pitched sound band generated based on a large-area vibration of the vibration device 200.

Therefore, to implement a single-body vibration (or one vibration apparatus) of the first and second vibration parts 511-1 and 511-2, a separation distance D1 between the first and second vibration parts 511-1 and 511-2 may be adjusted to 0.1 mm or more and less than 3 cm. Alternatively, to implement a single-body vibration (or one vibration apparatus) of the first and second vibration parts 511-1 and 511-2 and to increase a sound pressure level characteristic of a sound of the low-pitched sound band, the separation distance D1 between the first and second vibration parts 511-1 and 511-2 may be adjusted to 0.1 mm or more and less than 5 mm.

Each of the first and second vibration parts 511-1 and 511-2 according to an embodiment of the present disclosure may include a vibration layer 511a, a first electrode layer 511b, and a second electrode layer 511c.

The vibration layer 511a of each of the first and second vibration parts 511-1 and 511-2 may include a piezoelectric material (or an electroactive material) which includes a piezoelectric effect. For example, the vibration layer 511a of each of the first and second vibration parts 511-1 and 511-2 may be configured substantially the same or similar to as any one of the vibration layer 511a described above with reference to FIGS. 11 to 16, and thus, like reference numeral refer to like element and the repetitive description thereof may be omitted or may be briefly discussed.

According to an embodiment of the present disclosure, each of the first and second vibration parts 511-1 and 511-2 may include any one vibration part of the vibration part 511 described above with reference to FIGS. 11 to 16, or may include different vibration part 511.

The first electrode layer 511b may be disposed at a first surface of the vibration layer 511a and electrically connected to the first surface of the vibration layer 511a. The first electrode layer 511b may be substantially the same as or similar to the first electrode layer 511b described above with reference to FIGS. 11 to 16, and thus, like reference numeral refer to like element and the repetitive description thereof may be omitted or may be briefly discussed.

The second electrode layer 511c may be disposed at a second surface of the vibration layer 511a and electrically connected to the second surface of the vibration layer 511a. The second electrode layer 511c may be substantially the same as or similar to the second electrode layer 511c described above with reference to FIGS. 11 to 16, and thus, like reference numeral refer to like element and the repetitive description thereof may be omitted or may be briefly discussed.

The vibration device 200 according to another embodiment of the present disclosure may further include a first cover member 512 and a second cover member 513.

The first cover member 512 may be disposed at a first surface of the vibration device 200. For example, the first cover member 512 may cover the first electrode layer 511b which is disposed at a first surface of each of the first and second vibration parts 511-1 and 511-2, and thus, the first cover member 512 may be connected to the first surface of each of the first and second vibration parts 511-1 and 511-2 in common or may support the first surface of each of the first and second vibration parts 511-1 and 511-2 in common. Accordingly, the first cover member 512 may protect the first surface or the first electrode layer 151b of each of the first and second vibration parts 511-1 and 511-2.

The second cover member 513 may be disposed at a second surface of the vibration device 200. For example, the second cover member 513 may cover the second electrode layer 511c which is disposed at a second surface of each of the first and second vibration parts 511-1 and 511-2, and thus, the second cover member 513 may be connected to the second surface of each of the first and second vibration parts 511-1 and 511-2 in common or may support the second surface of each of the first and second vibration parts 511-1 and 511-2 in common. Accordingly, the second cover member 513 may protect the second surface or the second electrode layer 511c of each of the first and second vibration parts 511-1 and 511-2.

Each of the first cover member 512 and the second cover member 513 according to an embodiment of the present disclosure may include one or more material of plastic, fiber, leather, rubber, wood, cloth, carbon, and paper, but embodiments of the present disclosure are not limited thereto. For example, each of the first cover member 512 and the second cover member 513 may include a same material or different material. For example, each of the first cover member 512 and the second cover member 513 may be a polyimide (PI) film or a polyethylene terephthalate (PET) film, but embodiments of the present disclosure are not limited thereto.

The first cover member 512 according to an embodiment of the present disclosure may be disposed at the first surface of each of the first and second vibration parts 511-1 and 511-2 by a first adhesive layer 514. For example, the first cover member 512 may be directly disposed at the first surface of each of the first and second vibration parts 511-1 and 511-2 by a film laminating process by the first adhesive layer 514. Accordingly, each of the first and second vibration parts 511-1 and 511-2 may be integrated (or disposed) or tiled with the first cover member 512 to have the certain interval D1.

The second cover member 513 according to an embodiment of the present disclosure may be disposed at the second surface of each of the first and second vibration parts 511-1 and 511-2 by a second adhesive layer 515. For example, the second cover member 513 may be directly disposed at the second surface of each of the first and second vibration parts 511-1 and 511-2 by a film laminating process by the second adhesive layer 515. Accordingly, each of the first and second vibration parts 511-1 and 511-2 may be integrated (or disposed) or tiled with the second cover member 513 to have the certain interval D1. For example, the vibration device 200 may be implemented as one film (or one vibrator) by the first cover member 512 and the second cover member 513.

The first adhesive layer 514 may be disposed between the first and second vibration parts 511-1 and 511-2 and disposed at the first surface of each of the first and second vibration parts 511-1 and 511-2. For example, the first adhesive layer 514 may be formed at a rear surface (or an inner surface) of the first cover member 512 facing the first surface of each of the first and second vibration parts 511-1 and 511-2, filled between the first and second vibration parts 511-1 and 511-2, and disposed between at the first cover member 512 and the first surface of each of the first and second vibration parts 511-1 and 511-2.

The second adhesive layer 515 may be disposed between the first and second vibration parts 511-1 and 511-2 and disposed at the second surface of each of the first and second vibration parts 511-1 and 511-2. For example, the second adhesive layer 515 may be formed at a front surface (or an inner surface) of the second cover member 513 facing the second surface of each of the first and second vibration parts 511-1 and 511-2, filled between the first and second vibration parts 511-1 and 511-2, and disposed between at the first cover member 512 and the second surface of each of the first and second vibration parts 511-1 and 511-2.

The first and second adhesive layers 514 and 515 may be connected or coupled to each other between the first and second vibration parts 511-1 and 511-2. Therefore, each of the first and second vibration parts 511-1 and 511-2 may be surrounded by the first and second adhesive layers 514 and 515. For example, the first and second adhesive layers 514 and 515 may be configured between the first cover member 512 and the second cover member 513 to completely surround the first and second vibration parts 511-1 and 511-2. For example, each of the first and second vibration parts 511-1 and 511-2 may be embedded or built-in between the first adhesive layer 514 and the second adhesive layer 515.

Each of the first and second adhesive layers 514 and 515 according to an embodiment of the present disclosure may include an electrically insulating material which has adhesiveness and is capable of compression and decompression. For example, each of the first and second adhesive layers 514 and 515 may include an epoxy resin, an acrylic resin, a silicone resin, or a urethane resin, but embodiments of the present disclosure are not limited thereto. Each of the first and second adhesive layers 514 and 515 may be configured to be transparent, translucent, or opaque.

The vibration device 200 according to another embodiment of the present disclosure may further include a first power supply line PL1 disposed at the first cover member 512, a second power supply line PL2 disposed at the second cover member 513, and a pad part 518 electrically connected to the first power supply line PL1 and the second power supply line PL2.

The first power supply line PL1 may be disposed at a rear surface of the first cover member 512 facing the first surface of each of the first and second vibration parts 511-1 and 511-2. The first power supply line PL1 may be connected or electrically and directly connected to the first electrode layer 151b of each of the first and second vibration parts 511-1 and 511-2. For example, the first power supply line PL1 may be electrically connected to the first electrode layer 151b of each of the first and second vibration parts 511-1 and 511-2 through an anisotropic conductive film or a conductive material (or particle) included in the first adhesive layer 514.

The first power supply line PL1 according to an embodiment of the present disclosure may include first and second upper power lines PL11 and PL12 disposed along a second direction Y. For example, the first upper power line PL11 may be connected or electrically and directly connected to the first electrode layer 511b of the first vibration part 511-1. The second upper power line PL12 may be connected or electrically and directly connected to the first electrode layer 511b of the second vibration part 511-2.

The second power supply line PL2 may be disposed at a front surface of the second cover member 513 facing the second surface of each of the first and second vibration parts 511-1 and 511-2. The second power supply line PL2 may be connected or electrically and directly connected to the second electrode layer 511c of each of the first and second vibration parts 511-1 and 511-2. For example, the second power supply line PL2 may be electrically connected to the second electrode layer 511c of each of the first and second vibration parts 511-1 and 511-2 through an anisotropic conductive film or a conductive material (or particle) included in the second adhesive layer 515.

The second power supply line PL2 according to an embodiment of the present disclosure may include first and second lower power lines PL21 and PL22 disposed along a second direction Y. The first lower power line PL21 may be electrically connected to the second electrode layer 511c of the first vibration part 511-1. For example, the first lower power line PL21 may be disposed not to overlap the first upper power line PL11. When the first lower power line PL21 is disposed not to overlap the first upper power line PL11, a short circuit between the first power supply line PL1 and the second power supply line PL2 may be prevented or reduced. The second lower power line PL22 may be electrically connected to the second electrode layer 511c of the second vibration part 511-2. For example, the second lower power line PL22 may be disposed not to overlap the second upper power line PL12. When the second lower power line PL22 is disposed not to overlap the second upper power line PL12, a short circuit between the first power supply line PL1 and the second power supply line PL2 may be prevented or reduced.

The pad part 518 may be configured at one periphery portion of any one of the first cover member 512 and the second cover member 513 to be electrically connected to one portion (or one end) of each of the first power supply line PL1 and the second power supply line PL2.

The pad part 518 according to an embodiment of the present disclosure may include a first pad electrode electrically connected to one end of the first power supply line PL1, and a second pad electrode electrically connected to one end of the second power supply line PL2.

The first pad electrode may be connected to one portion of each of the first and second upper power lines PL11 and PL12 of the first power supply line PL1 in common. For example, the one portion of each of the first and second upper power lines PL11 and PL12 may branch from the first pad electrode. The second pad electrode may be connected to one portion of each of the first and second lower power lines PL21 and PL22 of the second power supply line PL2 in common. For example, the one portion of each of the first and second lower power lines PL21 and PL22 may branch from the second pad electrode.

The vibration device 200 according to another embodiment of the present disclosure may further include a signal cable 519.

The signal cable 519 may be electrically connected to the pad part 518 disposed at the vibration device 200 and may supply the vibration device 200 with a vibration driving signal (or a sound signal or a voice signal) provided from a sound processing circuit. The signal cable 519 according to an embodiment of the present disclosure may include a first terminal electrically connected to the first pad electrode of the pad part 518 and a second terminal electrically connected to the second pad electrode of the pad part 518. For example, the signal cable 519 may be a flexible printed circuit cable, a flexible flat cable, a single-sided flexible printed circuit, a single-sided flexible printed circuit board, a flexible multilayer printed circuit, or a flexible multilayer printed circuit board, but embodiments of the present disclosure are not limited thereto.

The signal cable 519 according to an embodiment of the present disclosure may be led out through or via or by at least one or more grooves 406 of the connector 400 described with reference to FIGS. 4 to 7.

The sound processing circuit may generate an alternating current (AC) vibration driving signal including a first vibration driving signal and a second vibration driving signal based on a sound data. The first vibration driving signal may be any one of a positive (+) vibration driving signal and a negative (−) vibration driving signal, and the second vibration driving signal may be any one of a positive (+) vibration driving signal and a negative (−) vibration driving signal. For example, the first vibration driving signal may be supplied to the first electrode layer 511b of each of the first and second vibration parts 511-1 and 511-2 through or via or by the first terminal of the signal cable 519, the first pad electrode of the pad part 518, and the first power supply line PL1. The second vibration driving signal may be supplied to the second electrode layer 511c of each of the first and second vibration parts 511-1 and 511-2 through the second terminal of the signal cable 519, the second pad electrode of the pad part 518, and the second power supply line PL2. The first power supply line PL1 and the second power supply line PL2 according to an embodiment of the present disclosure may be led out through or via or by at least one or more grooves 406 of the connector 400 described with reference to FIGS. 4 to 7.

The vibration device 200 according to another embodiment of the present disclosure may be implemented as a thin film type. Accordingly, the vibration device 200 may be bent in a shape corresponding to a shape of the vibration member or the vibration object and may easily vibrate the vibration member including various curved portions, thereby enhancing a sound characteristic and/or a sound pressure level characteristic in the low-pitched sound band generated based on a vibration of the vibration member. Furthermore, the vibration device 200 according to another embodiment of the present disclosure may include the first and second vibration parts 511-1 and 511-2 which are arranged (or tiled) at a certain interval D1, so as to be implemented as one single vibration body without being independently driven, and thus, may be driven as a large-area vibration body based on a single-body vibration of the first and second vibration parts 511-1 and 511-2. Therefore, since the vibrating device 200 is implemented as one single vibration body, the vibration device 200 may be driven as a large-area vibration body applied to a display panel or a large-area vibration member.

Figure 19:
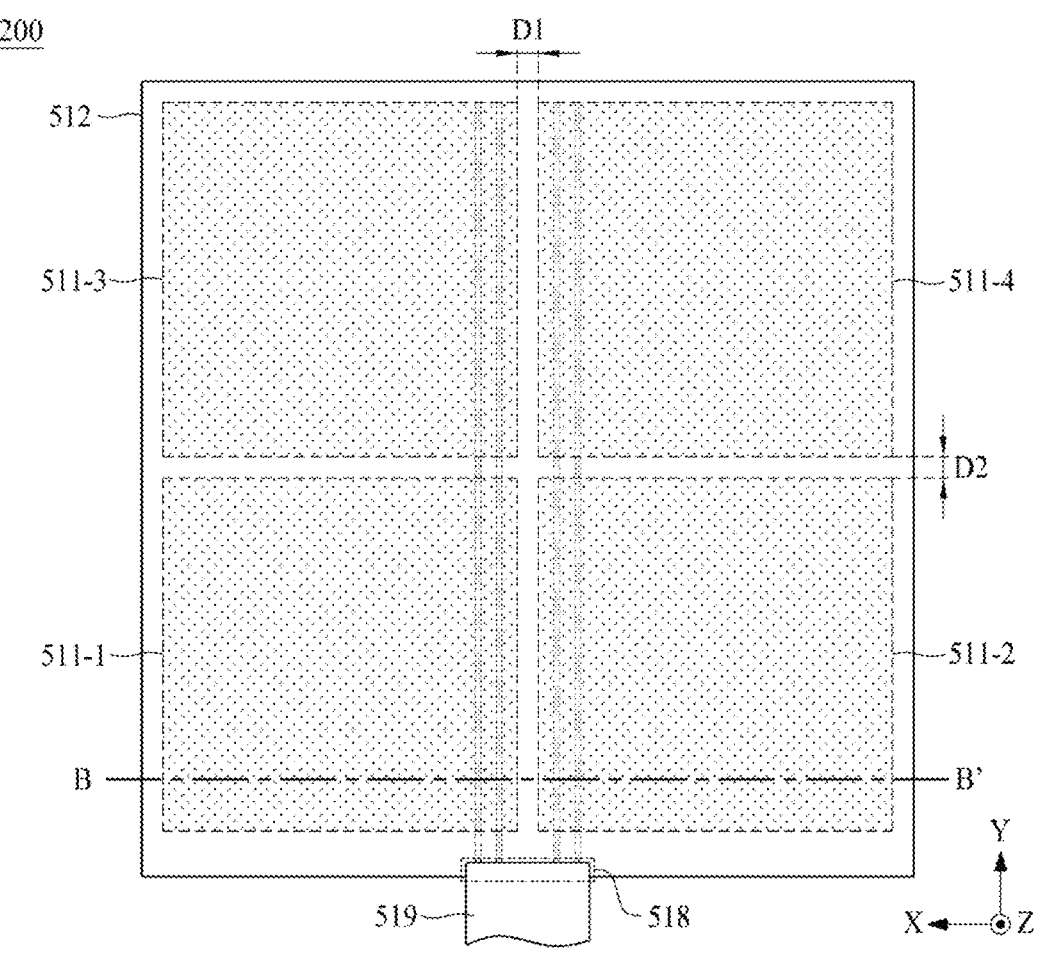
FIG. 19 illustrates a vibration device according to another embodiment of the present disclosure.

FIG. 19 illustrates a vibration device according to another embodiment of the present disclosure. FIG. 19 illustrates four vibration parts provided in the vibration device in FIGS. 17 and 18 according to another embodiment of the present disclosure. Hereinafter, therefore, the other elements except four vibration parts and relevant elements are referred to by like reference numerals, and the repetitive description thereof may be omitted or will be briefly given. A cross-sectional surface taken along line B-B' illustrated in FIG. 19 may also be illustrated in FIG. 18.

With reference to FIGS. 18 and 19, the vibration device 200 according to another embodiment of the present disclosure may include a plurality of vibration parts 511-1 to 511-4.

The plurality of vibration parts 511-1 to 511-4 may be electrically disconnected and disposed spaced apart from one another along each of a first direction X and a second direction Y. For example, the plurality of vibration parts 511-1 to 511-4 may be disposed or tiled in an i×j form on the same plane, and thus, the vibration device 200 may be implemented to have a large area, based on tiling of the plurality of vibration parts 511-1 to 511-4 having a relatively small size. For example, i may be the number of vibration parts disposed along the first direction X and may be a natural number of 2 or more, and j may be the number of vibration parts disposed along the second direction Y and may be a natural number of 2 or more which is the same as or different from i. For example, the plurality of vibration parts 511-1 to 511-4 may be arranged or tiled in a 2×2 form, but embodiments of the present disclosure are not limited thereto. In the following description, an example where the vibration device 200 includes first to fourth vibration parts 511-1 to 511-4 will be described.

According to an embodiment of the present disclosure, the first and second vibration parts 511-1 and 511-2 may be spaced apart from each other along the first direction X. The third and fourth vibration parts 511-3 and 511-4 may be spaced apart from each other along the first direction X and may be spaced apart from each of the first and second vibration parts 511-1 and 511-2 along the second direction Y. The first and third vibration parts 511-1 and 511-3 may be spaced apart from each other along the second direction Y to face each other. The second and fourth vibration parts 511-2 and 511-4 may be spaced apart from each other along the second direction Y to face each other.

The first to fourth vibration parts 511-1 to 511-4 may be disposed between the first cover member 512 and the second cover member 513. For example, each of the first cover member 512 and the second cover member 513 may be connected to the first to fourth vibration parts 511-1 to 511-4 in common or may support the first to fourth vibration parts 511-1 to 511-4 in common, and thus, may drive the first to fourth vibration parts 511-1 to 511-4 as one vibration apparatus (or a single vibration apparatus). For example, the first to fourth vibration parts 511-1 to 511-4 may be tiled in a certain interval between the first and the second cover members 512 and 513, and thus, may be driven as one vibration apparatus (or a single vibration apparatus).

According to an embodiment of the present disclosure, as described above with reference to FIGS. 17 and 18, to implement a complete single-body vibration or a large-area vibration, the first to fourth vibration parts 511-1 to 511-4 may be disposed (or tiled) at the intervals (e.g., D1 or D2) of 0.1 mm or more and less than 3 cm or may be disposed (or tiled) at the intervals (e.g., D1 or D2) of 0.1 mm or more and less than 5 mm in each of the first direction X and the second direction Y.

Each of the first to fourth vibration parts 511-1 to 511-4 may include a vibration layer 511a, a first electrode layer 511b, and a second electrode layer 511c.

The vibration layer 511a of each of the first to fourth vibration parts 511-1 to 511-4 may include a piezoelectric material (or an electroactive material) which includes a piezoelectric effect. The vibration layer 511a of each of the first to fourth vibration parts 511-1 to 511-4 may be configured substantially the same as or similar to any one of the vibration layer 511a described above with reference to FIGS. 11 to 16, and thus, like reference numeral refer to like element and the repetitive description thereof may be omitted or may be briefly discussed.

According to an embodiment of the present disclosure, each of the first to fourth vibration prats 511-1 to 511-4 may include any one vibration layer 511a of the vibration layer 511a described above with reference to FIGS. 11 to 16, or may include different vibration layer 511a. According to another embodiment of the present disclosure, one or more of the first to fourth vibration parts 511-1 to 511-4 may include a different vibration layer 511a described above with reference to FIGS. 11 to 16.

The first electrode layer 511b may be disposed at a first surface of the corresponding vibration layer 511a and electrically connected to the first surface of the vibration layer 511a. The first electrode layer 511b may be substantially the same as or similar to the first electrode layer 151b described above with reference to FIG. 18, and thus, like reference numeral refer to like element and the repetitive description thereof may be omitted or may be briefly discussed.

The second electrode layer 511c may be disposed at a second surface of the corresponding vibration layer 511a and electrically connected to the second surface of the vibration layer 511a. The second electrode layer 511c may be substantially the same as or similar to the second electrode layer 511c described above with reference to FIG. 18, and thus, like reference numeral refer to like element and the repetitive description thereof may be omitted or may be briefly discussed.

According to an embodiment of the present disclosure, the first and second adhesive layers 514 and 515 may be connected or coupled to each other between the first to fourth vibration parts 511-1 to 511-4. Therefore, each of the first to fourth vibration parts 511-1 to 511-4 may be surrounded by the first and second adhesive layers 514 and 515. For example, the first and second adhesive layers 514 and 515 may be configured between the first cover member 512 and the second cover member 513 to completely surround the first to fourth vibration parts 511-1 to 511-4. For example, each of the first to fourth vibration parts 511-1 to 511-4 may be embedded or built-in between the first adhesive layer 514 and the second adhesive layer 515.

The vibration device 200 according to another embodiment of the present disclosure may further include a first power supply line PL1, a second power supply line PL2, and a pad part 518.

Except for an electrical connection structure between each of the first and second power supply lines PL1 and PL2 and the first to fourth vibration parts 511-1 to 511-4, the first power supply line PL1 and the second power supply line PL2 may be substantially the same as or similar to each of the first power supply line PL1 and the second power supply line PL2 described above with reference to FIGS. 17 and 18, and thus, in the following description, only the electrical connection structure between each of the first and second power supply lines PL1 and PL2 and the first to fourth vibration parts 511-1 to 511-4 will be briefly described below.

The first power supply line PL1 according to an embodiment of the present disclosure may include first and second upper power lines PL11 and PL12 disposed along the second direction Y. For example, the first upper power line PL11 may be electrically connected to the first electrode layer 151b of each of the first and third vibration parts 511-1 and 511-3 disposed at a first row parallel to the second direction Y of the first to fourth vibration parts 511-1 to 511-4. The second upper power line PL12 may be electrically connected to the first electrode layer 511b of each of the second and fourth vibration parts 511-2 and 511-4 disposed at a second row parallel to the second direction Y of the first to fourth vibration parts 511-1 to 511-4.

The second power supply line PL2 according to an embodiment of the present disclosure may include first and second lower power lines PL21 and PL22 disposed along the second direction Y. For example, the first lower power line PL21 may be electrically connected to the second electrode layer 511c of each of the first and third vibration parts 511-1 and 511-3 disposed at a first row parallel to the second direction Y of the first to fourth vibration parts 511-1 to 511-4. The second lower power line PL22 may be electrically connected to the second electrode layer 511c of each of the second and fourth vibration parts 511-2 and 511-4 disposed at a second row parallel to the second direction Y of the first to fourth vibration parts 511-1 to 511-4.

The pad part 518 may be configured at one periphery portion of one of the first cover member 512 and the second cover member 513 so as to be electrically connected to one side (or one end) of each of the first and second power supply lines PL1 and PL2. The pad part 518 may be substantially the same as or similar to the pad part 518 illustrated in FIGS. 17 and 18, and thus, like reference numeral refer to like element and the repetitive description thereof may be omitted or may be briefly discussed.

The vibration device 200 according to another embodiment of the present disclosure may have the same or similar effect as that of the vibration device 200 described above with reference to FIGS. 17 and 18, and thus, the repetitive description thereof may be omitted or may be briefly discussed.

Figure 20:
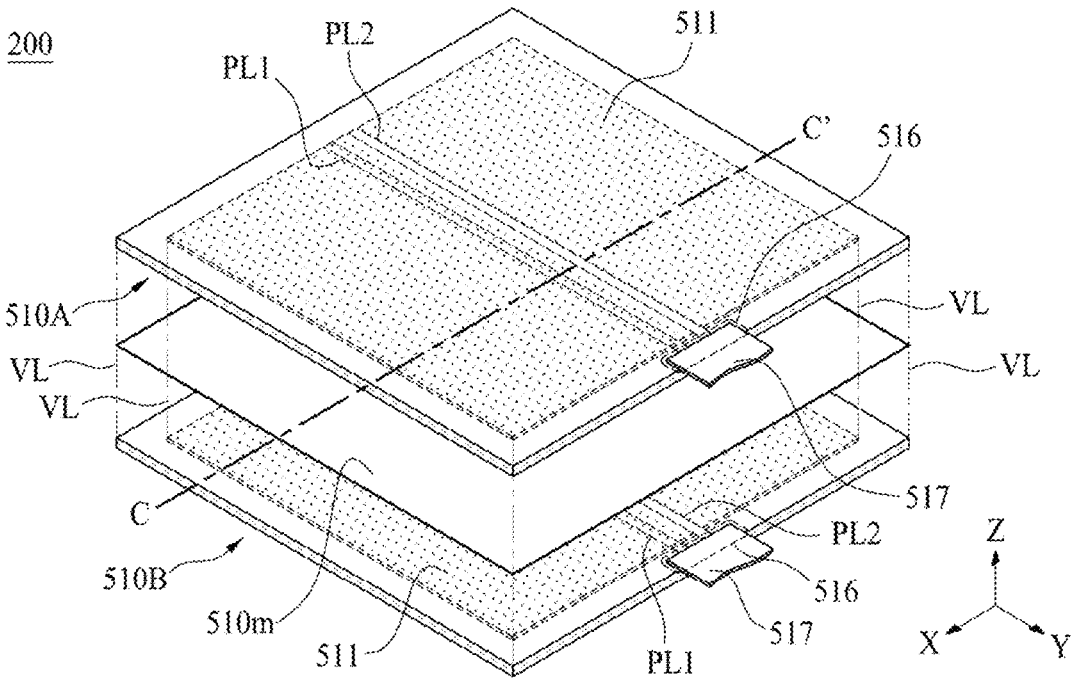
FIG. 20 illustrates a vibration device according to another embodiment of the present disclosure.
Figure 21:
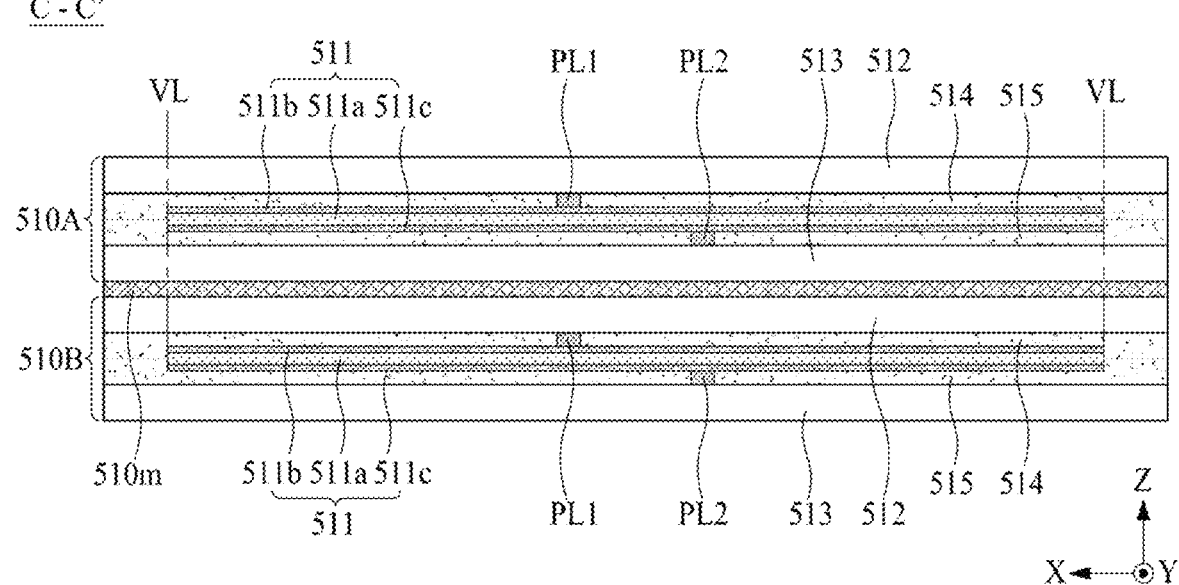
FIG. 21 is a cross-sectional view taken along line C-C' illustrated in FIG. 20 according to another embodiment of the present disclosure.

FIG. 20 illustrates a vibration device according to another embodiment of the present disclosure. FIG. 21 is a cross-sectional view taken along line C-C' illustrated in FIG. 22 according to another embodiment of the present disclosure. FIGS. 20 and 21 illustrate another embodiment of the vibration device described with reference to FIGS. 1 to 10B.

With reference to FIGS. 20 and 21, the vibration device 200 according to another embodiment of the present disclosure may include a plurality of vibration generating parts 510A and 510B and an intermediate member 510m. For example, the vibration device 200 according to another embodiment of the present disclosure may include a first vibration generating part 510A, a second vibration generating part 510B, and an intermediate member 510m between the first vibration generating part 510A and the second vibration generating part 510B.

According to an embodiment of the present disclosure, a description of FIGS. 20 and 21 may be identically or similarly applied to FIGS. 17 to 19.

The plurality of vibration generating parts (or the first and second vibration generating parts) 510A and 510B may overlap or be stacked to be displaced (or driven or vibrated) in a same direction to maximize or increase an amplitude displacement of the vibration member and/or an amplitude displacement of the vibration device 200. One sides (or end portions, or end, or outer surfaces, or each corner portion) of each of the plurality of vibration generating parts (or the first and second vibration generating parts) 510A and 510B may be aligned on a virtual extension line VL extending along a third direction Z, or may be located at the virtual extension line VL. For example, the first vibration generating part 510A may be disposed at a front surface or a rear surface of the second vibration generating part 510B.

The plurality of vibration generating parts (or the first and second vibration generating parts) 510A and 510B may be any one of the vibration device 200 described above with reference to FIGS. 11 to 16, and thus, their repetitive descriptions may be omitted or may be briefly discussed.

The plurality of vibration generating parts 510A and 510B may overlap or be stacked to be displaced (or driven or vibrated) in a same direction based on a polarization direction (or a poling direction) of the vibration layer 511a. For example, when the vibration layer 511a of each of the first and second vibration generating parts 510A and 510B has a same polarization direction, the second vibration generating part 510B may be disposed at the front surface or the rear surface of the first vibration generating part 510A. For example, when the vibration layer 511a of each of the first and second vibration generating parts 510A and 510B has the opposite polarization direction to each other, the second vibration generating part 510B may be disposed at the front surface or the rear surface of the first vibration generating part 510A as a vertically reversed type.

The intermediate member 510m may be disposed or interposed between the plurality of vibration generating parts 510A and 510B. For example, the intermediate member 510m may be disposed between the second cover member 513 of the first vibration generating part 510A and the first cover member 512 of the second vibration generating part 510B. For example, the intermediate member 510m may be configured as an adhesive material including an adhesive layer which is good in adhesive force or attaching force with respect to each of the first vibration generating part 510A and the second vibration generating part 510B overlapping vertically.

The intermediate member 510m according to an embodiment of the present disclosure may include a foam pad, a single-sided tape, a double-sided tape, a single-sided foam pad, a double-sided foam pad, a single-sided foam tape, a double-sided foam tape, or an adhesive, or the like, but embodiments of the present disclosure are not limited thereto. For example, an adhesive layer of the intermediate member 510m may include epoxy-based, acrylic-based, silicone-based, or urethane-based, but embodiments of the present disclosure are not limited thereto. The adhesive layer of the intermediate member 510m may include a urethane-based material which relatively has a ductile characteristic compared to acrylic-based material. Accordingly, in the vibration device 200 according to another embodiment of the present disclosure, the vibration loss of the vibration device 200 caused by displacement interference between the plurality of vibration generating parts 510A and 510B may be minimized or reduced, or each of the plurality of vibration generating parts 510A and 510B may be freely displaced.

The intermediate member 510m according to another embodiment of the present disclosure may include one or more of a thermo-curable adhesive, a photo-curable adhesive, and a thermal bonding (or a thermosetting) adhesive. For example, the intermediate member 510m may include the thermal bonding adhesive. The thermal bonding adhesive may be a heat-active type or a thermo-curable type. For example, the intermediate member 510m including the thermal bonding adhesive may attach or couple two adjacent vibration generating parts 510A and 510B by heat and pressure. For example, the intermediate member 510m including the thermal bonding adhesive may minimize or reduce the loss of vibration of the vibration device 200.

The plurality of vibration generating parts 510A and 510B may be integrated as one structure (or a component) by a laminating process by the intermediate member 510m. For example, the plurality of vibration generating parts 510A and 510B may be integrated as one structure by a laminating process by a roller.

FIGS. 22A to 22D illustrate a stacked structure between vibration layers of each of a plurality of vibration parts illustrated in FIGS. 20 and 21 according to another embodiment of the present disclosure.

Figure 22A:
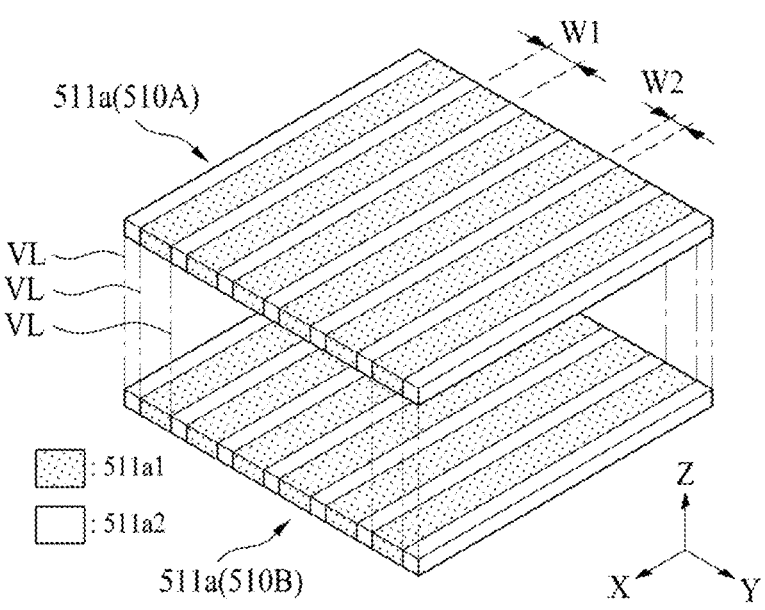
FIGS. 22A to 22D illustrate a stacked structure between vibration layers of each of a plurality of vibration parts illustrated in FIGS. 20 and 21 according to another embodiment of the present disclosure.
Figure 22B:
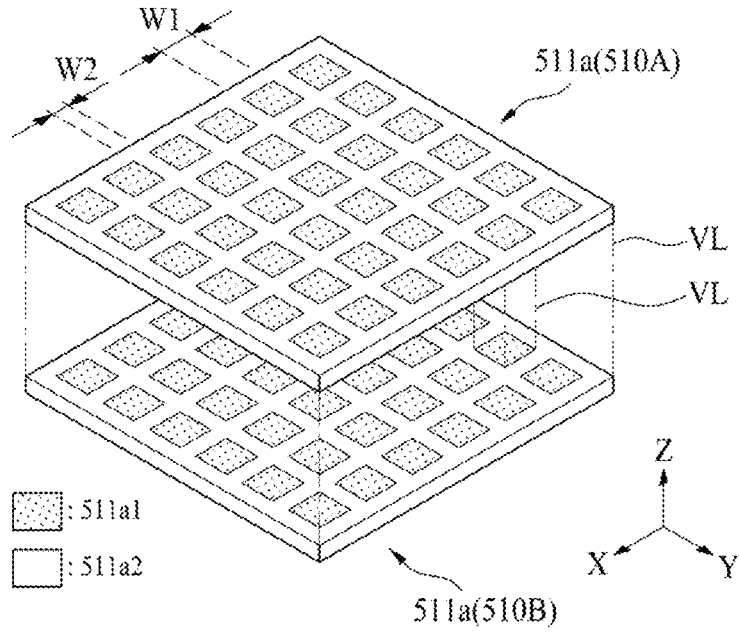
Figure 22C:
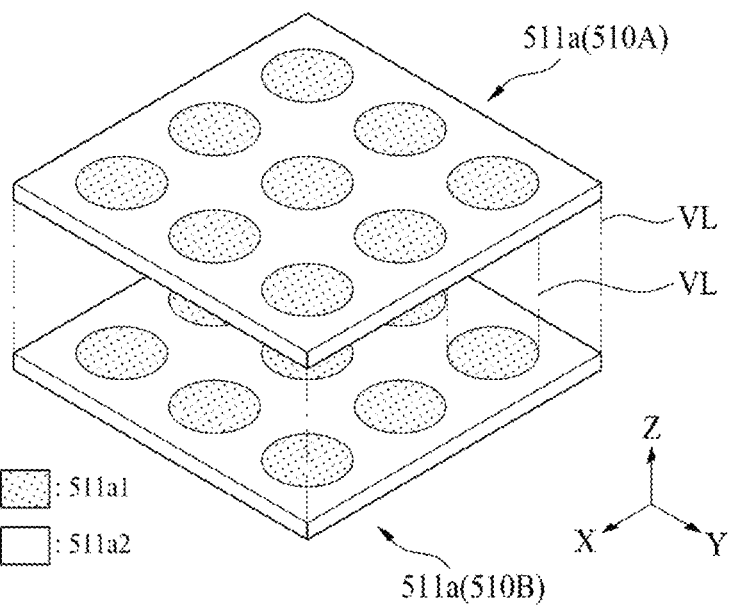
Figure 22D:
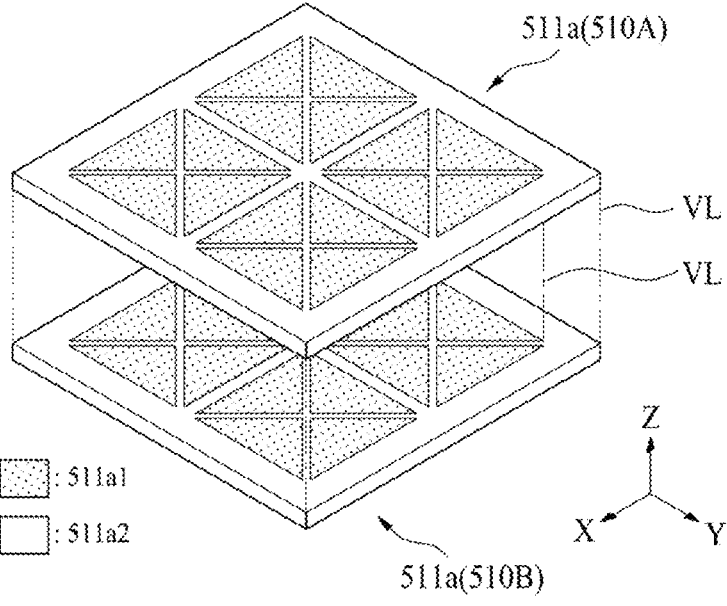

With reference to FIGS. 20 and 22A, a vibration layer 511*a* of each of a plurality of vibration generating parts 510A and 510B may include a plurality of first portions 511*a*1 and a plurality of second portions 511*a*2 disposed between the plurality of first portions 511*a*1. The vibration layer 511*a* may be substantially the same as or similar to the vibration layer 511*a* described above with reference to FIG. 13, and thus, the repetitive description thereof may be omitted or may be briefly discussed. According to an embodiment of the present disclosure, a description of FIGS. 22A to 22D may be identically or similarly applied to FIGS. 17 to 19.

A first portion 511*a*1 of a vibration generating part 510B disposed at a lower layer and a first portion 511*a*1 of a vibration generating part 510A disposed at an upper layer of the plurality of vibration generating parts 510A and 510B may substantially overlap or stack to each other without being staggered. A second portion 511*a*2 of the vibration generating part 510B disposed at the lower layer and a second portion 511*a*2 of the vibration generating part 510A disposed at the upper layer of the plurality of vibration generating parts 510A and 510B may substantially overlap or stack to each other without being staggered. Therefore, the first portions 511*a*1 of the plurality of vibration generating parts 510A and 510B may substantially overlap or stack to each other without being staggered and may displace (or drive or vibrate) in a same direction, and thus, an amplitude displacement of a vibration device 200 and/or an amplitude displacement of a vibration member may be increased or maximized by a combination vibration of the plurality of vibration generating parts 510A and 510B, thereby enhancing a sound characteristic and/or a sound pressure level characteristic of the low-pitched sound band generated based on a vibration of the vibration member.

With reference to FIGS. 20 and 22B to 22D, a vibration layer 511*a* of each of a plurality of vibration generating parts 510A and 510B may include a plurality of first portions 511*a*1 and a second portion 511*a*2 disposed to be adjacent to or surround each of the plurality of first portions 511*a*1. The vibration layer 511*a* may be substantially the same as or similar to the vibration layer 511*a* described above with reference to FIGS. 14 to 16, and thus, the repetitive description thereof may be omitted or may be briefly discussed.

A first portion 511*a*1 of the vibration generating part 510B disposed at the lower layer and a first portion 511*a*1 of the vibration generating part 510A disposed at the upper layer of the plurality of vibration generating parts 510A and 510B may substantially overlap or stack to each other without being staggered. A second portion 511*a*2 of the vibration generating part 510B disposed at the lower layer and a second portion 511*a*2 of the vibration generating part 510A disposed at the upper layer of the plurality of vibration generating parts 510A and 510B may substantially overlap or stack to each other without being staggered. Therefore, the first portions 511*a*1 of the plurality of vibration generating parts 510A and 510B may substantially overlap or stack to each other without being staggered and may displace (or drive or vibrate) in the same direction, and thus, an amplitude displacement of a vibration device 200 and/or an amplitude displacement of a vibration member may be increased or maximized by a combination vibration of the plurality of vibration generating parts 510A and 510B, thereby enhancing a sound characteristic and/or a sound pressure level characteristic of the low-pitched sound band generated based on a vibration of the vibration member.

Figure 23:
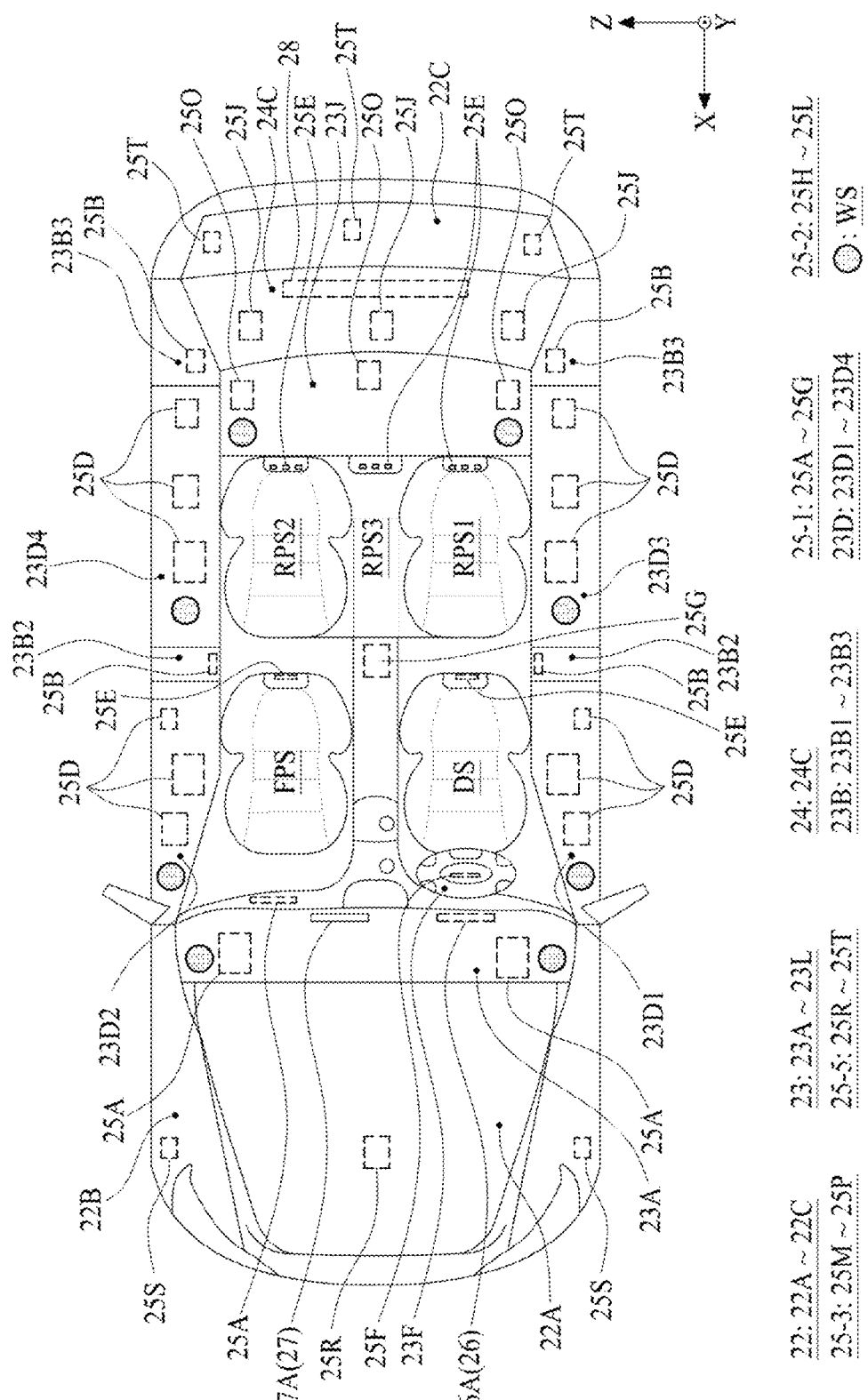
FIG. 23 illustrates a vehicular apparatus according to an embodiment of the present disclosure.
Figure 24:
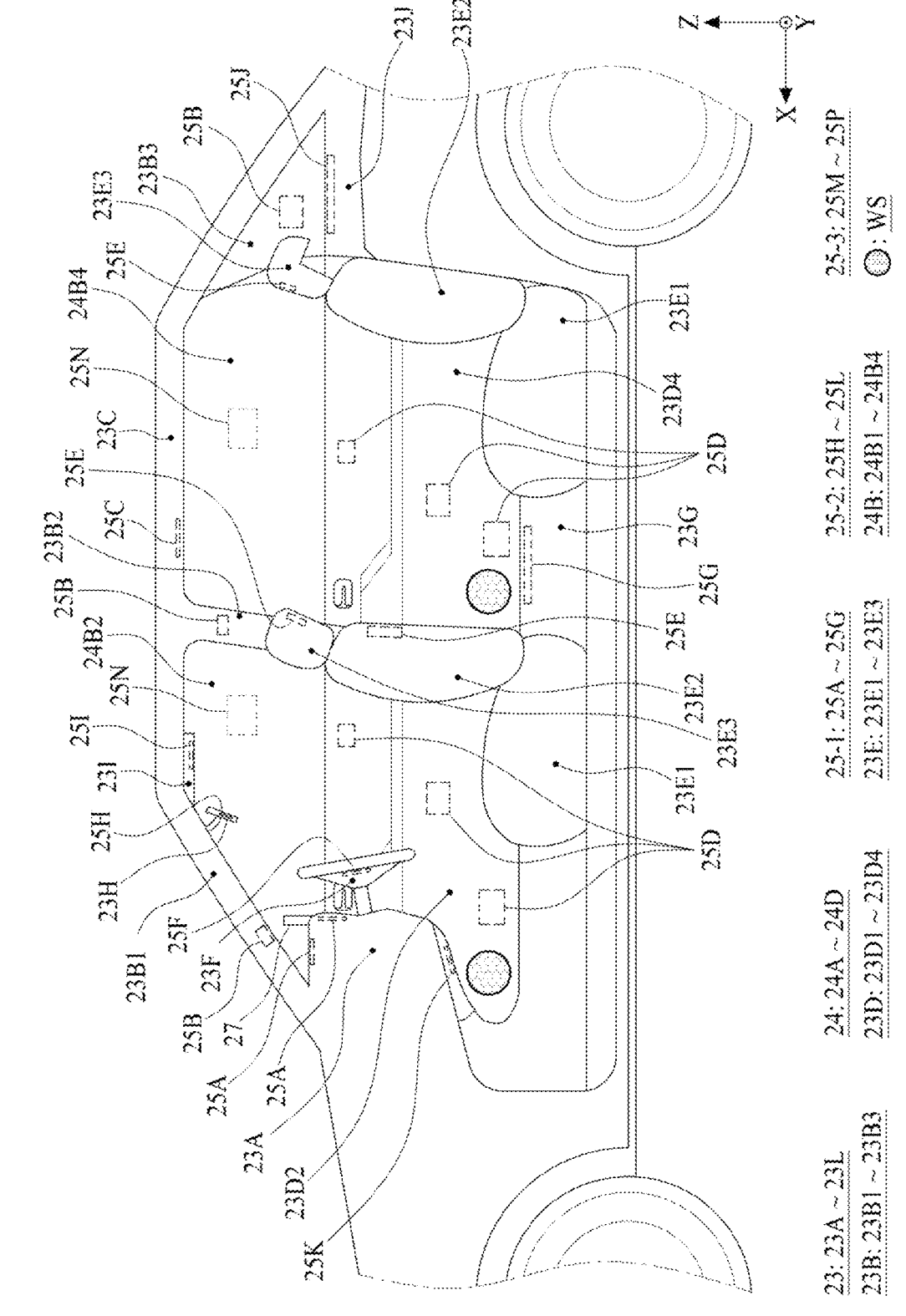
FIG. 24 illustrates a vehicular apparatus according to an embodiment of the present disclosure.
Figure 25:
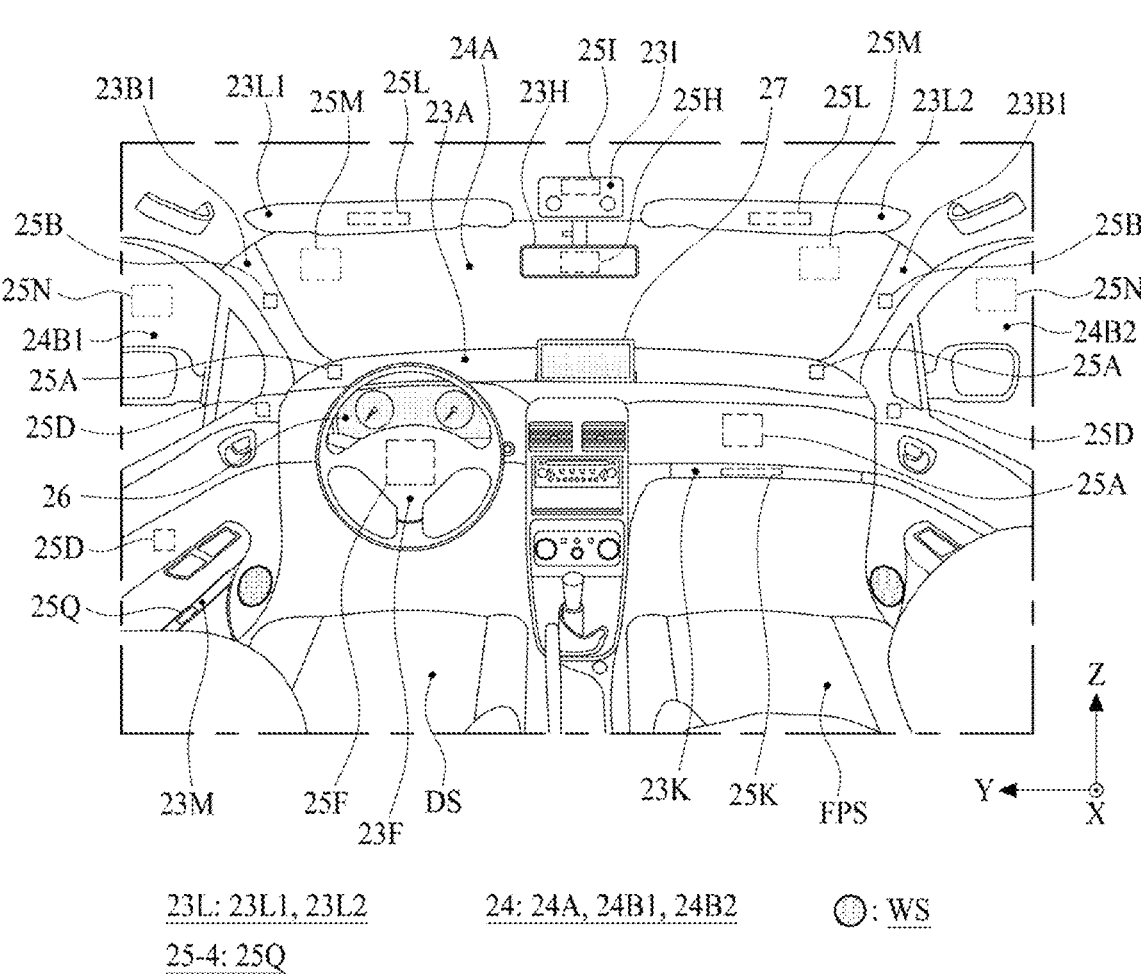
FIG. 25 illustrates a sound generating apparatus disposed near a driver seat and a front passenger seat of a vehicular apparatus according to an embodiment of the present disclosure.
Figure 26:
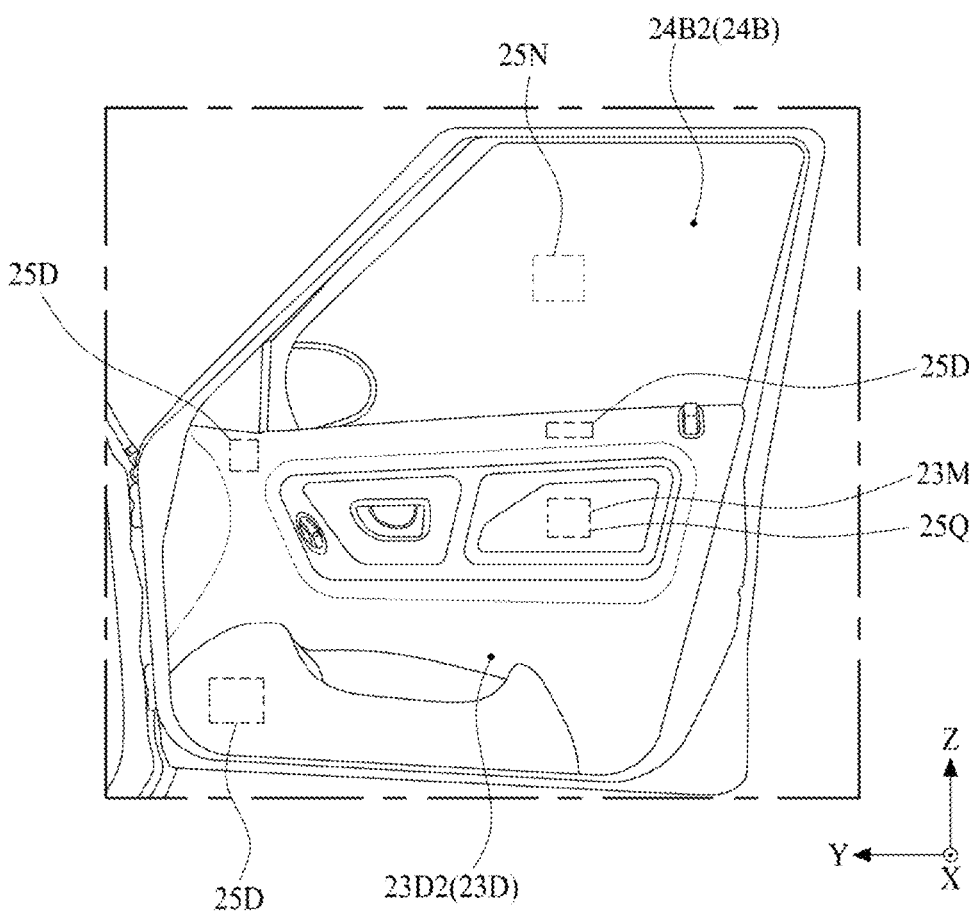
FIG. 26 illustrates a sound generating apparatus disposed at a door and a glass window of a vehicular apparatus according to an embodiment of the present disclosure.
Figure 27:
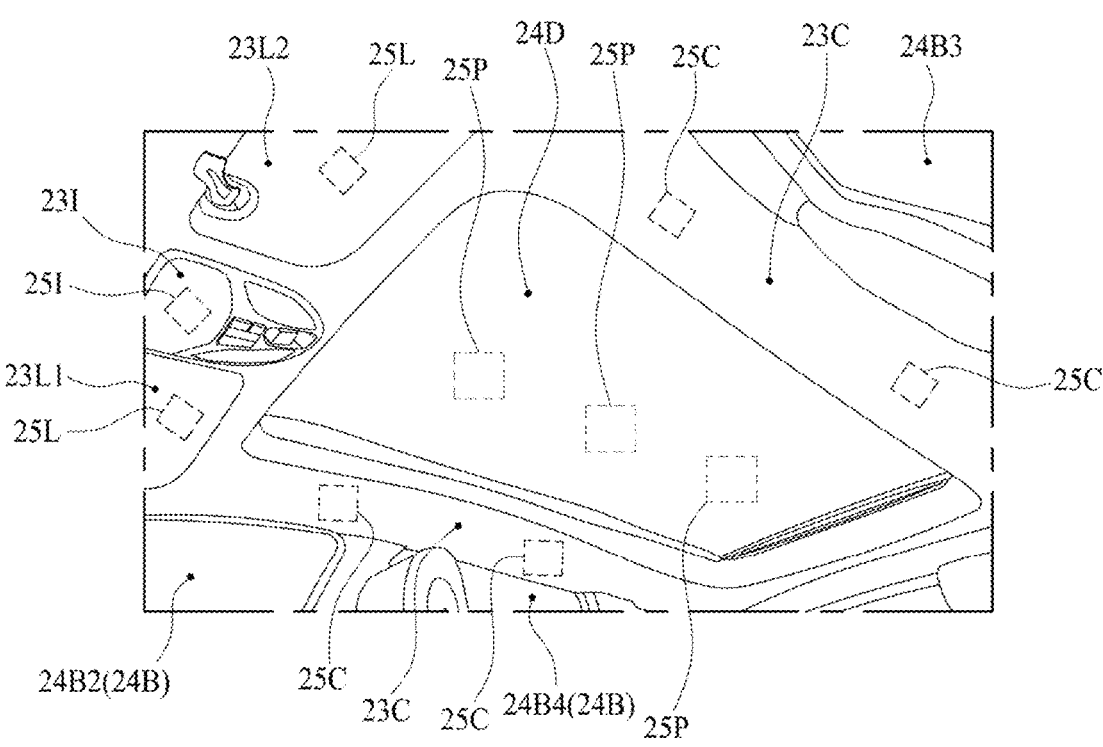
FIG. 27 illustrates a sound generating apparatus disposed at a roof panel of a vehicular apparatus according to another embodiment of the present disclosure.
Figure 28:
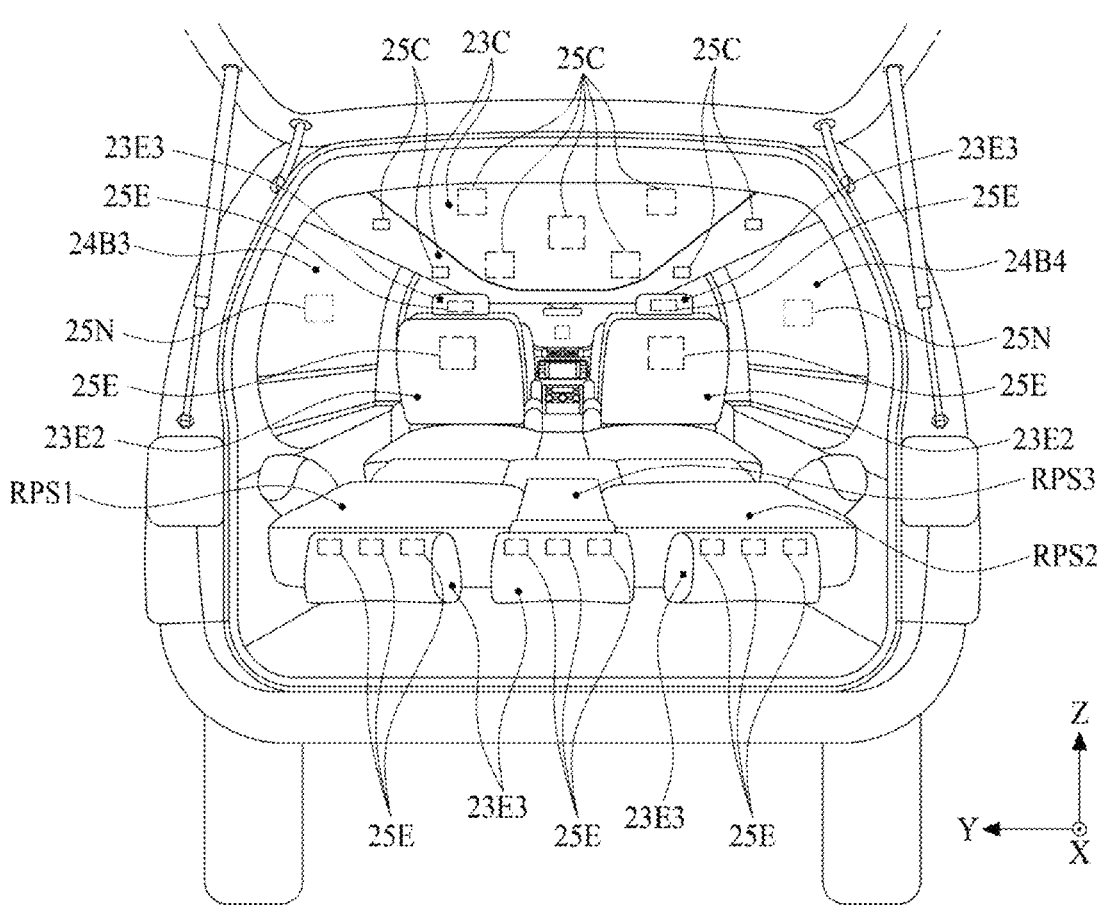
FIG. 28 illustrates a sound generating apparatus disposed at a roof panel, a glass window, and a seat of a vehicular apparatus according to another embodiment of the present disclosure.

FIG. 23 illustrates a vehicular apparatus according to an embodiment of the present disclosure. FIG. 24 illustrates a vehicular apparatus according to an embodiment of the present disclosure. FIG. 25 illustrates a sound generating apparatus disposed near a driver seat and a front passenger seat of a vehicular apparatus according to an embodiment of the present disclosure. FIG. 26 illustrates a sound generating apparatus disposed at a door and a glass window of a vehicular apparatus according to an embodiment of the present disclosure. FIG. 27 illustrates a sound generating apparatus disposed at a roof panel of a vehicular apparatus according to another embodiment of the present disclosure. FIG. 28 illustrates a sound generating apparatus disposed at a roof panel, a glass window, and a seat of a vehicular apparatus according to another embodiment of the present disclosure.

With reference to FIGS. 23 to 28, an apparatus according to an embodiment of the present disclosure may be a vehicular apparatus which includes one or more seats and one or more glass windows. For example, the vehicular apparatus may include a vehicle, a train, a ship, or an aircraft, or the like, but embodiments of the present disclosure are not limited thereto.

The apparatus according to an embodiment of the present disclosure may include a main structure (or a frame structure), an exterior material, and an interior material. The main structure may include a main frame, a sub-frame, a side frame, a door frame, an under-frame, and a seat frame, or the like, but embodiments of the present disclosure are not limited thereto.

The exterior material may be configured to cover the main structure. For example, the exterior material may be configured to cover an outer portion of the main structure. The exterior material according to an embodiment of the present disclosure may include a hood panel, a front fender panel, a dash panel, a pillar panel, a trunk panel, a roof panel (or ceiling), a floor panel, a door inner panel, and a door outer panel, or the like, but embodiments of the present disclosure are not limited thereto. The exterior material according to an embodiment of the present disclosure may include at least one or more of a planar portion and a curved portion. For example, the exterior material may have a surface structure corresponding to a surface structure of a corresponding main structure, or may have a surface structure which differs from the surface structure of the corresponding main structure.

The interior material may include all elements configuring an inner portion of the vehicular apparatus, or may include all elements disposed at an indoor space of the vehicular apparatus. For example, the interior material may be an interior member or an inner finishing material of the vehicular apparatus, but embodiments of the present disclosure are not limited thereto.

The interior material according to an embodiment of the present disclosure may cover one or more of the main structure and the exterior material in the indoor space of the vehicular apparatus and may be configured to be exposed at the indoor space of the vehicular apparatus. For example, the interior material may include a dashboard, a pillar interior material (or a pillar trim), a floor interior material (or a floor carpet), a roof interior material (or a headliner), a door interior material (or a door trim), a handle interior material (or a steering cover), a seat interior material, a rear package interior material (or a back seat shelf), an overhead console (or an indoor illumination interior material), a rear view mirror, a glove box, and a sun visor, or the like.

According to an embodiment of the present disclosure, the interior material may include at least one or more of the dashboard, the pillar interior material (or the pillar trim), the floor interior material (or the floor carpet), the roof interior material (or the headliner), the door interior material (or the door trim), the handle interior material (or the steering cover), the seat interior material, the rear package interior material (or the back seat shelf), the overhead console (or the indoor illumination interior material), the rear view mirror, the glove box, and the sun visor. One or more vibration generating devices may vibrate at least one of the dashboard, the pillar interior material (or the pillar trim), the floor interior material (or the floor carpet), the roof interior material (or the headliner), the door interior material (or the door trim), the handle interior material (or the steering cover), the seat interior material, the rear package interior material (or the back seat shelf), the overhead console (or the indoor illumination interior material), the rear view mirror, the glove box, and the sun visor.

The interior material according to an embodiment of the present disclosure may include one or more material of metal, wood, rubber, plastic, glass, cloth, fiber, paper, a mirror, carbon, and leather, but embodiments of the present disclosure are not limited thereto. For example, the paper may be cone paper for speakers. For example, the cone paper may be pulp or foamed plastic, or the like, but embodiments of the present disclosure are not limited thereto.

The interior material according to another embodiment of the present disclosure may include a base member and a surface member. For example, the base member may be an injection material, a first interior material, an inner interior material, or a rear interior material, but embodiments of the present disclosure are not limited thereto. The surface member may be a second interior material, an outer interior material, a front interior material, an outer surface member, a reinforcement member, or a decoration member, but embodiments of the present disclosure are not limited thereto.

The interior material or the base member may include a plastic material. For example, the interior material or the base member may be an injection material which is implemented by an injection process (or injection molding process) using a thermoplastic resin or a thermosetting resin, but embodiments of the present disclosure are not limited thereto. The interior material or the base member may be configured to cover one or more of the main structure and the exterior material in the indoor space of the vehicular apparatus. For example, the interior material or the base member may be configured to cover one or more surfaces (or an inner surface) of at least one or more of a main frame, a side frame, a door frame, and a handle frame, which are exposed at the indoor space of the vehicular apparatus.

The surface member may be disposed to cover the base member. The surface member may cover the base member in the indoor space of the vehicular apparatus and may be configured to be exposed at the indoor space. For example, the surface member may be disposed at or coupled to a front surface of the base member exposed at the indoor space of the vehicular apparatus. For example, the surface member may include one or more materials of plastic, glass, fiber, leather, cloth, rubber, a mirror, wood, paper, carbon, and a metal.

The interior material or the surface member may be a fiber material. For example, the interior material or the surface member may include at least one or more of a synthetic fiber, a carbon fiber (or an aramid fiber), and a natural fiber. For example, the interior material or the surface member may be a textile sheet, a knit sheet, or a nonwoven fabric, but embodiments of the present disclosure are not limited thereto. For example, the interior material or the surface member may be a fabric member, but embodiments of the present disclosure are not limited thereto. The synthetic fiber may be a thermoplastic resin and may include a polyolefin-based fiber which is an eco-friendly material which does not relatively release a harmful substance. For example, the polyolefin-based fiber may include a polyethylene fiber, a polypropylene fiber, or a polyethylene terephthalate fiber. The polyolefin-based fiber may be a fiber of a single resin or a fiber of a core-shell structure. The natural fiber may be a composite fiber of any one or two or more of a jute fiber, a kenaf fiber, an abaca fiber, a coconut fiber, and a wood fiber.

The one or more apparatuses 10 or the vibration apparatus may be disposed at one or more of a region between the main structure and the exterior material, a region between the main structure and the interior material, the exterior material, and the interior material. For example, the one or more apparatuses 10 or the vibration apparatus may be disposed at one or more of a region between the main structure and the exterior material, a region between the main structure and the interior material, the exterior material, and the interior material, and may be configured to output a sound. For example, the one or more apparatuses 10 or the vibration apparatus may be disposed at one or more of a region between the main structure and the exterior material, a region between the main structure and the interior material, the exterior material, and the interior material, and may indirectly or directly vibrate one or more of a region between the main structure and the exterior material, a region between the main structure and the interior material, the exterior material, and the interior material to output sound. For example, a vibration member of the one or more apparatuses 10 or the vibration apparatus may be at least one or more of the exterior material, the interior material, and a region between the exterior material and the interior material. According to an embodiment of the present disclosure, the at least one or more of the exterior material, the interior material, and a region between the exterior material and the interior material may output a sound based on a vibration of the one or more apparatuses 10 or the vibration apparatus.

One or more of the exterior material and the interior material of the vehicular apparatus may be a vibration plate, a sound vibration plate, or a sound generating plate, or the like for outputting a sound. For example, each of the exterior material and the interior material for outputting the sound may have a size which is greater than that of the one or more vibration apparatuses, and thus, may perform a function of a large-area vibration plate, a large-area sound vibration plate, or a large-area sound generating plate, thereby enhancing a sound characteristic and/or a sound pressure level characteristic of a low-pitched sound band generated by the one or more apparatuses 10 or the vibration apparatus. For example, a frequency of a sound of the low-pitched sound band may be 500 Hz or less, but embodiments of the present disclosure are not limited thereto.

The one or more apparatuses 10 or the vibration apparatus according to an embodiment of the present disclosure may output a sound in a region between the exterior material and the interior material of the vehicular apparatus. For example, the one or more apparatuses 10 or the vibration apparatus may be connected to or coupled to one or more of the exterior material and the interior material in a region between the exterior material and the interior material, and may indirectly or directly vibrate one or more of the exterior material and the interior material to output sound.

The one or more apparatuses 10 or the vibration apparatus may be disposed at one or more of a region between the main structure and the exterior material, a region between the main structure and the interior material, the exterior material, and the interior material. For example, the one or more apparatuses 10 or the vibration apparatus may be disposed at one or more of a region between the main structure and the exterior material, a region between the main structure and the interior material, the exterior material, and the interior material, and may be configured to output a sound. For example, the one or more apparatuses 10 or the vibration apparatus may be disposed at one or more of a region between the main structure and the exterior material, a region between the main structure and the interior material, the exterior material, and the interior material, and may indirectly or directly vibrate one or more of a region between the main structure and the exterior material, a region between the main structure and the interior material, the exterior material, and the interior material to output sound. For example, the one or more apparatuses 10 or the vibration apparatus may be disposed at a region between the exterior material and the interior material, and may indirectly or directly vibrate one or more of the exterior material and the interior material to output sound. For example, the vibration member of the one or more apparatuses 10 or the vibration apparatus may be one or more of the exterior material and the interior material. According to an embodiment of the present disclosure, one or more of the exterior material and the interior material may output a sound based on a vibration of the one or more apparatuses 10 or the vibration apparatus.

One or more of the exterior material and the interior material of the vehicular apparatus may be a vibration plate, a sound vibration plate, or a sound generating plate, or the like for outputting a sound. For example, each of the exterior material and the interior material for outputting the sound may have a size which is greater than that of the one or more apparatuses 10 or the vibration apparatus, and thus, may perform a function of a large-area vibration plate, a large-area sound vibration plate, or a large-area sound generating plate, thereby enhancing a sound characteristic and/or a sound pressure level characteristic of a low-pitched sound band generated by the one or more apparatuses 10 or the vibration apparatus. For example, a frequency of a sound of the low-pitched sound band may be 500 Hz or less, but embodiments of the present disclosure are not limited thereto.

The one or more apparatuses 10 or the vibration apparatus according to an embodiment of the present disclosure may output a sound in a region between the exterior material and the interior material of the vehicular apparatus. For example, the one or more apparatuses 10 or the vibration apparatus may be connected to or coupled to one or more of the exterior material and the interior material in a region between the exterior material and the interior material, and may indirectly or directly vibrate one or more of the exterior material and the interior material to output sound.

The apparatus according to an embodiment of the present disclosure may include a first sound generating apparatus 25-1 which is configured to output a sound in a region between the main structure and the exterior material of the vehicular apparatus and a region between the main structure and the interior material of the vehicular apparatus. For example, the first sound generating apparatus 25-1 may be disposed at a region between the main structure and the exterior material, a region between the main structure and the interior material, the exterior material, the interior material, or a region between the exterior material and the interior material of the vehicular apparatus and may output a sound.

The first sound generating apparatus 25-1 may include one or more vibration generating devices 25A to 25G which are disposed at a region between the main structure (or the exterior material) and one or more of a dashboard 23A, a pillar interior material 23B, a roof interior material 23C, a door interior material 23D, a seat interior material 23E, a handle interior material 23F, and a floor interior material 23G. For example, the first sound generating apparatus 25-1 may include at least one or more of the first to seventh vibration generating devices 25A to 25G and may output sounds of one or more channels by the at least one or more vibration generating devices.

With reference to FIGS. 23 to 25, the first vibration generating device 25A according to an embodiment of the present disclosure may be disposed at a region between the dashboard 23A and a dash panel and may be configured to indirectly or directly vibrate the dashboard 23A to output a sound. For example, the first vibration generating device 25A may include the at least one or more the apparatus 10 or the vibration apparatus described above with reference to FIGS. 1 to 10B, and thus, the repetitive description thereof may be omitted or may be briefly discussed. For example, the first vibration generating device 25A may be referred to as the term such as a dashboard speaker or a first speaker, or the like, but embodiments of the present disclosure are not limited thereto.

According to an embodiment of the present disclosure, at least one or more of the dash panel and the dashboard 23A may include a first region corresponding to a driver seat DS, a second region corresponding to a passenger seat FPS (which may also be referred to as front passenger seat FPS), and a third region (or a middle region) between the first region and the second region. At least one or more of the dash panel and the dashboard 23A may further include a fourth region which is inclined to face the passenger seat FPS.

According to an embodiment of the present disclosure, the first vibration generating device 25A may be configured to vibrate at least one or more of the first to fourth regions of the dashboard 23A. For example, the first vibration generating device 25A may be disposed at each of the first and second regions of the dashboard 23A, or may be disposed at each of the first to fourth regions of the dashboard 23A. For example, the first vibration generating device 25A may be disposed at each of the first and second regions of the dashboard 23A, or may be disposed at at least one or more of the first to fourth regions of the dashboard 23A. For example, the first vibration generating device 25A may be configured to output a sound of about 150 Hz to about 20 kHz. For example, the first vibration generating device 25A configured to vibrate at least one or more of the first to fourth regions of the dashboard 23A may have the same sound output characteristic or different sound output characteristics. For example, the first vibration generating device 25A configured to vibrate each of the first to fourth regions of the dashboard 23A may have the same sound output characteristic or different sound output characteristics.

The second vibration generating device 25B according to an embodiment of the present disclosure may be disposed at a region between a pillar panel and the pillar interior material 23B and may be configured to indirectly or directly vibrate the pillar interior material 23B to output a sound. For example, the second vibration generating device 25B may include the at least one or more the apparatus 10 or the vibration apparatus described above with reference to FIGS. 1 to 10B, and thus, the repetitive description thereof may be omitted or may be briefly discussed. For example, the second vibration generating device 25B may be referred to as the term such as a pillar speaker, a tweeter speaker, or a second speaker, or the like, but embodiments of the present disclosure are not limited thereto.

According to an embodiment of the present disclosure, the pillar panel may include a first pillar (or an A pillar) disposed at both sides of a front glass window, a second pillar (or a B pillar) disposed at both sides of a center of a vehicle body, and a third pillar (or a C pillar) disposed at both sides of a rear portion of the vehicle body. The pillar interior material 23B may include a first pillar interior material 23B1 covering the first pillar, a second pillar interior material 23B2 covering the second pillar, and a third pillar interior material 23B3 covering the third pillar.

According to an embodiment of the present disclosure, the second vibration generating device 25B may be disposed at at least one or more of a region between the first pillar and the first pillar interior material 23B1, a region between the second pillar and the second pillar interior material 23B2, and a region between the third pillar and the third pillar interior material 23B3, and thus, may vibrate at least one or more of the first to third pillar interior materials 23B1 to 23B3. For example, the second vibration generating device 25B may be configured to output a sound at about 2 kHz to about 20 kHz, but embodiments of the present disclosure are not limited thereto. For example, the second vibration generating device 25B may be configured to output a sound at about 150 Hz to about 20 kHz. For example, the second vibration generating device 25B configured to vibrate at least one or more of the first to third pillar interior materials 23B1 to 23B3 may have the same sound output characteristic or different sound output characteristics.

With reference to FIGS. 24, 27, and 28, the third vibration generating device 25C according to an embodiment of the present disclosure may be disposed at a region between a roof panel and the roof interior material 23C and may be configured to indirectly or directly vibrate the pillar interior material 23B to output a sound. For example, the third vibration generating device 25C may include the at least one or more the apparatus 10 or the vibration apparatus described above with reference to FIGS. 1 to 10B, and thus, the repetitive description thereof may be omitted or may be briefly discussed. For example, the third vibration generating device 25C may be referred to as the term such as a roof speaker or a third speaker, or the like, but embodiments of the present disclosure are not limited thereto.

According to an embodiment of the present disclosure, at least one or more of the roof panel and the roof interior material 23C covering the roof panel may include the first region corresponding to the driver seat DS, the second region corresponding to the passenger seat FPS, a third region corresponding to a region between the driver seat DS and the passenger seat FPS, a fourth region corresponding to a first rear passenger seat RPS1 behind the driver seat DS, a fifth region corresponding to a second rear passenger seat RPS2 behind the passenger seat FPS, a sixth region corresponding to a region between the first rear passenger seat RPS1 and the second rear passenger seat RPS2, and a seventh region between the third region and the sixth region.

According to an embodiment of the present disclosure, the third vibration generating device 25C may be configured to vibrate at least one or more of the first to seventh regions of the roof interior material 23C. For example, the third vibration generating device 25C may be configured to output a sound of about 150 Hz to about 20 kHz. For example, the third vibration generating device 25C configured to vibrate at least one or more of the first to seventh regions of the roof interior material 23C may have the same sound output characteristic or different sound output characteristics. For example, the third vibration generating device 25C configured to vibrate each of the first to seventh regions of the roof interior material 23C may have the same sound output characteristic or different sound output characteristics. For example, at least one or more third vibration generating devices 25C configured to vibrate at least one or more of the first to seventh regions of the roof interior material 23C may be configured to output a sound of about 2 kHz to about 20 kHz, and the other third vibration generating devices 25C may be configured to output a sound at about 150 Hz to about 20 kHz. For example, at least one or more of third vibration generating devices 25C configured to vibrate each of the first to seventh regions of the roof interior material 23C may be configured to output a sound of about 2 kHz to about 20 kHz, and the other third vibration generating devices 25C may be configured to output a sound at about 150 Hz to about 20 kHz.

With reference to FIGS. 23 to 26, the fourth vibration generating device 25D according to an embodiment of the present disclosure may be disposed at a region between the door frame and the door interior material 23D and may be configured to indirectly or directly vibrate the door interior material 23D to output a sound. For example, the fourth vibration generating device 25D may include the at least one or more the apparatus 10 or the vibration apparatus described above with reference to FIGS. 1 to 10B, and thus, the repetitive description thereof may be omitted or may be briefly discussed. For example, the fourth vibration generating device 25D may be referred to as the term such as a door speaker or a fourth speaker, or the like, but embodiments of the present disclosure are not limited thereto.

According to an embodiment of the present disclosure, at least one or more of the door frame and the door interior material 23D may include an upper region, a middle region, and a lower region with respect to a height direction Z of the apparatus. For example, the fourth vibration generating device 25D may be disposed at at least one or more of an upper region, a middle region, and a lower region between the door frame and the door interior material 23D, and thus, may vibrate at least one or more of the upper region, the middle region, and the lower region of the door interior material 23D.

According to an embodiment of the present disclosure, the door frame may include a first door frame (or a left front door frame), a second door frame (or a right front door frame), a third door frame (or a left rear door frame), and a fourth door frame (or a right rear door frame). According to an embodiment of the present disclosure, the door interior material 23D may include a first door interior material (or a left front door interior material) 23D1 covering the first door frame, a second door interior material (or a right front door interior material) 23D2 covering the second door frame, a third door interior material (or a left rear door interior material) 23D3 covering the third door frame, and a fourth door interior material (or a right rear door interior material) 23D4 covering the fourth door frame. For example, the fourth vibration generating device 25D may be disposed at at least one or more of an upper region, a middle region, and a lower region between each of the first to fourth door frames and the first to fourth door interior materials 23D1 to 23D4 and may vibrate at least one or more of the upper region, the middle region, and the lower region of each of the first to fourth door interior materials 23D1 to 23D4.

According to an embodiment of the present disclosure, the fourth vibration generating device 25D configured to vibrate the upper region of each of the first to fourth door interior materials 23D1 to 23D4 may be configured to output a sound of about 2 kHz to about 20 kHz, or may be configured to output a sound of about 150 Hz to about 20 kHz. For example, the fourth vibration generating device 25D configured to vibrate the upper regions of at least one or more of the first to fourth door interior materials 23D1 to 23D4 may be configured to output a sound of about 2 kHz to about 20 kHz, or may be configured to output a sound of about 150 Hz to about 20 kHz.

According to an embodiment of the present disclosure, the fourth vibration generating device 25D configured to vibrate the middle regions or/and the lower regions of at least one or more of the first to fourth door interior materials 23D1 to 23D4 may be configured to output a sound of about 150 Hz to about 20 kHz. The fourth vibration generating device 25D configured to vibrate the middle region or/and the lower region of each of the first to fourth door interior materials 23D1 to 23D4 may be configured to output a sound of about 150 Hz to about 20 kHz. For example, the fourth vibration generating device 25D configured to vibrate the middle regions or/and the lower regions of at least one or more of the first to fourth door interior materials 23D1 to 23D4 may be any one or more of a woofer, a mid-woofer, and a sub-woofer, but embodiments of the present disclosure are not limited thereto. For example, the fourth vibration generating device 25D configured to vibrate the middle region or/and the lower region of each of the first to fourth door interior materials 23D1 to 23D4 may be referred to as the term such as any one or more of a woofer, a mid-woofer, and a sub-woofer, but embodiments of the present disclosure are not limited thereto.

Sounds, which are respectively output from the fourth vibration generating device 25D disposed at the first door interior material 23D1 and the fourth vibration generating device 25D disposed at the second door interior material 23D2, may be combined and output. For example, sounds, which are output from at least one or more of the fourth vibration generating device 25D disposed at the first door interior material 23D1 and the fourth vibration generating device 25D disposed at the second door interior material 23D2, may be combined and output. In addition, a sound output from the fourth vibration generating device 25D disposed at the third door interior material 23D3 and a sound output from the fourth vibration generating device 25D disposed at the fourth door interior material 23D4 may be combined and output.

According to an embodiment of the present disclosure, an upper region of each of the first to fourth door interior materials 23D1 to 23D4 may include a first upper region adjacent to the dashboard 23A, a second upper region adjacent to the rear passenger seats RPS1, RPS2, and RPS3, and a third upper region between the first upper region and the second upper region. For example, the fourth vibration generating device 25D may be disposed at one or more of the first to third upper regions of each of the first to fourth door interior materials 23D1 to 23D4.

According to an embodiment of the present disclosure, the fourth vibration generating device 25D may be disposed at the first upper region of each of the first and second door interior materials 23D1 and 23D2 and may be disposed at one or more of the second and third upper regions of each of the first and second door interior materials 23D1 and 23D2. For example, the fourth vibration generating device 25D may be disposed at one or more of the first to third upper regions of one or more of the first to fourth door interior materials 23D1 to 23D4. For example, the fourth vibration generating device 25D configured to vibrate the first upper regions of one or more of the first and second door interior materials 23D1 and 23D2 may be configured to output a sound of about 2 kHz to about 20 kHz, and the fourth vibration generating device 25D configured to vibrate one or more of the second and third upper regions of each of the first and second door interior materials 23D1 and 23D2 may be configured to output a sound of about 2 kHz to about 20 kHz, or may be configured to output a sound of about 150 Hz to about 20 kHz. For example, the fourth vibration generating device 25D configured to vibrate one or more of the second and third upper regions of one or more of the first and second door interior materials 23D1 and 23D2 may be configured to output a sound of about 2 kHz to about 20 kHz, or may be configured to output a sound of about 150 Hz to about 20 kHz.

With reference to FIGS. 23, 24, and 28, the fifth vibration generating device 25E according to an embodiment of the present disclosure may be disposed at a region between the seat frame and the seat interior material 23E and may be configured to indirectly or directly vibrate the seat interior material 23E to output a sound. For example, the fifth vibration generating device 25E may include the one or more apparatus 10 or the vibration apparatus described above with reference to FIGS. 1 to 10B, and thus, the repetitive description thereof may be omitted or may be briefly discussed. For example, the fifth vibration generating device 25E may be referred to as the term such as a sheet speaker, a headrest speaker, or a fifth speaker, or the like, but embodiments of the present disclosure are not limited thereto.

According to an embodiment of the present disclosure, the seat frame may include a first seat frame (or a driver seat frame), a second seat frame (or a passenger seat frame), a third seat frame (or a first rear passenger seat frame), a fourth seat frame (or a second rear passenger seat frame), and a fifth seat frame (or a third rear passenger seat frame). According to an embodiment of the present disclosure, the seat interior material 23E may include a first seat interior material surrounding the first seat frame, a second seat interior material surrounding the second seat frame, a third seat interior material surrounding the third seat frame, a fourth seat interior material surrounding the fourth seat frame, and a fifth seat interior material surrounding the fifth seat frame.

According to an embodiment of the present disclosure, at least one or more of the first to fifth seat frames may include a seat bottom frame, a seat back frame, and a headrest frame. The seat interior material 23E may include a seat bottom interior material 23E1 surrounding the seat bottom frame, a seat back interior material 23E2 surrounding the seat back frame, and a headrest interior material 23E3 surrounding the headrest frame. At least one or more of the seat bottom interior material 23E1, the seat back interior material 23E2, and the headrest interior material 23E3 may include a seat inner interior material and a seat outer interior material. The seat inner interior material may include a foam layer. The seat outer interior material may include a surface layer including a fiber or leather. The seat outer interior material may further include a base layer including a plastic material which supports the surface layer.

According to an embodiment of the present disclosure, the fifth vibration generating device 25E may be disposed at at least one or more of a region between the seat back frame and the seat back interior material 23E2 and a region between the headrest frame and the headrest interior material 23E3, and thus, may vibrate at least one or more of the seat outer interior material of the seat back interior material 23E2 and the seat outer interior material of the headrest interior material 23E3.

According to an embodiment of the present disclosure, the fifth vibration generating device 25E disposed at at least one or more of the driver seat DS and the passenger seat FPS may be disposed at at least one or more of the region between the seat back frame and the seat back interior material 23E2 and the region between the headrest frame and the headrest interior material 23E3.

According to an embodiment of the present disclosure, the fifth vibration generating device 25E disposed at at least one or more of the first to third rear passenger seats RPS1, RPS2, and RPS3 may be disposed at the region between the headrest frame and the headrest interior material 23E3. For example, at least one or more of the first to third rear passenger seats RPS1, RPS2, and RPS3 may include at least one or more fifth vibration generating devices 25E disposed at the region between the headrest frame and the headrest interior material 23E3.

According to an embodiment of the present disclosure, the fifth vibration generating device 25E vibrating the seat back interior materials 23E2 of at least one or more of the driver seat DS and the rear passenger seat RPS may be configured to output a sound of about 150 Hz to about 20 kHz.

According to an embodiment of the present disclosure, the fifth vibration generating device 25E vibrating the headrest interior materials 23E3 of at least one or more of the driver seat DS, the passenger seat FPS, and the first to third rear passenger seats RPS1, RPS2, and RPS3 may be configured to output a sound of about 2 kHz to about 20 kHz, or may be configured to output a sound of about 150 Hz to about 20 kHz.

With reference to FIGS. 23 to 25, the sixth vibration generating device 25F according to an embodiment of the present disclosure may be disposed at a region between the handle frame and the handle interior material 23F and may be configured to indirectly or directly vibrate the handle interior material 23F to output a sound. For example, the sixth vibration generating device 25F may include the one or more apparatus 10 or the vibration apparatus described above with reference to FIGS. 1 to 10B, and thus, the repetitive description thereof may be omitted or may be briefly discussed. For example, the sixth vibration generating device 25F may be referred to as the term such as a handle speaker, a steering speaker, or a sixth speaker, or the like, but embodiments of the present disclosure are not limited thereto.

According to an embodiment of the present disclosure, the sixth vibration generating device 25F may be configured to indirectly or directly vibrate the handle interior material 23F to provide a driver or a passenger nearby with a sound. For example, a sound output by the sixth vibration generating device 25F may be a sound which is the same as or different from a sound output from each of the first to fifth vibration generating devices 25A to 25E. For example, a sound output by the sixth vibration generating device 25F may be a sound which is the same as or different from sounds output from at least one or more of the first to fifth vibration generating devices 25A to 25E.

As an embodiment of the present disclosure, the sixth vibration generating device 25F may output a sound which is to be provided to only the driver. As another embodiment of the present disclosure, the sound output by the sixth vibration generating device 25F and a sound output by each of the first to fifth vibration generating devices 25A to 25E may be combined and output. For example, the sound output by the sixth vibration generating device 25F and the sound output by at least one or more of the first to fifth vibration generating devices 25A to 25E may be combined and output.

With reference to FIGS. 23 and 24, the seventh vibration generating device 25G may be disposed at a region between the floor panel and the floor interior material 23G and may be configured to indirectly or directly vibrate the floor interior material 23G to output a sound. The seventh vibration generating device 25G may be disposed at a region between the floor interior material 23G and the floor panel disposed between the front seats DS and FPS and the third rear passenger seat RPS3. For example, the seventh vibration generating device 25G may include the one or more apparatus 10 or the vibration apparatus described above with reference to FIGS. 1 to 10B, and thus, the repetitive description thereof may be omitted or may be briefly discussed. For example, the seventh vibration generating device 25G may be configured to output a sound of about 150 Hz to about 20 kHz. For example, the seventh vibration generating device 25G may be referred to as the term such as a floor speaker, a bottom speaker, an under speaker, or a seventh speaker, or the like, but embodiments of the present disclosure are not limited thereto.

With reference to FIGS. 23 to 27, the apparatus according to an embodiment of the present disclosure may further include a second sound generating apparatus 25-2 which is disposed at the interior material exposed at an indoor space. For example, the apparatus according to an embodiment of the present disclosure may include only the second sound generating apparatus 25-2 instead of the first sound generating apparatus 25-1, or may include all of the first sound generating apparatus 25-1 and the second sound generating apparatus 25-2.

According to an embodiment of the present disclosure, the interior material may further include a rear view mirror 23H, an overhead console 23I, a rear package interior material 23J, a glove box 23K, and a sun visor 23L, or the like.

The second sound generating apparatus 25-2 according to an embodiment of the present disclosure may include one or more vibration generating devices 25H to 25L which are disposed at at least one of the rear view mirror 23H, the overhead console 23I, the rear package interior material 23J, the glove box 23K, and the sun visor 23L. For example, the second sound generating apparatus 25-2 may include at least one or more of eighth to twelfth sound generating devices 25H to 25L, and thus, may output sounds of one or more channels by the at least one or more of sound generating devices.

With reference to FIGS. 23 to 27, the eighth vibration generating device 25H may be disposed at the rear view mirror 23H and may be configured to indirectly or directly vibrate the rear view mirror 23H to output a sound. The eighth vibration generating device 25H may be disposed at a region between a mirror housing connected to the main structure and the rear view mirror 23H supported by the mirror housing. For example, the eighth vibration generating device 25H may include the one or more apparatus 10 or the vibration apparatus described above with reference to FIGS. 1 to 10B, and thus, repetitive description thereof may be omitted or may be briefly discussed. For example, the eighth vibration generating device 25H may be configured to output a sound of about 150 Hz to about 20 kHz. For example, the eighth vibration generating device 25H may be referred to as the term such as a mirror speaker or an eighth speaker, or the like, but embodiments of the present disclosure are not limited thereto.

With reference to FIGS. 24, 25, and 27, the ninth vibration generating device 25I may be disposed at the overhead console 23I and may be configured to indirectly or directly vibrate a console cover of the overhead console 23I to output a sound. According to an embodiment of the present disclosure, the overhead console 23I may include a console box embedded into the roof panel, a lighting device disposed at the console box, and a console cover covering the lighting device and the console box, but embodiments of the present disclosure are not limited thereto.

The ninth vibration generating device 25I may be disposed at a region between the console box of the overhead console 23I and the console cover and may vibrate the console cover. For example, the ninth vibration generating device 25I may be disposed at the region between the console box of the overhead console 23I and the console cover and may directly vibrate the console cover. For example, the ninth vibration generating device 25I may include the one or more or the vibration apparatus described above with reference to FIGS. 1 to 10B, and thus, the repetitive description thereof may be omitted or may be briefly discussed. For example, the ninth vibration generating device 25I may be configured to output a sound of about 150 Hz to about 20 kHz. For example, the ninth vibration generating device 25I may be referred to as the term such as a console speaker, a lighting speaker, or a ninth speaker, or the like, but embodiments of the present disclosure are not limited thereto.

The apparatus according to an embodiment of the present disclosure may further include a center lighting box disposed at a center region of the roof interior material 23C, a center lighting device disposed at the center lighting box, and a center lighting cover covering the center lighting device. In this case, the ninth vibration generating device 25I may be further disposed at a region between the center lighting box and the center lighting cover of the center lighting device and may additionally vibrate the center lighting cover.

With reference to FIGS. 23 and 24, the tenth vibration generating device 25J may be disposed at the rear package interior material 23J and may be configured to indirectly or directly vibrate the rear package interior material 23J to output a sound. The rear package interior material 23J may be disposed behind (or back portion) the first to third rear passenger seats RPS1, RPS2, and RPS3. For example, a portion of the rear package interior material 23J may be disposed under a rear glass window 24C.

The tenth vibration generating device 25J may be disposed at a rear surface of the rear package interior material 23J and may vibrate the rear package interior material 23J. For example, the tenth vibration generating device 25J may be disposed at the rear surface of the rear package interior material 23J and may directly vibrate the rear package interior material 23J. For example, the tenth vibration generating device 25J may include the one or more apparatus 10 or the vibration apparatus described above with reference to FIGS. 1 to 10B, and thus, the repetitive description thereof may be omitted or may be briefly discussed. For example, the tenth vibration generating device 25J may be referred to as the term such as a rear speaker or a tenth speaker, or the like, but embodiments of the present disclosure are not limited thereto.

According to an embodiment of the present disclosure, the rear package interior material 23J may include a first region corresponding to a rear side of the first rear passenger seat RPS1, a second region corresponding to a rear side of the second rear passenger seat RPS2, and a third region corresponding to a rear side of the third rear passenger seat RPS3.

According to an embodiment of the present disclosure, the tenth vibration generating device 25J may be disposed to vibrate at least one or more of the first to third regions of the rear package interior material 23J. For example, the tenth vibration generating device 25J may be disposed at each of the first and second regions of the rear package interior material 23J, or may be disposed at each of the first to third regions of the rear package interior material 23J. For example, the tenth vibration generating device 25J may be disposed at at least one or more of the first and second regions of the rear package interior material 23J, or may be disposed at at least one or more of the first to third regions of the rear package interior material 23J. For example, the tenth vibration generating device 25J may be configured to output a sound at about 150 Hz to about 20 kHz. For example, the tenth vibration generating device 25J configured to vibrate each of the first to third regions of the rear package interior material 23J may have the same sound output characteristic or different sound output characteristics. For example, the tenth vibration generating device 25J configured to vibrate at least one or more of the first to third regions of the rear package interior material 23J may have the same sound output characteristic or different sound output characteristics.

With reference to FIGS. 23 to 25, the eleventh vibration generating device 25K may be disposed at a glove box 23K and may be configured to indirectly or directly vibrate the glove box 23K to output a sound. The glove box 23K may be disposed at a dashboard 23A corresponding to a front of the passenger seat FPS.

The eleventh vibration generating device 25K may be disposed at an inner surface of the glove box 23K and may vibrate the glove box 23K. For example, the eleventh vibration generating device 25K may include the one or more apparatus 10 or the vibration apparatus described above with reference to FIGS. 1 to 10B, and thus, the repetitive description thereof may be omitted or may be briefly discussed. For example, the eleventh vibration generating device 25K may be configured to output a sound of about 150 Hz to about 20 kHz, or may be one or more of a woofer, a mid-woofer, and a sub-woofer, but embodiments of the present disclosure are not limited thereto. For example, the eleventh vibration generating device 25K may be referred to as the term such as a glove box speaker or an eleventh speaker, or the like, but embodiments of the present disclosure are not limited thereto.

With reference to FIG. 25, the twelfth vibration generating device 25L may be disposed at the sun visor 23L and configured to indirectly or directly vibrate the sun visor 23L to output a sound. The sun visor 23L may include a first sun visor 23L1 corresponding to the driver seat DS and a second sun visor 23L2 corresponding to the passenger seat FPS.

The twelfth vibration generating device 25L may be disposed at at least one or more of the first sun visor 23L1 and the second sun visor 23L2 and may indirectly or directly vibrate at least one or more of the first sun visor 23L1 and the second sun visor 23L2. For example, the twelfth vibration generating device 25L may include the one or more apparatus 10 or the vibration apparatus described above with reference to FIGS. 1 to 10B, and thus, the repetitive description thereof may be omitted or may be briefly discussed, for brevity. For example, the twelfth vibration generating device 25L may be configured to output a sound of about 150 Hz to about 20 kHz. For example, the twelfth vibration generating device 25L may be referred to as the term such as a sun visor speaker or a twelfth speaker, or the like, but embodiments of the present disclosure are not limited thereto.

According to an embodiment of the present disclosure, at least one or more of the first sun visor 23L1 and the second sun visor 23L2 may further include a sun visor mirror. In this case, the twelfth vibration generating device 25L may be configured to indirectly or directly vibrate a sun visor mirror of at least one or more of the first sun visor 23L1 and the second sun visor 23L2. The twelfth vibration generating device 25L vibrating the sun visor mirror may include the one or more apparatus 10 or the vibration apparatus described above with reference to FIGS. 1 to 10B, and thus, the repetitive description thereof may be omitted or may be briefly discussed.

With reference to FIGS. 23 to 27, the apparatus according to an embodiment of the present disclosure may further include a third sound generating apparatus 25-3 disposed at the glass window. For example, the apparatus according to an embodiment of the present disclosure may include the third sound generating apparatus 25-3 instead of at least one or more of the first and second sound generating apparatuses 25-1 and 25-2, or may include all of the first to third sound generating apparatuses 25-1, 25-2, and 25-3.

The third sound generating apparatus 25-3 may include one or more vibration generating devices 25M to 25P disposed at the glass window. For example, the third sound generating apparatus 25-3 may include at least one or more of thirteenth to sixteenth vibration generating devices 25M to 25P, and thus, may output sounds of one or more channels by the at least one or more vibration generating devices. For example, the third sound generating apparatus 25-3 may be referred to as the term such as a window speaker, a transparent sound generating apparatus, a transparent speaker, or an opaque speaker, or the like, but embodiments of the present disclosure are not limited thereto.

The at least one or more of the thirteenth to sixteenth vibration generating devices 25M to 25P according to an embodiment of the present disclosure may be configured to indirectly or directly vibrate the glass window to output a sound. For example, the at least one or more of the thirteenth to sixteenth vibration generating devices 25M to 25P may include the one or more apparatus 10 or the vibration apparatus described above with reference to FIGS. 1 to 10B, may be configured to be transparent, semitransparent, or opaque, and thus, their repetitive descriptions may be omitted or may be briefly discussed.

According to an embodiment of the present disclosure, the apparatus according to an embodiment of the present disclosure may further include a glass window 24 and a third vibration generating device 25C disposed at the glass window 24. The third vibration generating device 25C may be a transparent vibration generating device, but embodiments of the present disclosure are not limited thereto. For example, the glass window 24 may include at least one or more of a front glass window 24A, a side glass window 24B, and a rear glass window 24C. According to an embodiment of the present disclosure, the glass window 24 may further include a roof glass window 24D. For example, when the apparatus according to an embodiment of the present disclosure includes the roof glass window 24D, a portion of a region of the roof frame and the roof interior material 23C may be replaced with the roof glass window 24D. For example, when the apparatus according to an embodiment of the present disclosure includes the roof glass window 24D, the third vibration generating device 25C may be configured to indirectly or directly vibrate a periphery portion of the roof interior material 23C surrounding the roof glass window 24D to output a sound.

With reference to FIGS. 23 and 24, the thirteenth vibration generating device 25M according to an embodiment of the present disclosure may be disposed at the front glass window 24A and may be configured to output a sound by vibrating itself or may be configured to indirectly or directly vibrate the front glass window 24A to output a sound.

According to an embodiment of the present disclosure, the front glass window 24A may include a first region corresponding to the driver seat DS, a second region corresponding to the passenger seat FPS, and a third region (or a middle region) between the first region and the second region.

According to an embodiment of the present disclosure, the thirteenth vibration generating device 25M may be disposed at at least one or more of the first to third regions of the front glass window 24A. For example, the thirteenth vibration generating device 25M may be disposed at each of the first and second regions of the front glass window 24A, or may be disposed at each of the first to third regions of the front glass window 24A. For example, the thirteenth vibration generating device 25M may be disposed at at least one or more of the first and second regions of the front glass window 24A, or may be disposed at at least one or more of the first to third regions of the front glass window 24A. For example, the thirteenth vibration generating device 25M disposed at each of the first to third regions of the front glass window 24A may have the same sound output characteristic or different sound output characteristics. For example, the thirteenth vibration generating device 25M disposed at one or more of the first to third regions of the front glass window 24A may have the same sound output characteristic or different sound output characteristics. For example, the thirteenth vibration generating device 25M may be configured to output a sound of about 150 Hz to about 20 kHz. For example, the thirteenth vibration generating device 25M may be referred to as the term such as a front window speaker or a thirteenth speaker, or the like, but embodiments of the present disclosure are not limited thereto.

With reference to FIGS. 24 to 26 and 28, the fourteenth vibration generating device 25N according to an embodiment of the present disclosure may be disposed at the side glass window 24B and may be configured to output a sound by vibrating itself or may be configured to indirectly or directly vibrate the side glass window 24B to output a sound.

According to an embodiment of the present disclosure, the side glass window 24B may include a first side glass window (or a left front window) 24B1, a second side glass window (or a right front window) 24B2, a third side glass window (or a left rear window) 24B3, and a fourth side glass window (or a right rear window) 24B4.

According to an embodiment of the present disclosure, the fourteenth vibration generating device 25N may be disposed at at least one or more of the first to fourth side glass windows 24B1 to 24B4. For example, at least one or more of the first to fourth side glass windows 24B1 to 24B4 may include at least one or more fourteenth vibration generating devices 25N.

According to an embodiment of the present disclosure, the fourteenth vibration generating device 25N may be disposed at at least one or more of the first to fourth side glass windows 24B1 to 24B4 and may be configured to output a sound by vibrating itself or may be configured to indirectly or directly vibrate a corresponding side glass window to output a sound. For example, the fourteenth vibration generating device 25N may be configured to output a sound of about 150 Hz to about 20 kHz. For example, the fourteenth vibration generating device 25N disposed at at least one or more of the first to fourth side glass windows 24B1 to 24B4 may have the same sound output characteristic or different sound output characteristics. For example, the fourteenth vibration generating device 25N may be configured to output a sound of about 150 Hz to about 20 kHz. For example, the fourteenth vibration generating device 25N may be a side window speaker or a fourteenth speaker, or the like, but embodiments of the present disclosure are not limited thereto.

With reference to FIG. 23, the fifteenth vibration generating device 25O according to an embodiment of the present disclosure may be disposed at the rear glass window 24C and may be configured to output a sound by vibrating itself or may be configured to indirectly or directly vibrate the rear glass window 24C to output a sound.

According to an embodiment of the present disclosure, the rear glass window 24C may include a first region corresponding to a rear side of the first rear passenger seat RPS1, a second region corresponding to a rear side of the second rear passenger seat RPS2, and a third region corresponding to a rear side of the third rear passenger seat RPS3.

According to an embodiment of the present disclosure, the fifteenth vibration generating device 25O may be disposed at each of first to third regions of the rear glass window 24C. For example, the fifteenth vibration generating device 25O may be disposed at at least one or more of the first to third regions of the rear glass window 24C. For example, the fifteenth vibration generating device 25O may be disposed at each of the first and second regions of the rear glass window 24C, or may be disposed at each of the first to third regions of the rear glass window 24C. For example, the fifteenth vibration generating device 25O may be disposed at at least one or more of the first and second regions of the rear glass window 24C, or may be disposed at at least one or more of the first to third regions of the rear glass window 24C. For example, the fifteenth vibration generating device 25O may be configured to output a sound of about 150 Hz to about 20 kHz. For example, the fifteenth vibration generating device 25O disposed at each of the first to third regions of the rear glass window 24C may have the same sound output characteristic or different sound output characteristics. For example, the fifteenth vibration generating device 25O disposed at at least one or more of the first to third regions of the rear glass window 24C may have the same sound output characteristic or different sound output characteristics. For example, the fifteenth vibration generating device 25O disposed at at least one or more of the first to third regions of the rear glass window 24C may be configured to output a sound of about 150 Hz to about 20 kHz, or may be one or more of a woofer, a mid-woofer, and a sub-woofer, or the like, but embodiments of the present disclosure are not limited thereto. For example, the fifteenth vibration generating device 25O may be referred to as the term such as a rear window speaker or a fifteenth speaker, or the like, but embodiments of the present disclosure are not limited thereto.

With reference to FIG. 27, the sixteenth vibration generating device 25P according to an embodiment of the present disclosure may be disposed at the roof glass window 24D and may output a sound by vibrating itself or may be configured to indirectly or directly vibrate the roof glass window 24D to output a sound.

The roof glass window 24D according to an embodiment of the present disclosure may be disposed over the front seats DS and FPS. For example, the sixteenth vibration generating device 25P may be disposed at a middle region of the roof glass window 24D. For example, the sixteenth vibration generating device 25P may be configured to output a sound of about 150 Hz to about 20 kHz. For example, the sixteenth vibration generating device 25P may be referred to as the term such as a roof window speaker or a sixteenth speaker, or the like, but embodiments of the present disclosure are not limited thereto.

The roof glass window 24D according to another embodiment of the present disclosure may be disposed over the front seats DS and FPS or may be disposed over the front seats DS and FPS and the rear passenger seats RPS1, RPS2, and RPS3. For example, the roof glass window 24D may include a first region corresponding to the front seats DS and FPS and a second region corresponding to the rear passenger seats RPS1, RPS2, and RPS3. In addition, the roof glass window 24D may further include a third upper region between the first upper region and the second upper region.

According to another embodiment of the present disclosure, the sixteenth vibration generating device 25P may be disposed at at least one or more of the first and second regions of the roof glass window 24D or may be disposed at at least one or more of the first to third regions of the roof glass window 24D. For example, the sixteenth vibration generating device 25P may be configured to output a sound of about 150 Hz to about 20 kHz. For example, the sixteenth vibration generating device 25P disposed at at least one or more of the first to third regions of the roof glass window 24D may have the same sound output characteristic or different sound output characteristics.

With reference to FIGS. 23 to 25, the apparatus according to an embodiment of the present disclosure may further include a woofer speaker WS which is disposed at at least one or more of a dashboard 23A, a door frame, and a rear package interior material 23J.

The woofer speaker WS according to an embodiment of the present disclosure may include at least one or more of a woofer, a mid-woofer, and a sub-woofer, but embodiments of the present disclosure are not limited thereto. For example, the woofer speaker WS may be referred to as the term such as a speaker or the like which outputs a sound of about 60 Hz to about 150 Hz, but embodiments of the present disclosure are not limited thereto. Therefore, the woofer speaker WS may output a sound of about 60 Hz to about 150 Hz, and thus, may enhance a low-pitched sound band characteristic of a sound which is output to an indoor space.

According to an embodiment of the present disclosure, the woofer speaker WS may be disposed at at least one or more of first and second regions of the dashboard 23A. According to an embodiment of the present disclosure, the woofer speaker WS may be disposed at each of first to fourth door frames of the door frame and may be exposed at a lower region of each of the first to fourth door interior materials 23D1 to 23D4 of the door interior material 23D.

According to an embodiment of the present disclosure, the woofer speaker WS may be disposed at at least one or more of the first to fourth door frames of the door frame and may be exposed at the lower regions of at least one or more of the first to fourth door interior materials 23D1 to 23D4 of the door interior material 23D. According to another embodiment of the present disclosure, the woofer speaker WS may be disposed at at least one or more of the first and second regions of the rear package interior material 23J. For example, the fourth vibration generating device 25D disposed at the lower region of each of the first to fourth door interior materials 23D1 to 23D4 may be replaced by the woofer speaker WS. For example, the fourth vibration generating device 25D disposed at the lower regions of at least one or more of the first to fourth door interior materials 23D1 to 23D4 may be replaced by the woofer speaker WS.

With reference to FIGS. 25 and 26, the apparatus or the vehicular apparatus according to an embodiment of the present disclosure may further include a garnish member 23M which covers a portion of the interior material exposed at the indoor space and a fourth sound generating apparatus 25-4 disposed at the interior material.

The garnish member 23M may be configured to cover a portion of the door interior material 23D exposed at an indoor space of the vehicular apparatus, but embodiments of the present disclosure are not limited thereto. For example, the garnish member 23M may be configured to cover a portion of one or more of the dashboard 23A, the pillar interior material 23B, the door interior material 23D and the roof interior material 23C, which are exposed at the indoor space.

The garnish member 23M according to an embodiment of the present disclosure may include a metal material or a nonmetal material (or a composite nonmetal material) having a material characteristic suitable for generating a sound based on a vibration. For example, the metal material of the garnish member 23M may include any one or more materials of stainless steel, aluminum (Al), an Al alloy, a magnesium (Mg), a Mg alloy, and a magnesium-lithium (Mg—Li) alloy, but embodiments of the present disclosure are not limited thereto. The nonmetal material (or the composite nonmetal material) of the garnish member 23M may include one or more of plastic, fiber, leather, wood, rubber, cloth, and paper, but embodiments of the present disclosure are not limited thereto. For example, the garnish member 23M may include a metal material having a material characteristic suitable for generating a sound of a high-pitched sound band, but embodiments of the present disclosure are not limited thereto. For example, the high-pitched sound band may have a frequency of 1 kHz or more or 3 kHz or more, but embodiments of the present disclosure are not limited thereto.

The fourth sound generating apparatus 25-4 may include a vibration generating device 25Q disposed at a region between the garnish member 23M and the interior material. For example, the fourth sound generating apparatus 25-4 may include a seventeenth vibration generating device 25Q. For example, the fourth sound generating apparatus 25-4 or the seventeenth vibration generating device 25Q may be referred to as the term such as a garnish speaker or a seventeenth speaker, or the like, but embodiments of the present disclosure are not limited thereto.

The seventeenth vibration generating device 25Q may include the one or more apparatus 10 or the vibration apparatus described above with reference to FIGS. 1 to 10B, and thus, the repetitive description thereof may be omitted or may be briefly discussed. The seventeenth vibration generating device 25Q may be disposed at a region between the interior material and the garnish member 23M and may be connected or coupled to the garnish member 230M through a coupling member.

The seventeenth vibration generating device 25Q according to an embodiment of the present disclosure may be configured to indirectly or directly vibrate the garnish member 23M to output a sound into the indoor space of the apparatus. For example, the seventeenth vibration generating device 25Q may be configured to output a sound of a high-pitched sound band, but embodiments of the present disclosure are not limited thereto.

With reference to FIG. 23, the apparatus according to an embodiment of the present disclosure may further include a fifth sound generating apparatus 25-5 disposed at an inner surface of the exterior material.

The fifth sound generating apparatus 25-5 may include one or more vibration generating devices 25R, 25S, and 25T disposed at a region between the main structure and one or more of the hood panel 22A, the front fender panel 22B, and the trunk panel 22C. For example, the fifth sound generating apparatus 25-5 may include at least one or more of one or more eighteenth to twentieth vibration generating devices 25R, 25S, and 25T, and thus, may output sounds of one or more channels by the at least one or more vibration generating devices.

The one or more eighteenth vibration generating devices 25R according to an embodiment of the present disclosure may be connected or coupled to an inner surface of the hood panel 22A and may indirectly or directly vibrate the hood panel 22A to output a sound into an outdoor space of the apparatus. For example, the one or more eighteenth vibration generating devices 25R may be configured to be connected or coupled to one or more of a center portion and a periphery portion of the inner surface of the hood panel 22A.

The one or more eighteenth vibration generating devices 25R according to an embodiment of the present disclosure may include the one or more apparatus 10 or the vibration apparatus described above with reference to FIGS. 1 to 10B, and thus, the repetitive description thereof may be omitted or may be briefly discussed. The one or more eighteenth vibration generating devices 25R may be connected or coupled to the inner surface of the hood panel 22A through a coupling member. For example, the one or more eighteenth vibration generating devices 25R may be configured to output a sound of about 150 Hz to about 20 kHz. For example, the one or more eighteenth vibration generating devices 25R may be referred to as the term such as a hood panel speaker or a eighteenth speaker, or the like, but embodiments of the present disclosure are not limited thereto.

The one or more nineteenth vibration generating devices 25S according to an embodiment of the present disclosure may be connected or coupled to an inner surface of the front fender panel 22B and may be configured to indirectly or directly vibrate the front fender panel 22B to output a sound to the outdoor space of the apparatus. For example, the one or more nineteenth vibration generating devices 25S may be disposed to have a certain interval at the inner surface of the front fender panel 22B.

The one or more nineteenth vibration generating devices 25S according to an embodiment of the present disclosure may include the one or more apparatus 10 or the vibration apparatus described above with reference to FIGS. 1 to 10B, and thus, the repetitive description thereof may be omitted or may be briefly discussed. The one or more nineteenth vibration generating devices 25S may be connected or coupled to the inner surface of the front fender panel 22B through a coupling member. For example, the one or more nineteenth vibration generating devices 25S may be configured to output a sound of about 150 Hz to about 20 kHz. For example, the one or more nineteenth vibration generating devices 25S may be referred to as the term such as a fender panel speaker or a nineteenth speaker, or the like, but embodiments of the present disclosure are not limited thereto.

The one or more twentieth vibration generating devices 25T according to an embodiment of the present disclosure may be connected or coupled to an inner surface of the trunk panel 22C and may be configured to indirectly or directly vibrate the trunk panel 22C to output a sound to the outdoor space of the apparatus. For example, the one or more twentieth vibration generating devices 25T may be configured to be connected or coupled to one or more of a center portion and a periphery portion of the trunk panel 22C.

The one or more twentieth vibration generating devices 25T according to an embodiment of the present disclosure may include the one or more apparatus 10 or the vibration apparatus described above with reference to FIGS. 1 to 10B, and thus, the repetitive description thereof may be omitted or may be briefly discussed. The one or more twentieth vibration generating devices 25T may be connected or coupled to the inner surface of the trunk panel 22C through a coupling member. For example, the one or more twentieth vibration generating devices 25T may be configured to output a sound of about 150 Hz to about 20 kHz. For example, the one or more twentieth vibration generating devices 25T may be referred to as the term such as a trunk panel speaker or a nineteenth speaker, or the like, but embodiments of the present disclosure are not limited thereto.

According to an embodiment of the present disclosure, the fifth sound generating apparatus 25-5 may further include one or more vibration generating devices disposed at a region between the main structure and one or more of the door inner panel and the door outer panel.

With reference to FIGS. 23 to 26, the apparatus according to an embodiment of the present disclosure may further include an instrument panel apparatus 26 and an infotainment apparatus 27.

The instrument panel apparatus 26 according to an embodiment of the present disclosure may be disposed in a first region of the dashboard 23A to face the driver seat DS. The instrument panel apparatus 26 may include a display (or a first display) 26A which is disposed at the first region of the dashboard 23A to face the driver seat DS.

The first display 26A may configure a display panel as a vibration member. For example, the instrument panel apparatus 26 may output a sound, generated by a vibration of the vibration member (or the display panel) based on a vibration of the one or more apparatus 10 or the vibration apparatus included in the first display 26A, toward the driver seat DS. For example, the one or more apparatus 10 or the vibration apparatus disposed in the first display 26A of the instrument panel apparatus 26 may be configured to output a sound of about 150 Hz to about 20 kHz.

The infotainment apparatus 27 may be disposed at a third region of the dashboard 23A.

The infotainment apparatus 27 according to an embodiment of the present disclosure may be fixed on the third region of the dashboard 23A in an upright state.

The infotainment apparatus 27 according to another embodiment of the present disclosure may be installed to be raised and lowered at the third region of the dashboard 23A. For example, the infotainment apparatus 27 may be received or accommodated into the dashboard 23A based on the power turn-off of the apparatus or the manipulation of a vehicle passenger and may protrude to a region on the dashboard 23A based on the power turn-on of the apparatus or the manipulation of the vehicle passenger.

The infotainment apparatus 27 according to an embodiment of the present disclosure may include a display (or a second display) 27A disposed at the third region of the dashboard 23A and a display elevation device.

The second display 27A may configure a display panel as a vibration member. For example, the infotainment apparatus 27 may output a sound, generated by a vibration of the vibration member (or the display panel) based on a vibration of the one or more apparatus 10 or the vibration apparatus included in the second display 27A, toward the driver seat DS. For example, the one or more apparatus 10 or the vibration apparatus disposed at the second display 27A of the infotainment apparatus 27 may be configured to output a sound of about 150 Hz to about 20 kHz.

The display elevation device may be disposed inside the third region of the dashboard 23A and may support the second display 27A so as to be raised and lowered. For example, the display elevation device may raise the second display 27A based on the power turn-on of the apparatus or the manipulation of the vehicle passenger, thereby allowing the second display 27A to protrude to a region on the dashboard 23A. In another example, the display elevation device may lower the second display 27A based on the power turn-off of the apparatus or the manipulation of the vehicle passenger, thereby allowing the second display 27A to be received or accommodated into the dashboard 23A.

The apparatus according to an embodiment of the present disclosure may output a sound to one or more of the indoor space and the outdoor space through at least one or more of the first sound generating apparatus 25-1 disposed at the region between the main structure and the interior material, the second sound generating apparatus 25-2 disposed at the interior material exposed at the indoor space, the third sound generating apparatus 25-3 disposed at the glass window, the fourth sound generating apparatus 25-4 disposed at the garnish member 23M, and the fifth sound generating apparatus 25-5 disposed at the exterior material, and thus, may output the sound by, as a sound vibration plate, one or more of the exterior material and the interior material, thereby outputting a multichannel surround stereo sound. In addition, the apparatus according to an embodiment of the present disclosure may output a sound by, as a sound vibration plate, a display panel of at least one or more of the displays 26A and 27A of at least one or more of the instrument panel apparatus 26 and the infotainment apparatus 27 and may output a more realistic multi-channel surround stereo sound through each of the first to fifth sound generating apparatuses 25-1 to 25-5, the instrument panel apparatus 26, and the infotainment apparatus 27.

With reference to FIG. 23, an apparatus according to another embodiment of the present disclosure may further include a sound bar 28 disposed at the rear package interior material 23J. The sound bar 28 may be configured to output a sound in conjunction with the infotainment apparatus 27. The sound bar 28 may include the one or more apparatus 10 or the vibration apparatus described above with reference to FIGS. 1 to 10B, and thus, the repetitive description thereof may be omitted or may be briefly discussed.

A vibration apparatus according to one or more embodiments of the present disclosure may be applied to or included in a vibration generating device and/or a sound generating apparatus disposed at an apparatus. The apparatus according to an embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, sliding apparatuses, variable apparatuses, electronic organizers, electronic books, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, and home appliances, or the like. In addition, the vibration apparatus according to one or more embodiments of the present disclosure may be applied to or included in an organic light-emitting lighting apparatus or an inorganic light-emitting lighting apparatus. When the vibration apparatus is applied to or included in the lighting apparatuses, the lighting apparatuses may act as lighting and a speaker. In addition, when the vibration apparatus according to an embodiment of the present disclosure is applied to or included in the mobile apparatuses, or the like, the vibration apparatus may be one or more of a speaker, a receiver, and a haptic device, but embodiments of the present disclosure are not limited thereto.

An apparatus and a vehicular apparatus including the same according to one or more embodiments of the present disclosure are described below.

An apparatus according to one or more embodiments of the present disclosure comprises a vibration member, a vibrator at the vibration member, and a connector between the vibration member and the vibrator and accommodating the vibrator.

According to one or more embodiments of the present disclosure, the connector may be formed of an injection material including a styrene material.

According to one or more embodiments of the present disclosure, the vibrator may comprise a supporting member, the vibration device configured to vibrate the vibration member, a vibration device at the supporting member, and a connection member between the supporting member and the vibration device.

According to one or more embodiments of the present disclosure, the vibrator or the apparatus may further comprise a first protection part at the vibration device.

According to one or more embodiments of the present disclosure, the vibrator or the apparatus may be a space between the first protection part and the vibration device.

According to one or more embodiments of the present disclosure, the vibration device may be configured to vibrate the vibration member.

According to one or more embodiments of the present disclosure, the first protection part may comprise at least one or more holes.

According to one or more embodiments of the present disclosure, the at least one or more holes may overlap the vibration device or may be disposed toward a periphery of the vibration device.

According to one or more embodiments of the present disclosure, the vibration device may comprise a vibration part, a first electrode layer at a first surface of the vibration part, and a second electrode layer at a second surface of the vibration part, the second surface of the vibration part being different from the first surface of the vibration part.

According to one or more embodiments of the present disclosure, the vibration device may further comprise a first cover member at the first electrode layer, and a second cover member at the second electrode layer.

According to one or more embodiments of the present disclosure, the vibration part may comprise a piezoelectric-type vibration portion.

According to one or more embodiments of the present disclosure, the vibration part may comprise a plurality of inorganic material portions having a piezoelectric characteristic, and an organic material portion between the plurality of inorganic material portions.

According to one or more embodiments of the present disclosure, the connector may comprise at least one or more grooves, and the at least one or more grooves may be connected to the vibrator.

According to one or more embodiments of the present disclosure, the apparatus may further comprise a power supply line connected to each of the first electrode layer and the second electrode layer, the power supply line may pass through the at least one or more grooves.

According to one or more embodiments of the present disclosure, the connector may comprise at least one or more coupling parts at a periphery portion of the connector, and the at least one or more coupling parts may be connected to the vibrator.

According to one or more embodiments of the present disclosure, the connector may comprise an accommodating part through which the vibrator is accommodated into the connector.

According to one or more embodiments of the present disclosure, the connector may include at least one or more protrusion portions at a rear surface of the connector, the at least one or more protrusion portions may be connected to the vibration member.

According to one or more embodiments of the present disclosure, the at least one protrusion portion may be accommodated into the vibration member According to one or more embodiments of the present disclosure, the apparatus may further comprise a second protection part at the first protection part.

According to one or more embodiments of the present disclosure, a size of the second protection part may be smaller than or equal to a size of the first protection part.

According to one or more embodiments of the present disclosure, the vibration device may comprise a vibration part which includes a vibration layer, a first electrode layer at a first surface of the vibration layer, and a second electrode layer at a second surface of the vibration layer, the second surface of the vibration layer being different from the first surface of the vibration layer. The vibration layer may include a plurality of first portions and a plurality of second portions alternately and repeatedly disposed.

According to one or more embodiments of the present disclosure, a width of each of the plurality of the first portion may be greater than a width of each of the plurality of the second portions.

According to one or more embodiments of the present disclosure, a width of the plurality of first portions and/or the plurality of second portions progressively may decrease in a direction from a center portion to both peripheries of the vibration layer.

According to one or more embodiments of the present disclosure, the vibration device may comprise at least two or more vibration parts between the first cover member and the second cover member.

According to one or more embodiments of the present disclosure, the vibration device may comprise at least two or more vibration parts each including a vibration layer, a first electrode layer at a first surface of the vibration layer, and a second electrode layer at a second surface of the vibration layer, the second surface of the vibration layer being different from the first surface of the vibration layer, the at least two or more vibration parts being spaced apart from one another; a first cover member at the first electrode layer of each of the at least two or more vibration parts; and a second cover member at the second electrode layer of each of the at least two or more vibration parts.

According to one or more embodiments of the present disclosure, a separation distance between any two adjacent vibration parts of the at least two vibration parts may be 0.1 mm or more and less than 3 cm.

According to one or more embodiments of the present disclosure, a separation distance between any two adjacent vibration parts of the at least two vibration parts is 0.1 mm or more and less than 5 mm.

According to one or more embodiments of the present disclosure, each of the at least two or more vibration parts may further comprise a power supply line connected to each of the first electrode layer and the second electrode layer, and the power supply line connected to each of the first electrode layer and the second electrode layer may not overlap each other.

According to one or more embodiments of the present disclosure, each of the at least two or more vibration parts may further comprise a first power supply line connected to the first electrode layer and a second power supply line connected to the second electrode layer. The first power supply line connected to the first electrode layer and the second power supply line connected to the second electrode layer may not overlap each other.

According to one or more embodiments of the present disclosure, the vibrator may comprise at least two or more vibration generating parts, and the at least two or more vibration generating parts may vibrate in a same direction as each other.

According to one or more embodiments of the present disclosure, the vibration member may further comprise at least one or more curved portions, and the connector may be configured to correspond to the at least one or more curved portions of the vibration member.

According to one or more embodiments of the present disclosure, the vibration member may further comprise at least one or more grooves, and the connector may comprise at least one or more protrusion portions inserted into the at least one or more grooves.

According to one or more embodiments of the present disclosure, the vibration member may comprise one or more of a display panel including a plurality of pixels configured to display an image, a light emitting diode lighting panel, an organic light emitting lighting panel, and an inorganic light emitting lighting panel.

According to one or more embodiments of the present disclosure, the vibration member may comprise one or more of a display panel including a pixel configured to display an image, a screen panel on which an image is to be projected from a display apparatus, a lighting panel, a signage panel, a vehicular interior material, a vehicular glass window, a vehicular exterior material, a building ceiling material, a building interior material, a building glass window, an aircraft interior material, an aircraft glass window, metal, wood, rubber, plastic, glass, fiber, cloth, paper, leather, carbon, and a mirror.

According to one or more embodiments of the present disclosure, the vibration member may comprise one or more of a vehicular garnish, an A-pillar, a door frame, and a roof panel.

A vehicular apparatus or a vehicle according to one or more embodiments of the present disclosure may comprise an exterior material, an interior material covering the exterior material, and one or more vibration generating devices at one or more of the exterior material, the interior material, and a region between the exterior material and the interior material, one or more of the exterior material and the interior material may output a sound based on vibrations of the one or more vibration generating devices. The one or more vibration generating devices may comprise a vibrator at a vibration member, and a connector between the vibration member and the vibrator and accommodating the vibrator.

According to one or more embodiments of the present disclosure, the interior material may comprise one or more materials of metal, wood, rubber, plastic, glass, fiber, cloth, paper, a mirror, carbon, and leather.

According to one or more embodiments of the present disclosure, the interior material may comprise at least one or more of a dashboard, a pillar interior material, a floor interior material, a roof interior material, a door interior material, a handle interior material, a seat interior material, a rear package interior material, an overhead console, a rear view mirror, a glove box, and a sun visor; and the one or more vibration generating devices may be configured to vibrate at least one or more of the dashboard, the pillar interior material, the floor interior material, the roof interior material, the door interior material, the handle interior material, the seat interior material, the rear package interior material, the overhead console, the rear view mirror, the glove box, and the sun visor.

According to one or more embodiments of the present disclosure, the vehicular apparatus may further comprise a glass window, and a transparent vibration generating devices disposed at the glass window.

According to one or more embodiments of the present disclosure, the glass window may include at least one or more of a front glass window, a side glass window, a rear glass window, and a roof glass window, and the transparent vibration generating devices may be configured to vibrate at least one or more of the front glass window, the side glass window, the rear glass window, and the roof glass window.

It will be apparent to those skilled in the art that various modifications and variations can be made in the apparatus and the vehicular apparatus including the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. An apparatus, comprising:

a vibration member;

a vibrator at a rear surface of the vibration member;

a first protection part surrounding the vibrator; and a connector between the rear surface of the vibration member and the vibrator and accommodating the vibrator, wherein the vibrator comprises:

a vibration device configured to vibrate the vibration member; and a supporting member disposed between a rear surface of vibration device and the connector to protect the vibration device, wherein a space is defined between the first protection part and a rear surface of the vibration device across an entire width of the vibration device;

wherein the first protection part comprises one or more holes overlapping the vibration device in a plan view, wherein the one or more holes may have a size smaller than that of the vibration device, and wherein the space between the first protection part and the vibration device is communicated with outside of the apparatus through the one or more holes.

2. The apparatus of claim 1, wherein the connector is configured to accommodate the supporting member and the vibration device, and wherein the vibrator further comprises:

a connection member between the supporting member and the vibration device.

3. The apparatus of claim 1, wherein the vibration device comprises:

a vibration part;

a first electrode layer at a first surface of the vibration part; and a second electrode layer at a second surface of the vibration part, the second surface of the vibration part being different from the first surface of the vibration part.

4. The apparatus of claim 3, wherein the vibration device further comprises:

a first cover member at the first electrode layer; and a second cover member at the second electrode layer.

5. The apparatus of claim 3, wherein the vibration part comprises a piezoelectric vibration part.

6. The apparatus of claim 3, wherein the vibration part comprises:

a plurality of inorganic material portions having a piezo-electric characteristic; and an organic material portion between the plurality of inorganic material portions.

7. The apparatus of claim 3, wherein:

the connector comprises at least one or more grooves, and the at least one or more grooves are connected to the vibrator.

8. The apparatus of claim 7, further comprising a power supply line connected to each of the first electrode layer and the second electrode layer, wherein the power supply line passes through the at least one or more grooves.

9. The apparatus of claim 1, wherein:

the connector comprises:

a supporting surface configured to accommodate the supporting member and the vibration device; and at least one or more coupling parts at a periphery portion of the connector; and the at least one or more coupling parts are connected to the first protection part.

10. The apparatus of claim 7, wherein the connector comprises an accommodating part through which the vibrator is accommodated into the connector, and wherein the at least one or more grooves is disposed at the accommodating part.

11. The apparatus of claim 1, wherein:

the connector includes at least one or more protrusion portions at a rear surface of the connector; and the at least one or more protrusion portions are connected to the vibration member.

12. The apparatus of claim 11, wherein the at least one or more protrusion portions are accommodated into the vibration member.

13. The apparatus of claim 1, further comprising a second protection part at the first protection part.

14. The apparatus of claim 13, wherein a size of the second protection part is smaller than or equal to a size of the first protection part, and wherein the second protection part covers a portion of the one or more holes.

15. The apparatus of claim 1, wherein the vibration device comprises:

at least two or more vibration parts each including a vibration layer, a first electrode layer at a first surface of the vibration layer, and a second electrode layer at a second surface of the vibration layer, the second surface of the vibration layer being different from the first surface of the vibration layer, the at least two or more vibration parts being spaced apart from one another;

a first cover member at the first electrode layer of each of the at least two or more vibration parts; and a second cover member at the second electrode layer of each of the at least two or more vibration parts.

16. The apparatus of claim 15, wherein:

each of the at least two or more vibration parts further comprises a first power supply line connected to the first electrode layer and a second power supply line connected to the second electrode layer; and the first power supply line connected to of the first electrode layer and the second power supply line connected to the second electrode layer do not overlap each other.

17. The apparatus of claim 1, wherein:

the vibrator comprises at least two or more vibration generating parts; and the at least two or more vibration generating parts vibrate in a same direction as each other.

18. The apparatus of claim 1, wherein:

the vibration member further comprises at least one or more curved portions; and the connector is configured to correspond to the at least one or more curved portions of the vibration member.

19. The apparatus of claim 18, wherein:

the vibration member further comprises at least one or more grooves; and the connector comprises at least one or more protrusion portions inserted into the at least one or more grooves.

20. The apparatus of claim 1, wherein the vibration member comprises one or more of a display panel including a plurality of pixels configured to display an image, a light emitting diode lighting panel, an organic light emitting lighting panel, and an inorganic light emitting lighting panel.

21. The apparatus of claim 1, wherein the vibration member comprises one or more of a display panel including a pixel configured to display an image, a screen panel on which an image is to be projected from a display apparatus, a lighting panel, a signage panel, a vehicular interior material, a vehicular glass window, a vehicular exterior material, a building ceiling material, a building interior material, a building glass window, an aircraft interior material, an aircraft glass window, metal, wood, rubber, plastic, glass, fiber, cloth, paper, leather, carbon, and a mirror.

22. The apparatus of claim 1, wherein the vibration member comprises one or more of a vehicular garnish, an A-pillar, a door frame, and a roof panel.

23. A vehicular apparatus, comprising:

an exterior material;

an interior material covering the exterior material; and one or more vibration generating devices at one or more of the exterior material, the interior material, and a region between the exterior material and the interior material, wherein the one or more vibration generating devices comprise the apparatus of claim 1, and wherein one or more of the exterior material and the interior material output a sound based on vibrations of the one or more vibration generating devices.

24. The vehicular apparatus of claim 23, wherein the interior material comprises one or more materials of metal, wood, rubber, plastic, glass, fiber, cloth, paper, a mirror, carbon, and leather.

25. The vehicular apparatus of claim 23, wherein:

the interior material comprises at least one or more of a dashboard, a pillar interior material, a floor interior material, a roof interior material, a door interior material, a handle interior material, a seat interior material, a rear package interior material, an overhead console, a rear view mirror, a glove box, and a sun visor; and the one or more vibration generating devices is configured to vibrate at least one or more of the dashboard, the pillar interior material, the floor interior material, the roof interior material, the door interior material, the handle interior material, the seat interior material, the rear package interior material, the overhead console, the rear view mirror, the glove box, and the sun visor.

26. The vehicular apparatus of claim 23, further comprising:

a glass window; and a transparent vibration generating devices disposed at the glass window.

27. The vehicular apparatus of claim 26, wherein:

the glass window includes at least one or more of a front glass window, a side glass window, a rear glass window, and a roof glass window; and the transparent vibration generating devices is configured to vibrate at least one or more of the front glass window, the side glass window, the rear glass window, and the roof glass window.

28. The apparatus of claim 1, wherein the first protection part includes a contacting portion in contact with the supporting member around the vibration device to surround the vibration device in the plan view, and a covering portion over the vibration device, wherein the covering portion is separated from the vibration device to define the space between the covering portion and the vibration device across the entire width of the vibration device, and wherein the one or more holes are defined in the covering portion.

29. The apparatus of claim 28, wherein the space is directly defined between the first protection part and the vibration device.

* * * * *